US012640079B2

(12) United States Patent
Zhang

(10) Patent No.: US 12,640,079 B2
(45) Date of Patent: May 26, 2026

(54) DISPLAY PANEL AND DISPLAY DEVICE HAVING N STAGES OF SHIFT REGISTER UNITS

(71) Applicant: Wuhan Tianma Microelectronics Co., Ltd., Wuhan (CN)

(72) Inventor: Wenshuai Zhang, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/954,988

(22) Filed: Nov. 21, 2024

(65) Prior Publication Data

US 2025/0078722 A1     Mar. 6, 2025

(30) Foreign Application Priority Data

Mar. 12, 2024    (CN) .......................... 202410284278.X

(51) Int. Cl.
G09G 3/3266     (2016.01)
G09G 3/20     (2006.01)
G11C 19/28     (2006.01)

(52) U.S. Cl.
CPC ......... G09G 3/2092 (2013.01); G09G 3/3266 (2013.01); *G09G 3/20* (2013.01); *G09G 3/2074* (2013.01); *G09G 2300/0819* (2013.01); *G09G 2300/0842* (2013.01); *G09G 2310/0267* (2013.01); *G09G 2310/0286* (2013.01); *G09G 2310/06* (2013.01); *G09G 2330/023* (2013.01); *G09G 2340/0435* (2013.01); *G11C 19/28* (2013.01)

(58) Field of Classification Search
CPC ...... G09G 3/2092; G09G 3/3266; G09G 3/20; G09G 3/2074; G09G 2300/0819; G09G 2300/0842; G09G 2310/0267; G09G 2310/0286; G09G 2310/06; G09G 2330/023; G09G 2340/0435; G11C 19/28
See application file for complete search history.

(56) References Cited

U.S. PATENT DOCUMENTS

2022/0208114 A1*   6/2022   Jo ........................ G09G 3/3266

FOREIGN PATENT DOCUMENTS

| CN | 114495784 A | 5/2022 | |
| CN | 115831205 A | 3/2023 | |
| CN | 116363981 A * | 6/2023 | ............. G09G 3/035 |

* cited by examiner

*Primary Examiner* — Adam J Snyder
(74) *Attorney, Agent, or Firm* — KDW Firm PLLC

(57)          ABSTRACT

Provided are a display panel and a display device. The display panel includes a driver circuit. The driver circuit includes N stages of shift register units being cascaded with each other, and a shift register unit of the N stages of shift register units includes an initial control module, an initial output module, a drive control module, and a drive output module. In a same shift register unit of the N stages of shift register units, the initial control module is configured to control a signal of a first initial node and a signal of a second initial node; the initial output module is configured to control an initial output signal; the drive control module is configured to control a signal of a first drive node; and the drive output module is configured to control a gate drive signal.

20 Claims, 25 Drawing Sheets

DISPLAY PANEL AND DISPLAY DEVICE HAVING N STAGES OF SHIFT REGISTER UNITS

CROSS-REFERENCE TO RELATED APPLICATION

This application claims priority to Chinese patent application No. 202410284278.X filed with the China National Intellectual Property Administration (CNIPA) on Mar. 12, 2024, the disclosure of which is incorporated herein by reference in its entirety.

TECHNICAL FIELD

The present disclosure relates to the field of display technology, and in particular, to a display panel and a display device.

BACKGROUND

At present, with the development of display technology, a display panel has penetrated various aspects of people's daily life. The display panel may display with different image refresh rates in different application scenarios, for example, the display panel is driven to display the dynamic picture by adopting a driving manner (also referred to as a high-frequency driving manner) with a higher image refresh rate to ensure the smoothness of the picture, and the display panel is driven to display the static picture by adopting a driving manner (also referred to as a low-frequency driving manner) with a lower image refresh rate to reduce the power consumption.

In order to implement the refresh function of the image, each pixel circuit of the display panel is usually scanned in the scan period matching with the image refresh frequency, in this case, the display panel is usually provided with a driver circuit, and the driver circuit sequentially provides an enable level of a scan signal for each row of pixel circuits, so that the display units driven by the various rows of pixel circuits are able to display.

However, the function and structure of the driver circuit in the related art are limited, so that driving manners of various rows of pixels in the pixel array are the same, and thus the display panel cannot satisfy diversified display requirements.

SUMMARY

The present disclosure provides a display panel and a display device, to enable the display panel to satisfy diversified function requirements, thereby broadening application scenarios of the display panel.

The present disclosure provides a display panel. The display panel includes a driver circuit, the driver circuit includes N stages of shift register units being cascaded with each other, and a shift register unit of the N stages of shift register units includes an initial control module, an initial output module, a drive control module, and a drive output module. In the same shift register unit of the N stages of shift register units, the initial control module is configured to receive at least an input signal and a first clock signal and control a signal of a first initial node and a signal of a second initial node; the initial output module is configured to receive at least the signal of the first initial node, the signal of the second initial node, a first level signal and a second clock signal and control an initial output signal; the drive control module is configured to receive at least the signal of the first initial node and a drive control signal and control a signal of a first drive node; and the drive output module is configured to receive at least the first level signal, the second clock signal, the signal of the first drive node and the signal of the second initial node and control a gate drive signal. An initial output signal of an i-th-stage shift register unit of the N stages of shift register units is an input signal of a j-th-stage shift register unit of the N stages of shift register units, where i, j, and N are all positive integers, i≠j, and i and j are both less than or equal to N.

The present disclosure further provides a display device. The display device includes the display panel described above.

It should be understood that the contents described in this section are not intended to identify key or critical features of the embodiments of the present disclosure, nor intended to limit the scope of the present disclosure. Other features of the present disclosure will be readily understood from the following description.

BRIEF DESCRIPTION OF DRAWINGS

In order to describe technical solutions in embodiments of the present disclosure more clearly, drawings of the embodiments of the present disclosure will be briefly described below.

The drawings in the following description are merely some embodiments of the present disclosure. For those of ordinary skill in the art, other drawings may also be obtained without creative labor according to these drawings.

DETAILED DESCRIPTION

In order that those skilled in the art will better understand solutions of the present disclosure, and the technical solutions of embodiments of the present disclosure will be clearly and completely described below in conjunction with the accompanying drawings of the embodiments of the present disclosure. Apparently, the described embodiments are merely some embodiments of the present disclosure, rather than all of the embodiments. All other embodiments obtained by those of ordinary skill in the art based on the embodiments of the present disclosure without requiring creative efforts shall fall in the scope of protection of the present disclosure.

It should be noted that the terms "first", "second" and the like in the Description and claims of the present disclosure, and in the foregoing drawings, are used for distinguishing between similar objects and not necessarily for describing a particular order or sequential order. It should be understood that the data so used are interchangeable as appropriate so that the embodiments of the present disclosure described herein can be implemented in an order other than those illustrated or described herein. Moreover, the terms "include" and "have" as well as any variations thereof, are intended to cover a non-exclusive inclusion, for example, a process, a method, a system, a product, or an apparatus that includes a series of steps or units is not necessarily limited to those steps or units expressly listed, but may include other steps or units not expressly listed or inherent to such process, method, product, or apparatus.

Figure 1:
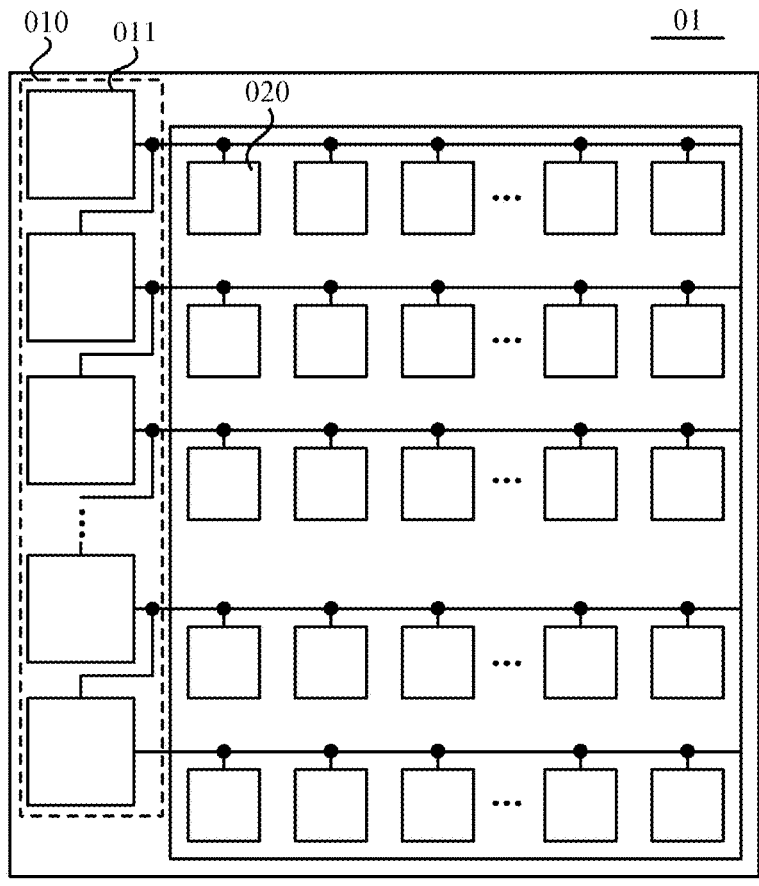
FIG. 1 is a schematic structural diagram of a display panel in the related art.

As described in the background, FIG. 1 is a schematic structural diagram of a display panel in the related art. As shown in FIG. 1, the display panel 01 is provided with a driver circuit 010 and pixel circuits 020 arranged in an array, and the driver circuit 010 includes multiple shift register units 011 disposed in cascade. A drive signal output end of each stage of shift register unit 011 is electrically connected to pixel circuits located in a same row, to respectively provide drive signals to each row of pixel circuits, and thus implement the progressive scanning of the pixel circuits. Moreover, a connection manner of the shift register units 011 disposed in cascade is as follows: a drive signal output end of a previous-stage shift register unit 011 is electrically connected to a signal input terminal of a subsequent-stage shift register unit 011, so that valid pulses of drive signals output by each stage of shift register unit 011 may be sequentially shifted, and frequencies of the drive signals output by various stages of shift register units 011 are the same, whereby drive cycles of the pixel circuits 020 controlled by the drive signals are the same, that is, data signals written to each pixel circuit 020 is simultaneously refreshed, therefore, each pixel circuit 020 cannot be flexibly controlled based on different application scenarios, for example, the pixel circuits 020 in different display regions cannot have different data refresh frequencies, and further, the display panel 01 cannot satisfy the diversified display requirements, which limits the application scenarios of the display panel.

To resolve the above-described technical problems, an embodiment of the present disclosure provides a display panel. The display panel includes a driver circuit, the driver circuit includes N stages of shift register units being cascaded with each other, and a shift register unit of the N stages of shift register units includes an initial control module, an initial output module, a drive control module, and a drive output module. In the same shift register unit of the N stages of shift register units, the initial control module is configured to receive at least an input signal and a first clock signal and control a signal of a first initial node and a signal of a second initial node; the initial output module is configured to receive at least the signal of the first initial node, the signal of the second initial node, a first level signal and a second clock signal and control an initial output signal; the drive control module is configured to receive at least the signal of the first initial node and a drive control signal and control a signal of a first drive node; and the drive output module is configured to receive at least the first level signal, the second clock signal, the signal of the first drive node and the signal of the second initial node and control a gate drive signal. An initial output signal of an i-th-stage shift register unit of the N stages of shift register units is an input signal of a j-th-stage shift register unit of the N stages of shift register units, where i, j, and N are all positive integers, i≠j, and i and j are both less than or equal to N.

By using the above-described technical solutions, the initial output signal output by the initial output module in each stage of shift register unit is used as the input signal of another stage of shift register unit, and the drive control module is configured to control the drive output module to output the gate drive signal as the drive signal of the pixel circuit in the display panel, whereby the initial output signal and the gate drive signal output by the same shift register unit to another stage of shift register unit are enabled to be independent from each other and not influence each other, and it is ensured that the polarity of the first output signal provided to the pixel circuit can be flexibly controlled while the stage transmission and shift of signals are performed between the shift register units, so that driving manners of different rows of pixel circuits in the display panel can be the same or different, thereby enabling the display panel to satisfy the diversified display requirements and to broaden the application scenarios of the display panel. For example, different regions of the display panel are enabled to have different refresh frequencies. On this basis, the polarity of the gate drive signal output by the drive output module is controlled by the drive control module, so that the accuracy of the gate drive signal can be ensured, the accuracy of driving the pixel circuit can be ensured, the accurate light emission of the light-emitting element driven by the pixel circuit can be ensured, and thus the display effect of the display panel can be ensured.

The foregoing description is the core idea of the present disclosure, and all other embodiments obtained by those of ordinary skill in the art based on the embodiments of the present disclosure without requiring creative efforts shall all fall in the scope of protection of the present disclosure. The technical solutions of the embodiments of the present disclosure will be described clearly and completely in connection with the accompanying drawings in the embodiments of the present disclosure below.

Figure 2:
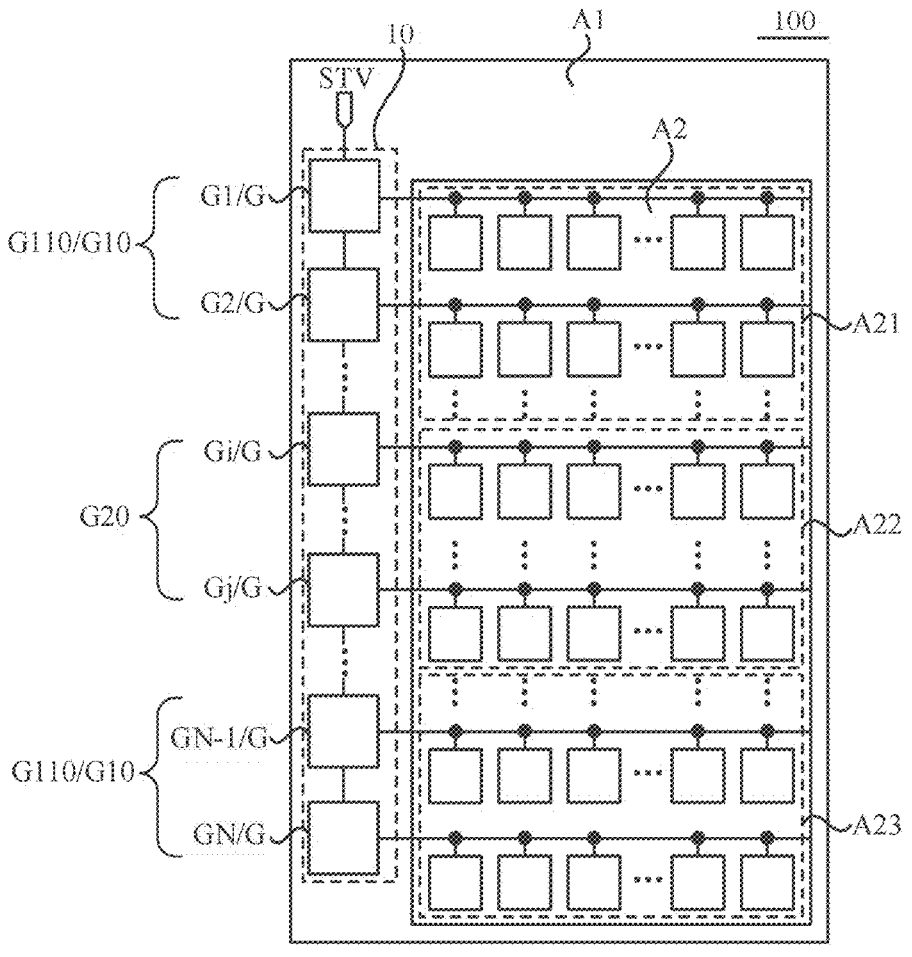
FIG. 2 is a schematic structural diagram of a display panel according to an embodiment of the present disclosure.
Figure 3:
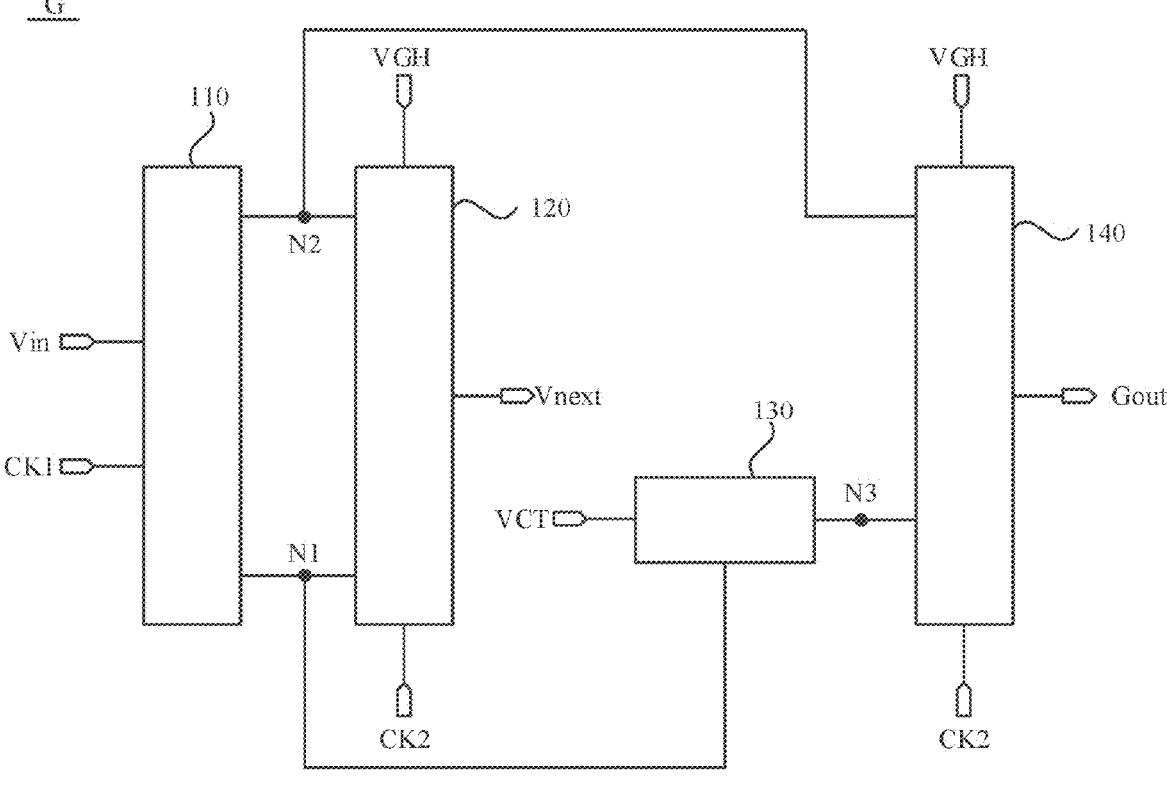
FIG. 3 is a schematic structural diagram of a shift register unit according to an embodiment of the present disclosure.

FIG. 2 is a schematic structural diagram of a display panel according to an embodiment of the present disclosure, and FIG. 3 is a schematic structural diagram of a shift register unit according to an embodiment of the present disclosure. With reference to FIG. 2 and FIG. 3, a display panel 100 includes a driver circuit 10. The driver circuit 10 includes N stages of shift register units G (G1, G2, . . . , Gi, . . . , Gj, . . . , GN−1, GN) being cascaded with each other. A shift register unit G includes an initial control module 110, an initial output module 120, a drive control module 130, and a drive output module 140. In the same shift register unit G, the initial control module 110 is configured to receive at least an input signal Vin and a first clock signal CK1 and control a signal of a first initial node N1 and a signal of a second initial node N2; the initial output module 120 is configured to receive at least the signal of the first initial node N1, the signal of the second initial node N2, a first level signal VGH, and a second clock signal CK2 and control an initial output signal Vnext; the drive control module 130 is configured to receive at least the signal of the first initial node N1 and a drive control signal VCT and control a signal of a first drive node N3; and the drive output module 140 is configured to receive at least the first level signal VGH, the second clock signal CK2, the signal of the first drive node N3 and the signal of the second initial node N2 and control a gate drive signal Gout. An initial output signal Vnext of an i-th-stage shift register unit G is an input signal of a j-th-stage shift register unit G, where i, j, and N are all positive integers, i≠j, and i and j are both less than or equal to N.

It should be noted that, only an example in which the driver circuit 10 is located in a non-display region A1 and the pixel circuit 20 is located in a display region A2 is used for exemplary description. In other embodiments of the present disclosure, both the pixel circuit 20 and the driver circuit 10 may be located in the display region A2, so that a number of devices disposed in the non-display region A1 of the display panel 100 is sufficiently small, and a size of the non-display region A1 of the display panel 100 is reduced, thereby facilitating a narrow bezel of the display panel 100, and making the display panel 100 have a relatively high screen-to-body ratio.

For ease of description, the technical solutions of embodiments of the present disclosure are exemplarily described by using an example in which the driver circuit 10 is located in the non-display region A1 of the display panel 100 and the pixel circuit 20 is located in the display region A2 of the display panel 100 in embodiments of the present disclosure without any special limitation.

With continued reference to FIG. 2 and FIG. 3, an output end of the initial output module 120 of an x-th-stage shift register unit Gx may be electrically connected to an input terminal of the initial control module 110 of a y-th-stage shift register unit Gy, so that the initial output signal Vnext output by the initial output module 120 of the x-th-stage shift register unit Gx is the input signal Vin of the initial control module 110 of the y-th-stage shift register unit Gy. The x-th-stage shift register unit Gx and the y-th-stage shift register unit Gy may be adjacent two stages of shift register units. In this case, if x is equal to i, then y may be equal to i+1. Alternatively, the x-th-stage shift register unit Gx and the y-th-stage shift register unit Gy may be two stages of shift register units that are not adjacent to each other, and in this case, y-x may be a positive integer greater than or equal to 2. The values of x and y in embodiments of the present disclosure are not specifically limited on the premise that the core inventive point of embodiments of the present disclosure is able to be achieved.

For ease of description, the technical solutions of embodiments of the present disclosure are exemplarily described by using an example in which the x-th-stage shift register unit and the y-th-stage shift register unit may be adjacent two stages of shift register units in embodiments of the present disclosure without any special limitation.

With continued reference to FIG. 2 and FIG. 3, in the same shift register unit G, the initial control module 110 and the initial output module 120 may be electrically connected to the first initial node N1, the initial control module 110 and the initial output module 120 may be electrically connected to the second initial node N2, the initial control module 110 and the drive control module 130 may be electrically connected to the first initial node N1, and the initial control module 110 and the drive output module 140 may be electrically connected to the second initial node N2. For a first-stage shift register unit G1, the input signal Vin received by the initial control module 110 of the first-stage shift register unit G1 may be a start signal STV provided by a start control circuit (not shown in the drawings), so that the first-stage shift register unit G1 may provide corresponding signals to the first initial node N1 and the second initial node N2 thereof in response to at least the start signal STV and the first clock signal CK1. For a stage of other stages of shift register unit G other than the first-stage shift register unit G1, an input terminal of the initial control module 110 of the stage of shift register unit may be electrically connected to an output end of the initial output module 120 of the previous-stage shift register unit G, so that each stage of shift register unit G may provide corresponding signals to the first initial node N1 and the second initial node N2 thereof in response to at least the initial output signal Vnext and the first clock signal CK1 that are output by the initial output module 120 of the previous-stage shift register unit G. In the same shift register unit G, a polarity of a signal of the first initial node N1 may be the same as or opposite from a polarity of a signal of the second initial node N2. In one or more embodiments, in at least part of time, a polarity of a signal of the first initial node N1 is opposite from a polarity of a signal of the second initial node N2, that is, when the signal of the first initial node N1 is at a high level, the signal of the second initial node N2 may be at a low level, or the signal of the first initial node N1 is at a low level, the signal of the second initial node N2 is at a high level.

Correspondingly, in the same shift register unit G, the initial output module 120 may output a corresponding initial output signal Vnext according to a signal of the first output node N1, a signal of the second output node N2, the first level signal VGH, and the second clock signal CK2 that are received by the initial output module 120. For example, when the signal of the first output node N1 is at an enable level, the initial output module 120 may output the second clock signal CK2 as the initial output signal Vnext, and when the signal of the second output node N2 is at an enable level, the initial output module 120 may output the first level signal VGH as the initial output signal Vnext.

The drive control module 130 may provide a corresponding signal to the first drive node N3 at least according to the signal of the first initial node N1 and the drive control signal VCT that are received by the drive control module 130. In one or more embodiments, when the drive control signal VCT is at an enable level, the drive control module 130 may control the signal of the first initial node N1 to be transmitted to the first drive node N3, so that the signal of the first initial node N1 is the same as the signal of the first drive node N3. In one or more embodiments, when the signal of the first initial node N1 is at an enable level, the drive control module 130 may control the drive control signal VCT to be transmitted to the first drive node N3, so that the signal of the first drive node N3 is the same as the drive control signal VCT. In this way, the drive control module 130 is disposed in the shift register unit G, so that the drive control module 130 controls the signal of the first drive node N3 at least according to the drive control signal VCT and the signal of the first initial node N1, the signal of the first drive node N3 is controlled by both the drive control signal VCT and the signal of the first initial node N1, and the signal of the first drive node N3 is the same as or different from the signal of the first initial node N1.

The drive output module 140 may output a corresponding gate drive signal Gout at least according to the first level signal VGH, the second clock signal CK2, the signal of the first drive node N3 and the signal of the second initial node N2 that are received by the drive output module 140. For example, when the signal of the first drive node N3 is at an enable level, the drive output module 140 may output the second clock signal CK2 as the gate drive signal Gout, and when the signal of the second initial node N2 is at an enable level, the drive output module 140 may output the first level signal VGH as the gate drive signal Gout. In this way, when the signal of the first initial node N1 is the same as the signal of the first drive node N3, the gate drive signal Gout output by the drive output module 140 is the same as the initial output signal Vnext output by the initial output module 120. When the signal of the first initial node N1 is different from the signal of the first drive node N3, the gate drive signal Gout output by the drive output module 140 may be different from the initial output signal Vnext output by the initial output module 120, so that on the premise that the current-stage shift register unit G may provide a corresponding initial output signal Vnext for a next-stage shift register unit and that the next-stage shift register unit is able to be ensured to operate normally, the signal of the first drive node N3 of the current-stage shift register unit G may be controlled according to the display requirement, that is, the gate drive signal Gout output by the current-stage shift register unit G is controlled according to the display requirement, thereby satisfying the diversified display requirements of the display panel.

It should be understood that both the initial output signal Vnext and the gate drive signal Gout may be a pulse signal including the high level and the low level, one of the high level or the low level is at an enable level, and the other is at a non-enable level. When the initial output signal Vnext and the gate drive signal Gout output by the same shift register unit G are different, it may be understood that the initial output signal Vnext and the gate drive signal Gout output by the same shift register unit G have different periods, different durations of the enable levels, different numbers of pulses of the enable levels, and the like, and may be set according to practical requirements, which are not specifically limited in the embodiment of the present disclosure.

Moreover, the drive control module 130 is disposed in the shift register unit to control the gate drive signal output by the drive output module 140 by controlling the signal of the first drive node N3. Compared with a condition that the drive output module 140 is directly electrically connected to the first initial node N1 and the drive output module 140 is configured to directly receive the drive control signal VCT, the existence of the drive control module 130 enables the drive control signal VCT and the signal of the first initial node N1 to be isolated from the signal of the first drive node N3, prevents fluctuations of the first initial node N1 and the drive signal VCT from affecting the accuracy of the gate drive signal Gout output by the drive output module 140.

It should be further understood that the gate drive signals Gout output by the drive output module 140 of each stage of shift register unit G may be correspondingly provided to each row of pixel circuits 20. The pixel circuit 20 may include a preset module, so that the gate drive signal Gout output by the shift register unit G may control the preset module in the pixel circuit 20 to be turned on or off. That is, when the gate drive signal Gout output by the shift register unit G is at an enable level, the preset module of the pixel circuit 20 may be controlled to be turned on, and when the gate drive signal Gout output by the shift register unit G is at a non-enable level, the preset module of the pixel level may be controlled to be turned off, to refresh the signal in the pixel circuit 20. The pixel circuit 20 may further include other modules, and the specific structure of the pixel circuit 20 is not specifically limited in the embodiment of the present disclosure.

Figure 4:
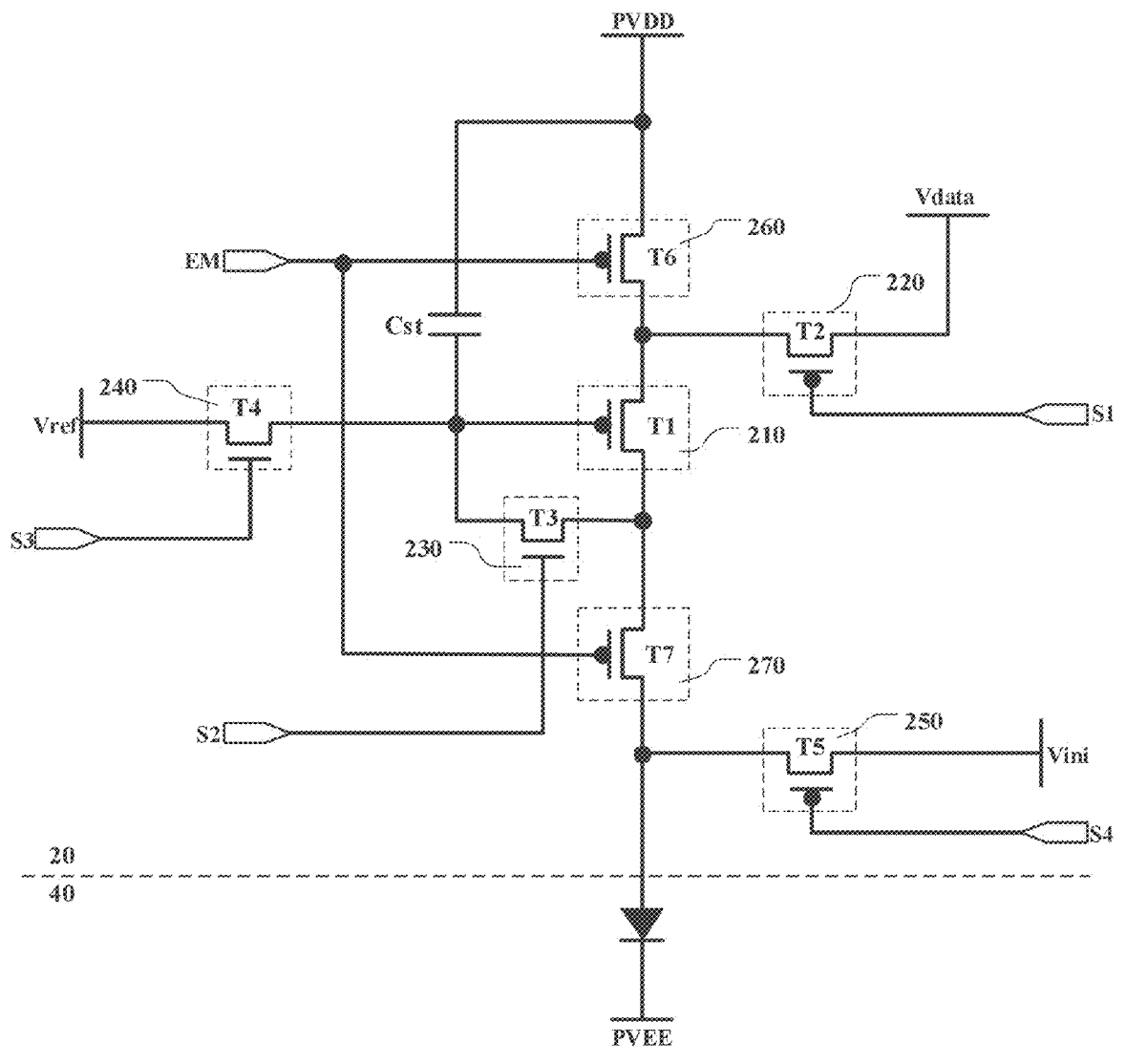
FIG. 4 is a schematic structural diagram of a pixel circuit according to an embodiment of the present disclosure.
Figure 5:
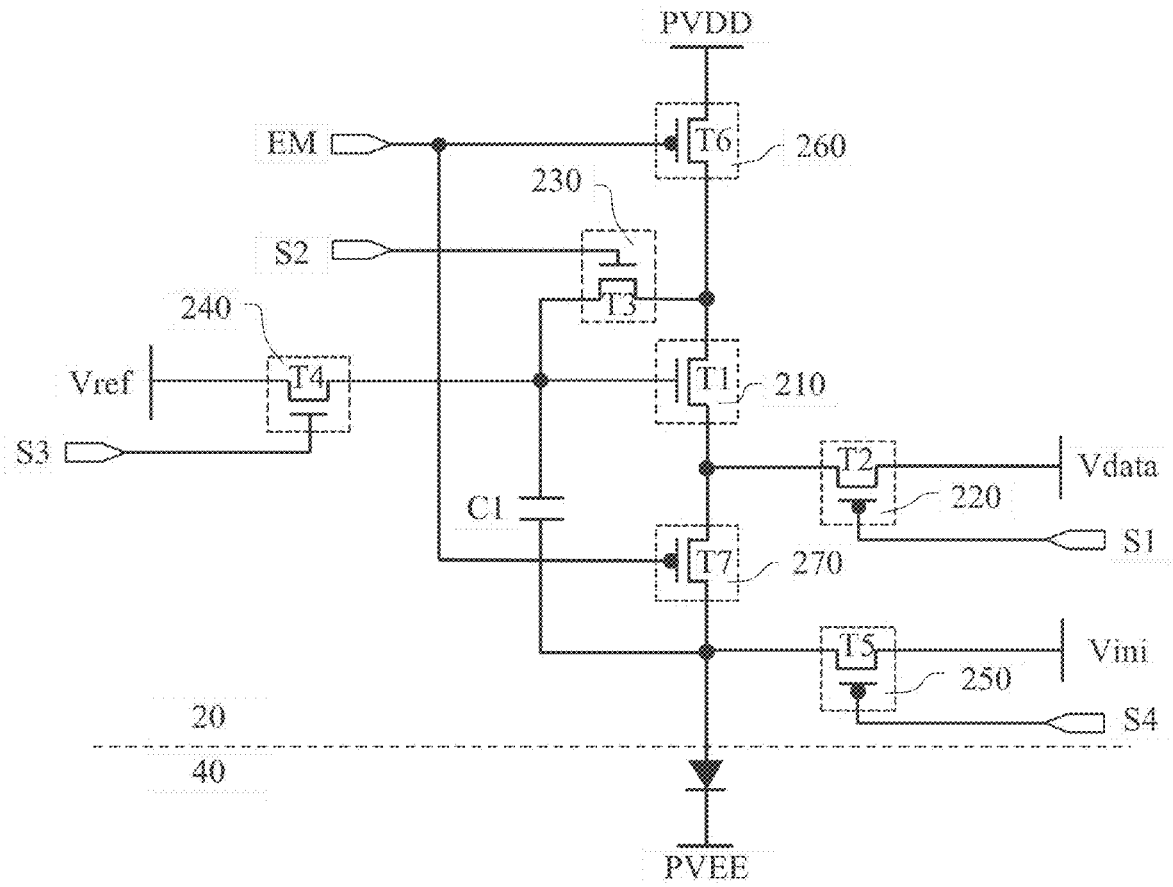
FIG. 5 is another schematic structural diagram of a pixel circuit according to an embodiment of the present disclosure.
Figure 6:
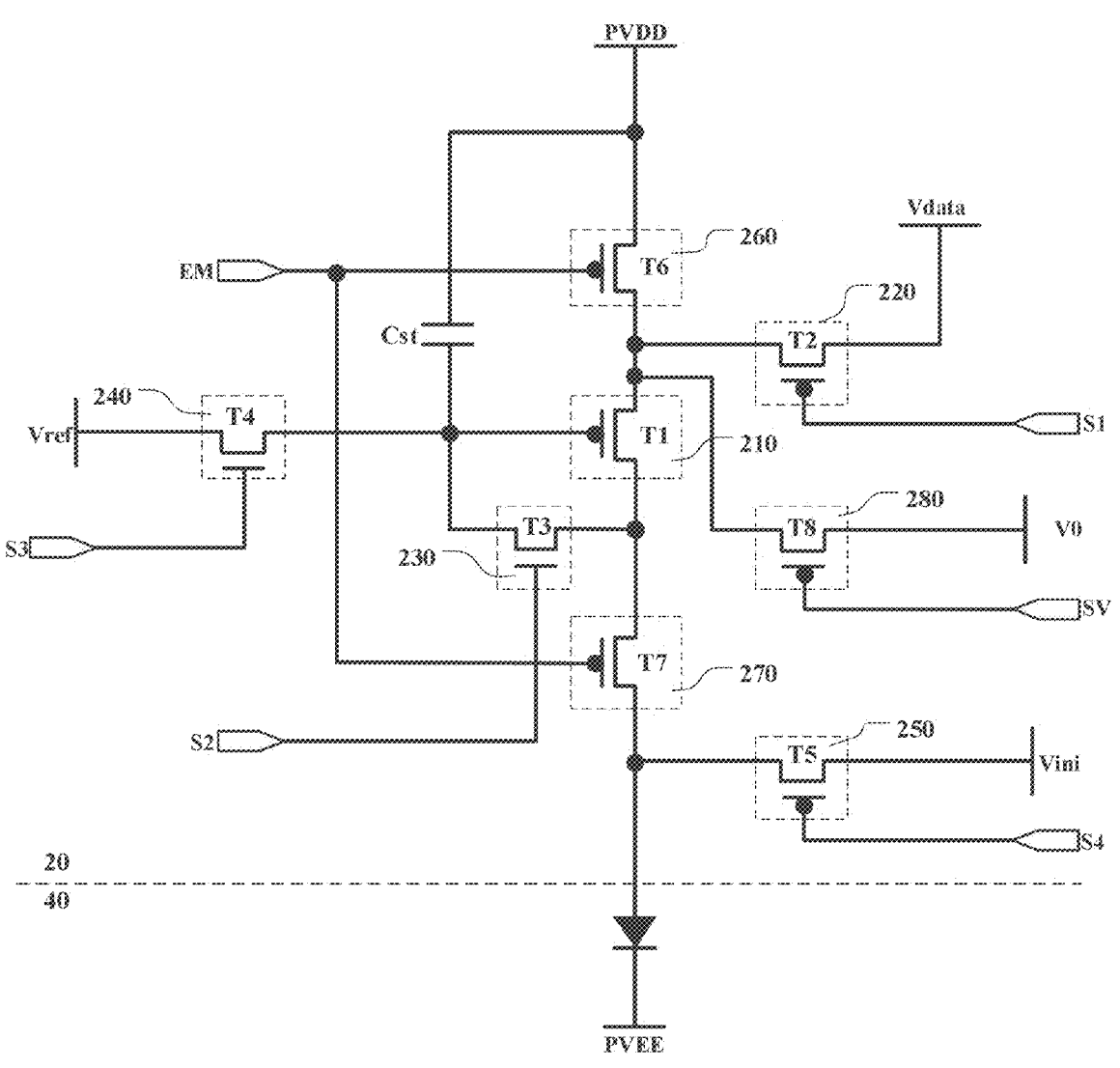
FIG. 6 is another schematic structural diagrams of a pixel circuit according to an embodiment of the present disclosure.
Figure 7:
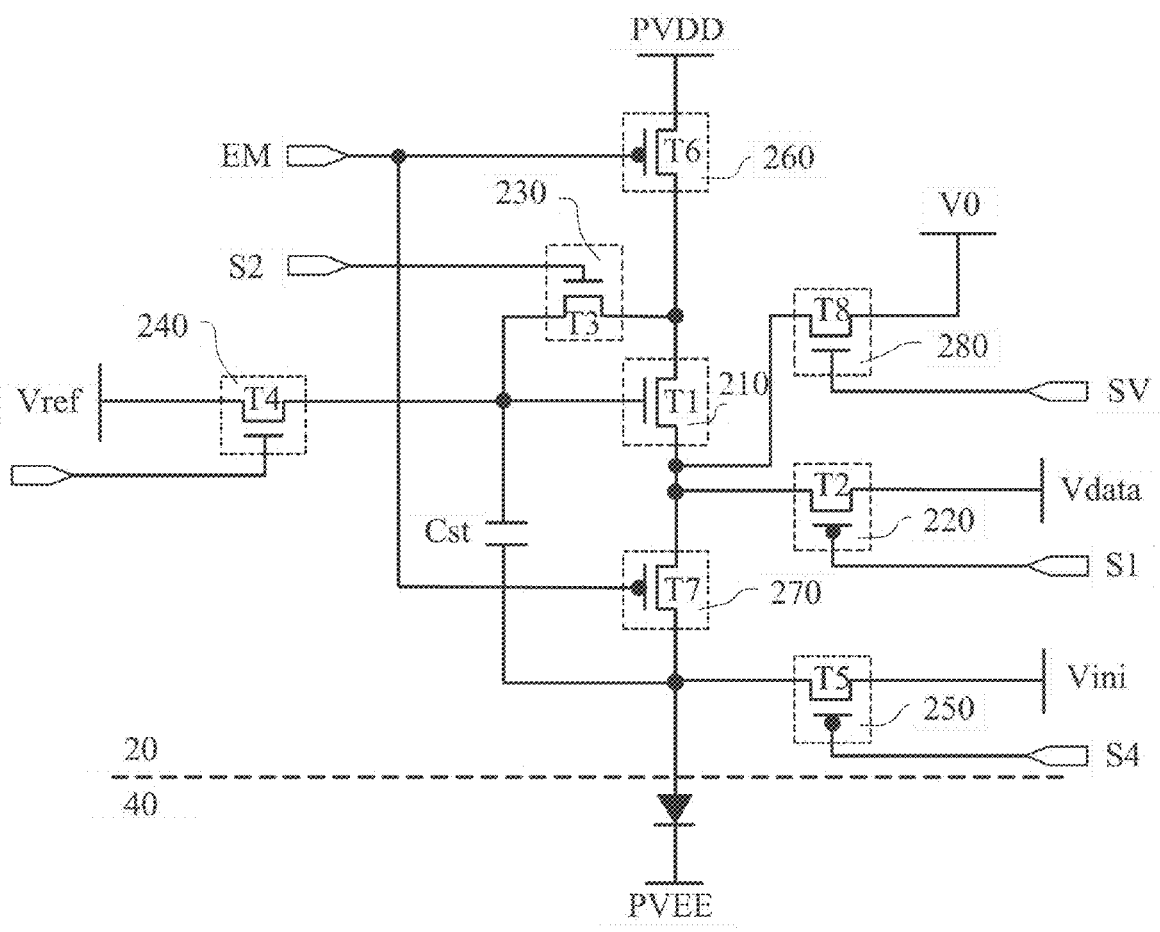
FIG. 7 is another schematic structural diagrams of a pixel circuit according to an embodiment of the present disclosure.
Figure 8:
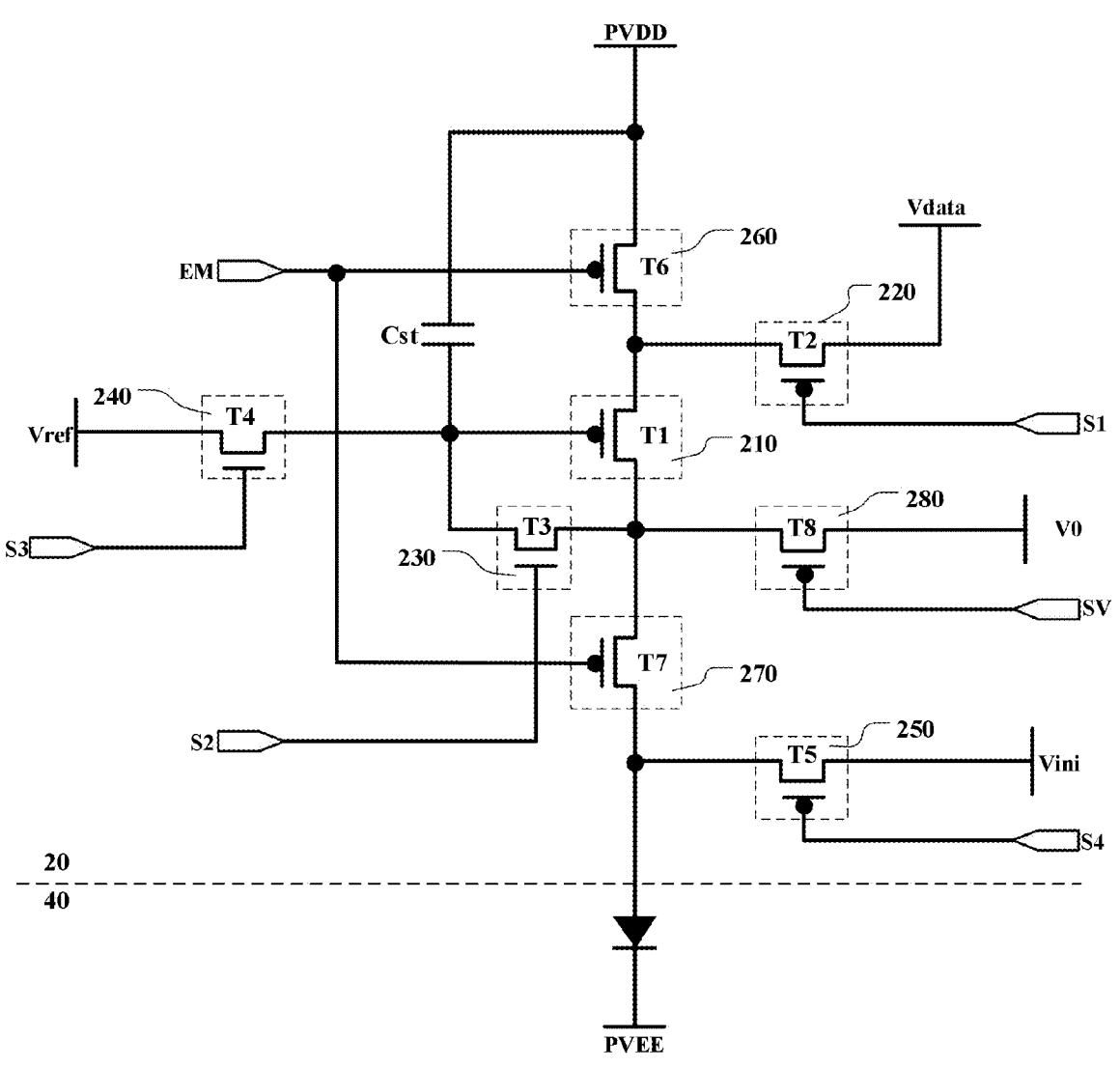
FIG. 8 is another schematic structural diagrams of a pixel circuit according to an embodiment of the present disclosure.
Figure 9:
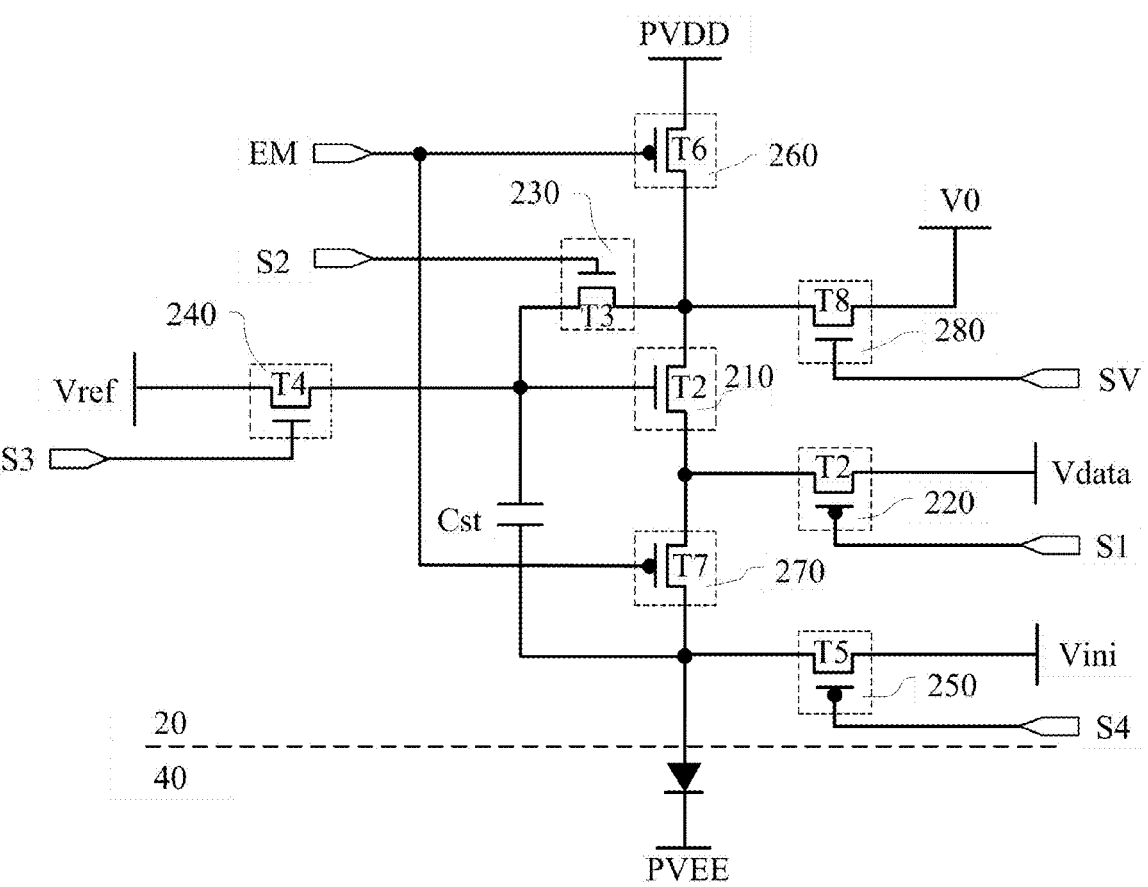
FIG. 9 is another schematic structural diagrams of a pixel circuit according to an embodiment of the present disclosure.

In some embodiments, FIG. 4 is a schematic structural diagram of a pixel circuit according to an embodiment of the present disclosure, and FIG. 5 is another schematic structural diagram of a pixel circuit according to an embodiment of the present disclosure. As shown in FIG. 4 or FIG. 5, the display panel 100 includes a pixel circuit 20 and a light-emitting element 40. The pixel circuit 20 may include a drive module 210, a data write module 220, a reset module 230, and a compensation module 240. The drive module 210 may selectively provide a drive current to the light-emitting element 40, to drive the light-emitting element 40 to emit light. The data write module 220 is connected to a first end of the drive module 210 and is configured to provide a data signal Vdata for the drive module 210, so that the drive module 210 may generate, according to the data signal Vdata, a drive current that drives the light-emitting element 40 to emit light. The reset module 230 is connected to a control terminal of the drive module 210 and is configured to provide a reset signal for the drive module 210, to reset the drive module 210. The compensation module 240 is connected between the control terminal of the drive module 210 and a second end of the drive module 210, so that when the data write module 220 provides the data signal Vdata for the drive module 210, the data signal Vdata may be compensated, to ensure that the drive module 210 may provide the accurate drive current to the light-emitting element 40 and control the light emission accuracy of the light-emitting element 40.

In one or more embodiment, the light-emitting element 40 is generally a current-type drive element, and the data signal Vdata provided by the data write module 220 is generally a voltage signal. Therefore, a drive transistor T1 is disposed in the drive module 210, so that the data signal Vdata provided by the data write module 220 is able to be written to a gate of the drive transistor T1, the drive transistor T1 may generate a corresponding drive current according to the signal of the gate of the drive transistor T1, and provide the corresponding drive current to the light-emitting element 40 to drive the light-emitting element 40 to emit light with a corresponding brightness. In this case, one of a source or a drain of the drive transistor M1 receives a positive power supply signal PVDD, and the other of the source or the drain of the drive transistor T1 is coupled to an anode of the light-emitting element 40. A cathode of the light-emitting element 40 may receive a negative power supply signal PVEE. In this way, a voltage difference exists between the positive power supply signal PVDD and the negative power supply signal PVEE to form a current path, so that the drive transistor T1 generates a drive current and provide the drive current to the light-emitting element 40 to drive the light-emitting element 40 to emit light.

It should be understood that, as shown in FIG. 4, an active layer material of the drive transistor T1 in the drive module 210 may include a low-temperature polysilicon material, so that the drive transistor T1 has a relatively high carrier mobility, and thus requirements such as a high reaction speed and low power consumption are satisfied. In this case, the drive transistor T1 may be a positive channel metal-oxide-semiconductor (PMOS) transistor. In other exemplary embodiments, as shown in FIG. 5, the active layer material of the drive transistor T1 may also include an oxide semiconductor material. In this case, the drive transistor T1 may be an negative channel metal-oxide-semiconductor (NMOS)

transistor. The material and the type of the drive transistor T1 are not specifically limited in the embodiment of the present disclosure on the premise that the core inventive point of the embodiment of the present disclosure can be achieved.

Correspondingly, the data write module 220 may be connected to a first electrode of the drive transistor T1 and is configured to provide the data signal Vdata for the drive transistor T1. The compensation module 230 may be connected between the gate of the drive transistor T1 and a second electrode of the drive transistor T1, and is configured to compensate for a threshold voltage of the drive transistor T1. The reset module 240 may be connected to the gate of the drive transistor T1 to provide a reset signal Vref for the gate of the drive transistor T1 to reset the gate of the drive transistor T.

A control terminal of the data write module 220 may receive a first scan signal S1, and the first scan signal S1 controls the data write module 220 to be turned on or off. A control terminal of the compensation module 230 may receive a second scan signal S2, and the second scan signal S2 controls the compensation module 230 to be turned on or off. A control terminal of the reset module 240 receives a third scan signal S3, and the third scan signal S3 controls the reset module 240 to be turned on or off.

When the third scan signal S3 controls the reset module 240 to be turned on, the reset signal Vref may be transmitted to the gate of the drive transistor T1 to reset the gate of the drive transistor T1, so as to clear the data signal Vdata provided to the gate of the drive transistor T1 in the previous drive cycle, and prepare for the subsequent writing of the data signal Vdata.

When the first scan signal S1 controls the data write module 220 to be turned on, the data signal Vdata may be written to the first electrode of the drive transistor T1 through the data write module 220, to refresh the signal of the first electrode of the drive transistor T1. If the drive transistor T1 is in an on state at this time and the second scan signal S2 controls the compensation module 230 to be turned on, the data signal Vdata may be provided to the second electrode of the drive transistor T1 through the drive transistor T1 and to the gate of the drive transistor T1 through the compensation module 230, and a threshold voltage Vth of the drive transistor T1 is compensated to the gate of the drive transistor T1, so as to refresh the signal of the gate of the drive transistor T1 and the signal of the second electrode of the drive transistor T1, so that a drive current generated by the drive transistor T1 is independent of the threshold voltage Vth of the drive transistor T1.

In one or more embodiments, the data write module 220 may include a data write transistor T2, a first electrode of the data write transistor T2 receives a data signal Vdata, a second electrode of the data write transistor T2 is electrically connected to the first electrode of the drive transistor T1, and a gate of the data write transistor T2 receives the first scan signal S1, so that the first scan signal S1 controls the data write transistor T2 to be turned on or off. The compensation module 230 includes a compensation transistor T3, a first electrode of the compensation transistor T3 is electrically connected to the second electrode of the drive transistor T1, a second electrode of the compensation transistor T3 is electrically connected to the gate of the drive transistor T1, and a gate of the compensation transistor T3 receives the second scan signal S2, so that the second scan signal S2 controls the compensation transistor T3 to be turned on or off. The reset module 240 includes a reset transistor T4, a first electrode of the reset transistor T4 receives the reset signal Vref, a second electrode of the reset transistor T4 is electrically connected to the gate of the drive transistor T1, and a gate of the reset transistor T4 receives the third scan signal S3, so that the third scan signal S3 controls the reset transistor T4 to be turned on or off.

On the basis of the above-described embodiments, the pixel circuit 20 may further include an initialization module 250. The initialization module 250 is connected to the anode of the light-emitting element 40, and is configured to provide an initialization signal Vini for the light-emitting element 40, to initialize the anode of the light-emitting element 40. The initialization module 250 may be turned on or off under the control of a fourth scan signal S4, and when the fourth scan signal S4 controls the initialization module 250 to be turned on, the initialization signal Vini may be provided to the anode of the light-emitting element 40.

In one or more embodiments, the initialization module 250 may include an initialization transistor T5, a first electrode of the initialization transistor T5 receives the initialization signal Vini, a second electrode of the initialization transistor T5 is electrically connected to the anode of the light-emitting element 40, and a gate of the initialization transistor T5 receives the fourth scan signal S4, so that the fourth scan signal S4 is able to control the initialization transistor T5 to be turned on or off.

On the basis of the above-described embodiments, the pixel circuit 20 may further include a light-emitting control module. The light-emitting control module may include a first light-emitting control module 260 and a second light-emitting control module 270. The first light-emitting control module 260 and the second light-emitting control module 270 may control the current path between the positive power supply signal PVDD and the negative power supply signal PVEE, to control the duration for which the drive transistor T1 provides the drive current to the light-emitting element 40. The first light-emitting control module 260 and the second light-emitting control module 270 may be turned on or off under the control of a light-emitting control signal EM. When the light-emitting control signal EM controls the first light-emitting control module 260 and the second light-emitting control module 270 to be turned on, the drive transistor T1 may generate a drive current, and provide the drive current to the light-emitting element 40 to drive the light-emitting element 40 to emit light.

In one or more embodiments, the first light-emitting control module 260 may include a first light-emitting control transistor T6, and the second light-emitting control module 270 may include a second light-emitting control transistor T7. A first electrode of the first light-emitting control transistor T6 receives the positive power supply signal PVDD, a second electrode of the first light-emitting control transistor T6 is electrically connected to the first electrode of the drive transistor T1, a first electrode of the second light-emitting control transistor T7 is electrically connected to the second electrode of the drive transistor T1, a second electrode of the second light-emitting control transistor T7 is electrically connected to the anode of the light-emitting element 40, and a gate of the first light-emitting control transistor T6 and a gate of the second light-emitting control transistor T7 receive the light-emitting control signal EM, so that the first light-emitting control signal EM is able to control the first light-emitting control transistor T6 and the second light-emitting control transistor T7 to be turned on or off simultaneously.

On the basis of the above-described embodiments, the pixel circuit 20 may further include a storage capacitor Cst. A first plate of the storage capacitor Cst receives a fixed signal (such as, the positive power supply signal PVDD), and a second plate of the storage capacitor Cst is electrically connected to the gate of the drive transistor T1 to store a signal at the gate of the drive transistor T1.

In another embodiment of the present disclosure, FIG. 6 to FIG. 9 are schematic structural diagrams of a pixel circuit according to an embodiment of the present disclosure. Referring to any one of FIG. 6 to FIG. 9, on the basis of the above-described embodiments, the pixel circuit 20 may further include a bias adjustment module 280, the bias adjustment module 280 is connected to a first end of the drive module 210 or a second end of the drive module 210, and is configured to provide a bias adjustment signal V0 for the drive module 210 for bias adjustment of the drive transistor T1 in the drive module 210.

When the drive module 210 includes the drive transistor T1, the first electrode of the drive transistor T1 may be the first end of the drive module 210, and the second electrode of the drive transistor T1 may be the second end of the drive module 210. In this case, the bias adjustment module 280 may be electrically connected to the first electrode or the second electrode of the drive transistor T1, which are not specifically limited in the embodiment of the present disclosure on the premise that the bias adjustment of the drive transistor T1 is able to be achieved.

In one or more embodiments, the bias adjustment module 280 may be turned on or off under the control of a bias adjustment control signal SV. When the bias adjustment control signal SV controls the bias adjustment module 280 to be turned on, the bias adjustment signal V0 may be provided to the first electrode and/or the second electrode of the drive transistor T1 for the bias adjustment on the drive transistor T1.

In one or more embodiments, the bias adjustment module 280 may include a bias adjustment transistor T8, a first electrode of the bias adjustment transistor T8 receives a bias adjustment signal V0, a second electrode of the bias adjustment transistor T8 is electrically connected to the first electrode of the drive transistor T1 or the second electrode of the drive transistor T1, and a gate of the bias adjustment transistor T8 receives the bias adjustment control signal SV, so that the bias adjustment control signal SV is able to control the bias adjustment transistor T8 to be turned on or off.

It should be noted that FIG. 4 to FIG. 9 only exemplarily provide several structures of the pixel circuit, but not including all of them, and the specific structure of the pixel circuit is not limited in the embodiment of the present disclosure on the premise that the core inventive point of the embodiments of the present disclosure can be achieved.

Based on the above-described pixel circuits, the preset module of the pixel circuit 20 in the embodiment of the present disclosure may include any one of the data write module 220, the compensation module 230, the reset module 240, the initialization module 250, the light-emitting control module (the first light-emitting control module 260 and the second light-emitting control module 270), or the bias adjustment module 280, so that the gate drive signal output by the shift register unit is able to control any one of the data write module 220, the compensation module 230, the reset module 240, the initialization module 250, the light-emitting control module (the first light-emitting control module 260 and the second light-emitting control module 270), or the bias adjustment module 280 to be turned on or off, that is, the gate drive signal output by the shift register unit may include any one of the first scan signal S1, the second scan signal S2, the third scan signal S3, the fourth scan signal S4, the light-emitting control signal EM or the bias adjustment control signal SV For ease of description, in this embodiment, an example in which the gate drive signal output by the shift register unit is the first scan signal S1 for controlling the data write module 220 to be turned on or off is used, and the drive principle of the pixel circuit 20 is described below.

With reference to FIG. 2 and FIG. 4 (or any one of FIG. 5 to FIG. 9), different stages of shift register units G provide the gate drive signals Gout to different rows of pixel circuits 20, to control the data write module 220 in each row of pixel circuits 20 to be turned on or off. The x-th-stage shift register unit Gx and the y-th-stage shift register unit Gy are used as an example, when the data write module 220 in an x-th row of pixel circuits 20 provides the data signal Vdata to the driver module 210, the drive output module of the x-th stage shift register unit Gx may output an enable level of the gate drive signal Goutx to the x-th row of pixel circuits 20 electrically connected to the shift register unit Gx under the control of the signal of the first drive node of the x-th stage shift register unit Gx, so that the data write module 220 in the x-th row of pixel circuits 20 is turned on and the data signal Vdata is written to the driver module 210 in the x-th row of pixel circuits 20. Moreover, the initial output module of the x-th-stage shift register unit Gx may further output, under the control of the signal of the first initial node N1 of the x-th-stage shift register unit Gx, an enable level of the initial output signal Vnextx to the y-th-stage shift register unit Gy as an input signal of the y-th-stage shift register unit Gy, so that the initial control module of the y-th-stage shift register unit Gy controls the signal of the first initial node of the y-th-stage shift register unit Gx according to the input signal, whereby after the initial output signal Vnextx output by the x-th-stage shift register unit Gx becomes the non-enable level, and the initial output module of the y-th-stage shift register unit Gy may output the enable level of the initial output signal Vnexty to the next-stage shift register unit of the y-th-stage shift register unit Gy according to the signal of the first initial node of the y-th-stage shift register unit Gy, so that the enable level of the initial output signal Vnexty is used to as the input signal of the next-stage shift register unit, ensuring that the next-stage shift register unit operates normally. Moreover, the drive control module of the y-th-stage shift register unit Gy controls the signal of the first drive node thereof according to the signal of the first initial node N1 and the drive control signal VTC, so that the drive output module of the y-th-stage shift register unit Gy may output a corresponding gate drive signal Gouty according to the signal of the first drive node thereof, where the gate drive signal Gouty may be the same as or different from the initial output signal Vnexty of the y-th-stage shift register unit Gy. The gate drive signal Gout output by the drive output module of the y-th-stage shift register unit Gy may be provided to a y-th row of pixel circuits 20 electrically connected to the y-th-stage shift register unit Gy, so that the data write module 220 of the y-th row of pixel circuits 20 is turned on or kept off to refresh the data signal Vdata in the y-th row of pixel circuit 20 or to keep the the data signal Vdata in the y-th row of pixel circuit 20 unchanged. Thus, each stage of shift register unit G provides the enable level of the gate drive signal Gout to the data write module 220 of the pixel circuit 20 while providing the enable level of the initial output signal Vnext to the next-stage shift register unit, so that the gate drive signal Gout for controlling the data write module 220 in the pixel circuit 20 and the initial output signal Vnext provided to the next-stage shift register unit are different signals, so as to ensure the normal operation of the next-stage shift register unit, and at the same time, the data signal Vdata in the pixel circuit 20 is controlled to be refreshed or kept unchanged according to practical requirements, thereby avoiding a situation that the normal display and light emission of the display panel 100 is affected due to a fact that the input signal Vin required by the next-stage shift register unit is different from the gate drive signal required by the pixel circuit 20 electrically connected to the current-stage shift register unit, enabling the display panel 100 to have the diversified structure, and satisfying the diversified functional requirements.

It should be understood that, for a situation that the gate drive signal Gout output by the driver circuit 10 is a control signal of other modules in the pixel circuit 20, which is similar to the above-described situation, and will not be described in detail in the embodiment of the present disclosure.

In this embodiment, the initial output signal output by the initial output module in each stage of shift register unit is used as the input signal of another stage of shift register unit, and the drive control module is configured to control the drive output module to output the gate drive signal as the drive signal of the pixel circuit in the display panel, whereby the initial output signal and the gate drive signal output by the same shift register unit to another stage of shift register unit are enabled to be independent from each other and not influence each other, and it is ensured that the polarity of the first output signal provided to the pixel circuit can be flexibly controlled while the stage transmission and shift of signals are performed between the shift register units, so that driving manners of different rows of pixel circuits in the display panel can be the same or different, thereby enabling the display panel to satisfy the diversified display requirements and to broaden the application scenarios of the display panel are broadened. For example, different regions of the display panel are enabled to have different refresh frequencies. On this basis, the polarity of the gate drive signal output by the drive output module is controlled by the drive control module, so that the accuracy of the gate drive signal can be ensured, the accuracy of driving the pixel circuit can be ensured, the accurate light emission of the light-emitting element driven by the pixel circuit can be ensured, and thus the display effect of the display panel can be ensured.

It should be noted that in the shift register unit, since the initial output module is configured to receive at least the signal of the first output node and the signal of the second output node, the drive control module is configured to receive at least the signal of the first initial node and the drive control signal to control the signal of the first drive node, and the drive output module is configured to receive at least the signal of the first drive node and the signal of the second initial node. Therefore, the signal of the first initial node and the signal of the second initial node may control the initial output signal output by the initial output module. The first output node and the drive control signal may control the signal of the first drive node, and the first drive node and the second initial node may control the gate drive signal output by the drive output module. The initial output signal may be the same as or different from the gate drive signal, and is related to specific structures of the initial output module, the drive control module, and the drive output module. The structures of the initial output module, the drive control module, and the drive output module are exemplarily described by means of typical examples below.

Figure 10:
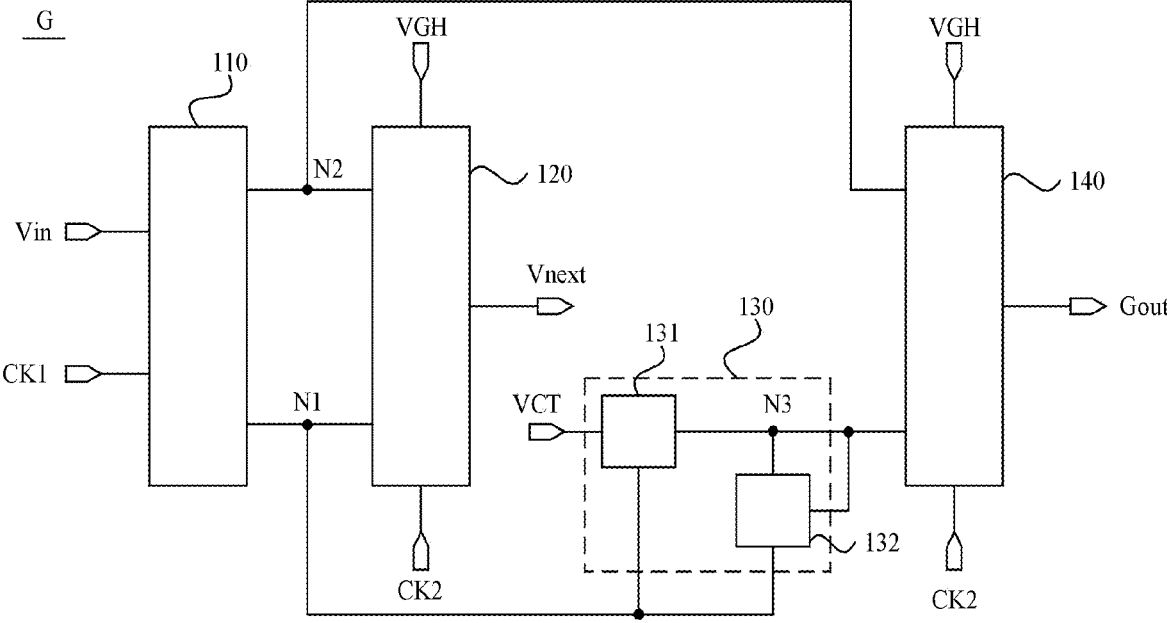
FIG. 10 is another schematic structural diagram of a shift register unit according to an embodiment of the present disclosure.

In one or more embodiment, FIG. 10 is another schematic structural diagram of a shift register unit according to an embodiment of the present disclosure. As shown in FIG. 10, the drive control module 130 includes a first drive control submodule 131. The first drive control submodule 131 is configured to receive at least the drive control signal VCT and the signal of the first initial node N1 and control a duration for which the signal of the first drive node N3 is kept at an enable level. In this way, the drive control signal VCT is combined with the signal of the first initial node N1 to jointly control the duration for which the first drive control submodule 131 provides the signal of the enable level to the first drive node N3.

In one or more embodiments, a control terminal of the first drive control submodule 131 may be electrically connected to the first initial node N1, and an input terminal of the first drive control submodule 131 receives the drive control signal VCT, or a control terminal of the first drive control submodule 131 receives the drive control signal VCT, and an input terminal of the first drive control submodule 131 may be electrically connected to the first initial node N1, so that the first drive control submodule 131 may write the signal received by the input terminal of the first drive control submodule 131 into the first drive node N3 when the signal of the control terminal of the first drive control submodule 131 is at the enable level, whereby signal of the first drive node N3 may be kept to be consistent with the drive control signal VCT or the signal of the first initial node N1. In this way, the duration for which the signal of the first drive node N3 is kept at the enable level is the time for which the drive control signal VCT and the first initial node N1 are simultaneously at the enable level, thereby controlling the first drive node N3 according to practical requirements by controlling the duration for which the drive control signal VCT is kept at the enable level.

Figure 11:
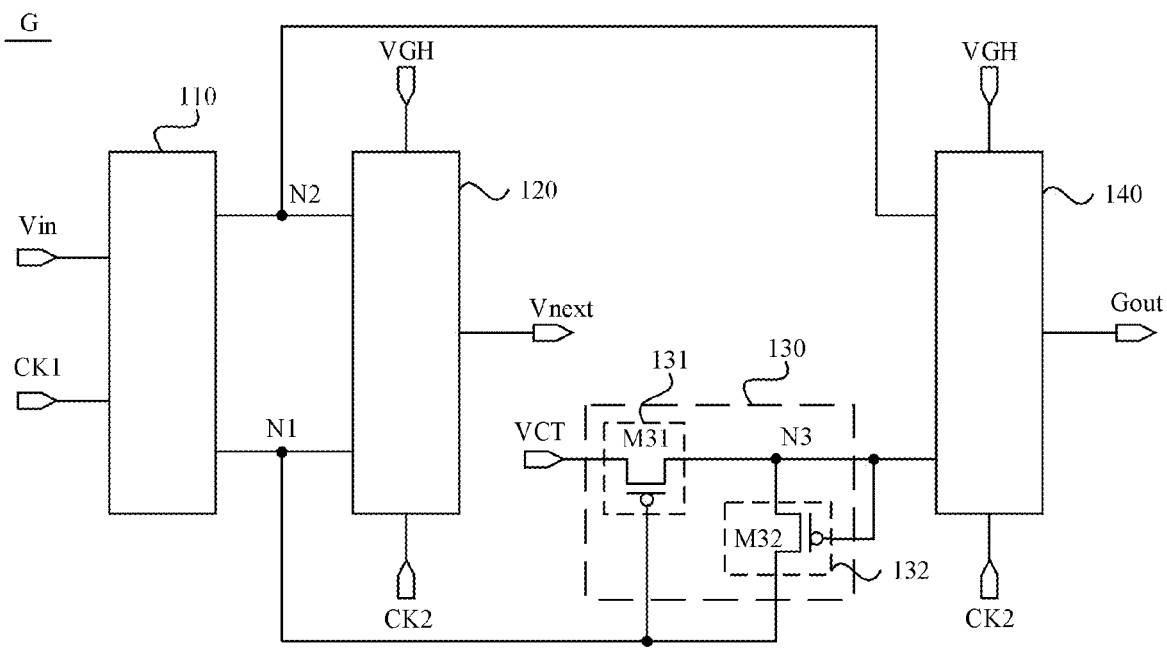
FIG. 11 is another schematic structural diagram of a shift register unit according to an embodiment of the present disclosure.
Figure 12:
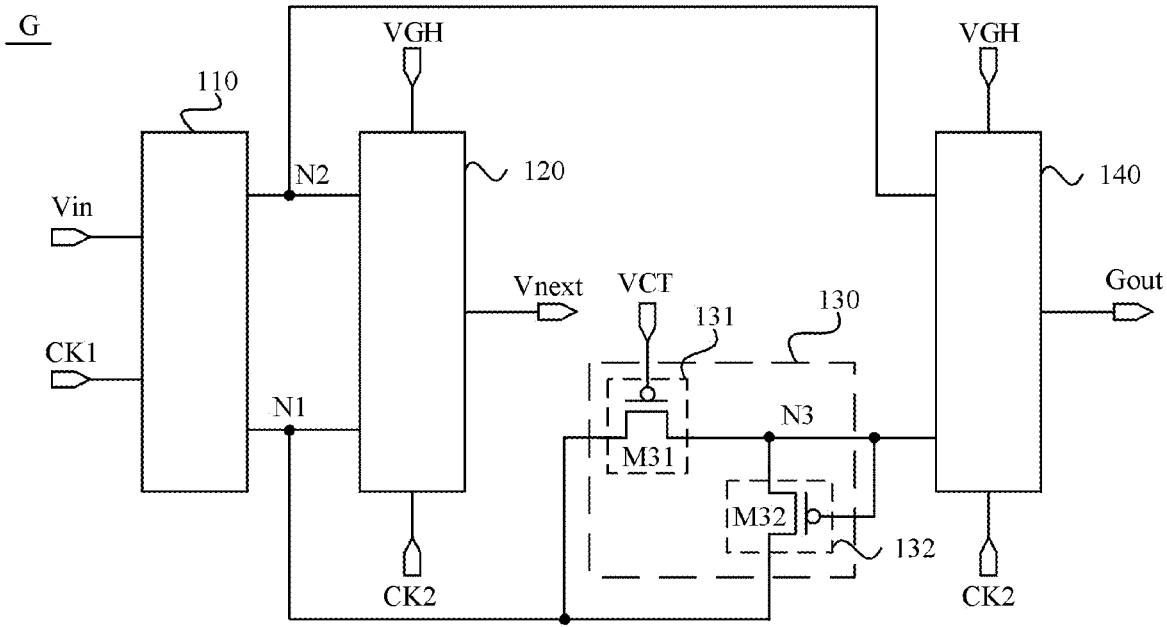
FIG. 12 is another schematic structural diagram of a shift register unit according to an embodiment of the present disclosure.

In one or more embodiment, FIG. 11 is a schematic structural diagram of a shift register unit according to an embodiment of the present disclosure, and FIG. 12 is a schematic structural diagram of a shift register unit according to an embodiment of the present disclosure. Referring to FIG. 11 or FIG. 12, the first drive control submodule 131 includes a first drive control transistor M31. One of a gate of the first drive control transistor M31 and a first electrode of the first drive control transistor M31 is electrically connected to the first initial node N1, the other of the gate of the first drive control transistor M31 and the first electrode of the first drive control transistor M31 receives the drive control signal VCT, and a second electrode of the first drive control transistor M31 is electrically connected to the first drive node N3.

In one or more embodiments, as shown in FIG. 11, the gate of the first drive control transistor M31 is electrically connected to the first initial node N1, and the first electrode of the first drive control transistor M31 receives the drive control signal VCT. In this case, when the signal of the first initial node N1 is at an enable level, the first drive control transistor M31 is turned on, and the drive control signal VCT may be transmitted to the first drive node N3. Therefore, in a case where the signal of the enable level needs to be written to the first drive node N3, the drive control signal VCT may be controlled to be at the enable level when the signal of the first initial node N1 is at an enable level. The enable level of the drive control signal VCT is written into the first drive node N3 through the turned-on first drive control transistor M31, so that the signal of the first drive node N3 at the enable level is able to control the duration for which the drive output module 140 outputs the enable level of the gate drive signal. On the contrary, in a case where there is no need to provide a signal of the enable level to the first drive node N3, the drive control signal VCT may be controlled to be at the non-enable level when the signal of the first initial node N1 is at a non-enable level. The non-enable level of the drive control signal VCT is written into the first drive node N3 through the first drive control transistor M31, so that the first drive node N3 keeps the non-enable level signal, and this case, the drive output module 140 outputs the non-enable level of the gate drive signal. In this way, when the signal of the first initial node N1 is at the non-enable level, the polarity of the gate drive signal output from the drive output module 140 can be controlled by controlling the duration for which the drive control signal VCT is kept at the non-enable level.

In one or more embodiments, as shown in FIG. 12, the first electrode of the first drive control transistor M31 is electrically connected to the first initial node N1, and the gate of the first drive control transistor M31 receives the drive control signal VCT. In this case, the first drive control transistor M31 may be controlled to be turned on when the drive control signal VCT is at an enable level, so that the signal of the first initial node N1 is able to be written to the first drive node N3, that is, the signal of the first drive node N3 is able to be kept to be consistent with the signal of the first initial node N1. Thus, when the signal of the first initial node N1 is at an enable level, the signal of the first drive node N3 is also at an enable level, and when the signal of the first initial node N1 is at a non-enable level, the signal of the first drive node N3 is also at a non-enable level, so that the gate drive signal output by the drive output module 140 is able to be kept to be consistent with the initial output signal output by the initial output module 120. On the contrary, when the drive control signal VCT is at a non-enable level, the first drive control transistor M31 is kept to be turned off, so that the signal of the first initial node N1 cannot be transmitted to the first drive node N3, that is, the signal of the first drive node N3 may be different from the signal of the first initial node N1, whereby the gate drive signal output by the drive output module 140 may be different from the initial output signal output by the initial output module 120. In this way, the polarity of the gate drive signal output by the drive output module 140 can be controlled by controlling the duration for which the drive control signal VTC is kept at the non-enable level.

It should be understood that, in the embodiment of the present disclosure, one of the enable level or the non-enable level is the high level, and the other of the enable level or the non-enable level is the low level. For example, in a case where the first drive control transistor M31 is an NMOS, an enable level at which the first drive control transistor M31 is controlled to be turned on is the high level, and a non-enable level at which the first drive control transistor M31 is controlled to be turned off is the low level. In a case where the first drive control transistor M31 is a PMOS, an enable level at which the first drive control transistor M31 is controlled to be turned on is the low level, and a non-enable level at which the first drive control transistor M31 is controlled to be turned off is the high level. Therefore, the level of the enable level and the non-enable level involved in the embodiment of the present disclosure is related to the type of the controlled transistor, which is not specifically limited in the embodiment of the present disclosure. For ease of description, the technical solutions in the embodiment of the present disclosure are exemplarily described by using an example in which each of the transistors mentioned in the embodiment of the present disclosure is PMOS.

In one or more embodiment, referring to FIG. 10, the drive control module 130 further includes a second drive control submodule 132. The second drive control submodule 132 is configured to receive at least the signal of the first initial node N1 and control a duration for which the signal of the first drive node N3 is kept at the non-enable level.

In one or more embodiment, the second drive control submodule 132 may be electrically connected to the first initial node N1 and the first drive node N3, to receive the signal of the first initial node N1, and may control, according to the signal of the first initial node N1, the duration for which the signal of the first drive node N3 is at a non-enable level. For example, when the signal of the first initial node N1 is at a non-enable level, the signal of the first drive node N3 may be correspondingly controlled to be at a non-enable level, thereby achieving control of the duration for which the signal of the first drive node N3 is kept at the non-enable level.

In one or more embodiment, referring to FIG. 11 or FIG. 12, the second drive control submodule 132 includes a second drive control transistor M32. Both a gate of the second drive control transistor M32 and a first electrode of the second drive control transistor M32 are electrically connected to the first drive node N3, and a second electrode of the second drive control transistor M32 is electrically connected to the first initial node N1.

In some embodiments, when the second drive control transistor M32 is a PMOS, the first electrode of the second drive control transistor M32 may be a drain of the second drive control transistor M32, and the second electrode of the second drive control transistor M32 may be a source of the second drive control transistor M32. In this case, the drain of the second drive control transistor M32 is electrically connected to the gate of the second drive control transistor M32, so that the second drive control transistor M32 is equivalent to a diode. An anode of the diode is the source of the second drive control transistor M32, and a cathode of the diode is the drain of the second drive control transistor M32 and the gate of the second drive control transistor M32. When a voltage at the first initial node N1 electrically connected to the source of the second drive control transistor M32 is greater than a voltage at the first drive node N3 electrically connected to the gate of the second drive control transistor M32 and the drain of the second drive control transistor M32, and a difference between the voltage at the first initial node N1 and the voltage at the first drive node N3 is greater than or equal to a threshold voltage Vth of the second drive control transistor M32, the second control transistor M32 may be in an on state, so that the signal of the first initial node N1 is able to be transmitted to the first drive node N3. On the contrary, when the voltage at the first initial node N1 is less than the voltage at the first drive node N3, the second drive control transistor M32 is turned off, so that the signal of the first initial node N1 cannot be transmitted to the first drive node N3 through the second drive control transistor M32, and in this case, the signal of the first drive node N3 is controlled by the first drive control submodule 131. In this way, if the enable level of the signal of the first drive node N3 is the low level and the non-enable level of the signal of the first drive node N3 is the high level, when the signal of the first initial node N1 changes to be at a non-enable high level, the non-enable high level may be transmitted to the first drive node N3 through the second drive control transistor M32, so that the signal of the first drive node N3 also changes to be at the non-enable high level, thereby achieving control of the duration for which the first drive node N3 is kept at the non-enable level.

In one or more embodiments, an example in which each of the first drive control transistor M31 and the second drive control transistor M32 is a P-type transistor is used for exemplary description, each of the first electrode of the first drive control transistor M31 and the first electrode of the second drive control transistor M32 is disposed to be a drain, and each of the second electrode of the first drive control transistor M31 and the second electrode of the second drive control transistor M32 is disposed to be a source. In this case, an enable level at which the first drive control transistor M31 and the second drive control transistor M32 are controlled to be turned on is the low level, and a non-enable level at which the first drive control transistor M31 and the second drive control transistor M32 are controlled to be turned off is the high level.

Figure 13:
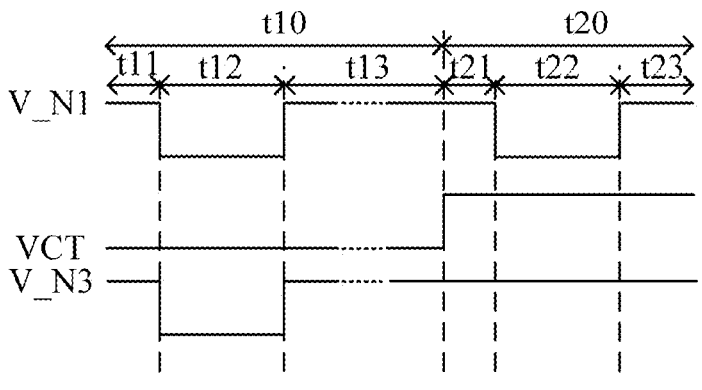
FIG. 13 is a drive timing diagram of a shift register unit according to an embodiment of the present disclosure.

In one or more embodiments, FIG. 13 is a drive timing diagram of a shift register unit according to an embodiment of the present disclosure. When the gate of the first drive control transistor M31 is electrically connected to the first initial node N1, and the first electrode of the first drive control transistor M31 receives the drive control signal VCT, with reference to FIG. 11 and FIG. 13, in a t10 time period, the drive control signal VCT is at the low level. In this case, in a t11 time period in which a signal V_N1 of the first initial node N1 is at the high level, the signal V_N1 of the first initial node N1 controls the first drive control transistor M31 to be in the off state, the low level of the drive control signal VCT cannot be transmitted to the first drive node N3, and the second drive control transistor M32 is in the on state under the control of the voltage between the signal V_N1 of the first initial node N1 and the signal V_N3 of the first drive node N3, so that the signal V_N3 of the first drive node N3 is able to be kept to be consistent with the signal V_N1 of the first initial node N1, that is, the signal V_N3 of the first drive node N3 is at the high level. In a t12 time period in which the signal V_N1 of the first initial node N1 is at the low level, the signal V_N1 of the first initial node N1 may control the first drive control transistor M31 to be in an on state and control the second drive control transistor M32 to be turned off, so that the drive control signal VCT at the low level may be transmitted to the first drive node N3 through the first drive control transistor M31, and the signal V_N3 of the first drive node N3 becomes to be at the low level. In a t13 time period in which the signal V_N1 of the first initial node N1 changes to be at the high level again, the first drive control transistor M31 changes from the on state to the off state, and the second drive control transistor M32 is turned on again, so that the signal V_N1 of the first initial node N1 is transmitted to the first drive node N3 through the second drive control transistor M32, and the signal V_N3 of the first drive node N3 is also able to change to be at the high level accordingly.

In a t20 time period, the drive control signal VCT is at the high level. In this case, in a t21 time period in which the signal V_N1 of the first initial node N1 is at the high level, the first drive control transistor M31 is turned off, and the second drive control transistor M32 is turned on, so that the signal V_N3 of the first drive node N3 is able to be kept to be consistent with the signal V_N1 of the first initial node N1, that is, the signal V_N3 of the first drive node N3 is at the high level. In a t22 time period in which the signal V_N1 of the first initial node N1 is at the low-level, the first drive control transistor M31 is turned on, and the second drive control transistor M32 is turned off, so that the drive control signal VCT at the high level is able to be transmitted to the first drive node N3 through the first drive control transistor M31, so that the signal V_N3 of the first drive node N3 continues to be kept at the high level. In a t23 time period in which the signal V_N1 of the first initial node N1 changes to be at the high level, the first drive control transistor M31 changes from the on state to the off state, the second drive control transistor M32 is turned on again, so that the signal V_N1 of the first initial node N1 is transmitted to the first drive node N3 through the second drive control transistor M32, and the signal V_N3 of the first drive node N3 is also able to be kept at the high level.

In this way, in a time period in which the drive control signal VCT is at the low level, the signal V_N3 of the first drive node N3 may be kept to be consistent with the signal V_N1 of the first initial node N1, so that the initial output signal Vnext output by the initial output module 120 is able to be kept to be consistent with the gate drive signal Gout output by the drive output module 140. In a time period in which the drive control signal VCT is at the high level, no matter how the signal V_N1 of the first initial node N1 changes, the signal V_N3 of the first drive node N3 is kept to be the high-level signal, so that the initial output signal Vnext output by the initial output module 120 is able to be different from the gate drive signal Gout output by the drive output module 140.

In one or more embodiments, when the gate of the first drive control transistor M31 receives the drive control signal VCT, and the first electrode of the first drive control transistor M31 is electrically connected to the first initial node N1, with reference to FIG. 12 and FIG. 13, in the t10 time period in which the drive control signal VCT is at the low level, the first drive control transistor M31 is in an on state, so that when the signal V_N1 of the first initial node N1 is at the high level, that is, in the t11 time period and the t13 time period, the signal V_N3 of the first drive node N3 is kept at the high level, and when the signal V_N1 of the first initial node N1 is at the low level, that is, in the time period t12, the signal V_N3 of the first drive node N3 is also at the low level. In this way, in a time period in which the drive control signal VCT is at the low level, the signal V_N3 of the first drive node N3 is able to be kept to be consistent with the signal V_N1 of the first initial node N1. In the t20 time period in which the drive control signal VCT is at the high level, the first drive control transistor M31 is turned off. When the signal V_N1 of the first initial node N1 is at a high level, that is, in the t21 time period and the t23 time period, the second drive control transistor M32 is turned on, so that the signal V_N3 of the first drive node N3 is able to be kept to be consistent with the signal V_N1 of the first initial node N1, that is, the signal V_N3 of the first drive node N3 is at the high level. When the signal V_N1 of the first initial node N1 is at the low level, that is, in the t22 time period, the second drive control transistor M32 is turned off, and the signal V_N3 of the first drive node N3 continues to be kept at the high level in the previous phase. In this way, in a time period in which the drive control signal VCT is at the high level, no matter how the signal V_N1 of the first initial node N1 changes, the signal V_N3 of the first drive node N3 is kept at the high level.

Figure 14:
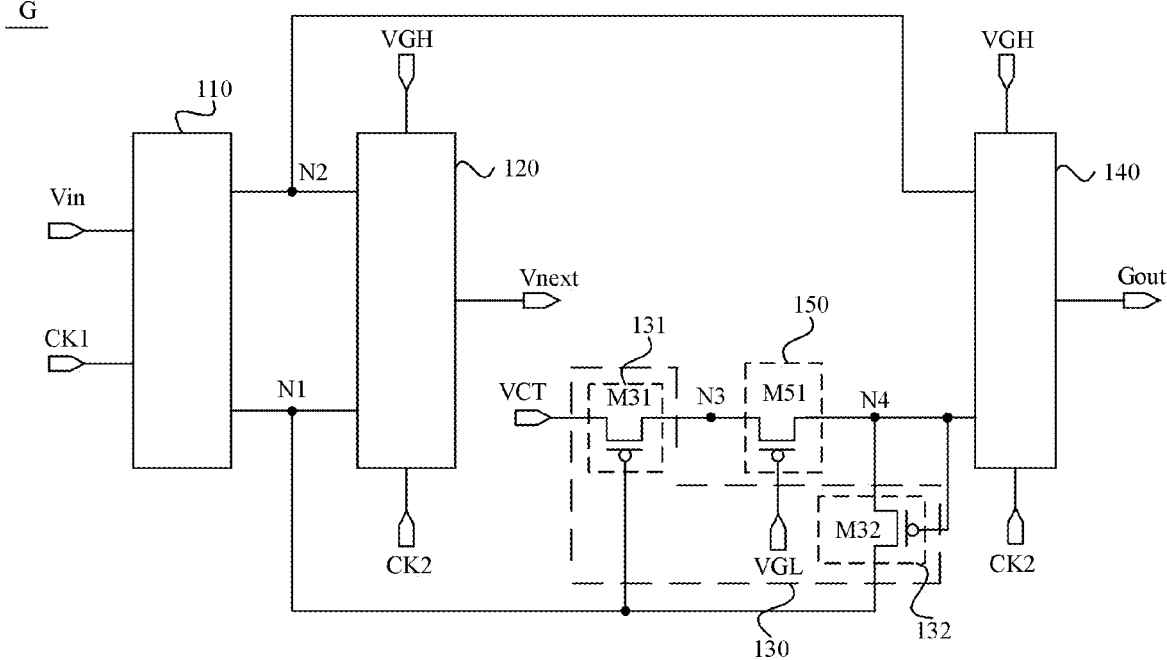
FIG. 14 is another schematic structural diagram of a shift register unit according to an embodiment of the present disclosure.

On the basis of the above-described embodiments, in one or more embodiments, FIG. 14 is another schematic structural diagram of a shift register unit according to an embodiment of the present disclosure. As shown in FIG. 14, the shift register unit G may further be disposed to include a first voltage regulation module 150, the first drive control submodule 131 and the first voltage regulation module 150 may be disposed to be electrically connected to the first drive node N3, and the first voltage regulation module 150 and the drive output module 140 are electrically connected to the second drive node N4, that is, the signal of the first drive node N3 is transmitted to the second drive node N4 through the first voltage regulation module 150. The first voltage regulation module 133 may isolate the second drive node N4 from the first drive node N3, to ensure that a signal of the second drive node N4 and the signal of the first drive node N3 are relatively stable, and prevent the accuracy of the gate drive signal Gout output by the drive output module 140 from being affected by the signal fluctuation of the second drive node N4 and/or the signal fluctuation of the first drive node N3, thereby improving the operation stability of the shift register unit G and the display effect of the display panel.

In one or more embodiment, referring to FIG. 14, the first voltage regulation module 133 includes a first voltage regulation transistor M51. A gate of the first voltage regulation transistor M51 receives a second level signal VGL, a first electrode of the first voltage regulation transistor M51 is electrically connected to the first drive node N3, and a second electrode of the first voltage regulation transistor M51 is electrically connected to the second drive node N4.

In an example, the second level signal VGL may control the first voltage regulation transistor M51 to keep the on state continuously, so that the signal of the second drive node N4 is basically kept to be consistent with the signal of the first drive node N3. In addition, since the first voltage regulation transistor M51 that is turned on has a certain resistance, when the signal of the second drive node N4 electrically connected to the drive output module 140 changes, the first voltage regulation transistor M51 is able to reduce a change amount that the signal of the first drive node N3 changes with the signal of the second drive node N4. Similarly, when the signal of the first drive node N3 changes, the first regulator transistor M51 may also reduce a change amount of the signal of the second drive node N4 that changes with the signal of the first drive node N3. In this way, the first voltage regulation transistor M51 is disposed between the second drive node N4 and the first drive node N3, so that the stability of the signal at the second drive node N4 and the signal at the first drive node N3 can be ensured, thereby improving the stability of the gate drive signal Gout output by the drive output module 140.

In one or more embodiments, with continued reference to FIG. 14, when the shift register unit G includes the first voltage regulation module 150, both the gate of the second drive control transistor M32 and the second electrode of the second drive control transistor M32 may be electrically connected to the second drive node N4, and the second drive node N4 is electrically connected to the first drive node N3 through the first voltage regulation module 150. In this way, the second drive control transistor M32 may indirectly control the signal of the first drive node N3 by controlling the signal of the second drive node N4, thereby ensuring the stability of the signal of the second drive node N4 and the signal of the first drive node N3, and thus improving the stability of the gate drive signal Gout output by the drive output module 140.

Figure 15:
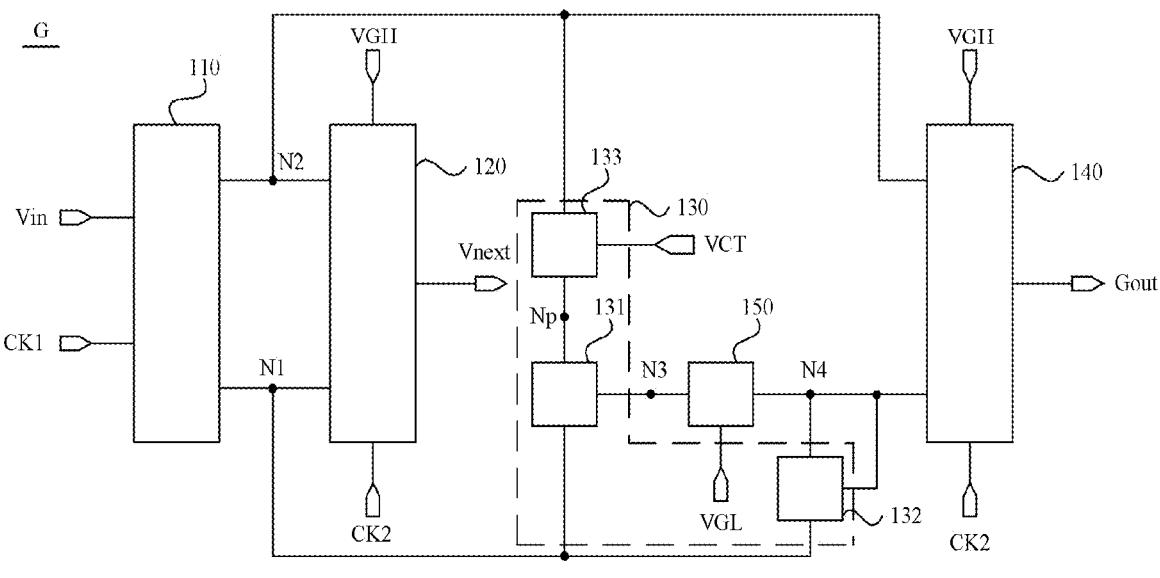
FIG. 15 is a schematic structural diagram of a shift register unit according to an embodiment of the present disclosure.

On the basis of the above-described embodiments, in one or more embodiments, FIG. 15 is another schematic structural diagram of a shift register unit according to an embodiment of the present disclosure. As shown in FIG. 15, the drive control module 130 further includes a third drive control submodule 133. The third drive control submodule 133 is electrically connected between the first drive control submodule 131 and a signal terminal of the drive control signal VCT. The third drive control submodule 133 is configured to receive at least the drive control signal VCT and the signal of the second initial node N2 and control, according to the signal of the second initial node N2, a transmission path for transmitting the drive control signal VCT to the first drive control submodule 131.

In an example, the third drive control submodule 133 may be electrically connected to the second initial node N2, the first drive control submodule 131, and the signal terminal of the drive control signal, and the third drive control submodule 133 may be electrically connected to the first drive control submodule 131 at a node Np, so that the second initial node N2 is able to control the third drive control submodule 133 to be turned on or off and control a signal of the node Np. For example, when the signal of the second initial node N2 is at the enable level, the third drive control submodule 133 is turned on, and the drive control signal VCT may be transmitted to the node Np through the third drive control submodule 133. When the signal of the second initial node N2 is at the non-enable level, the third drive control submodule 133 is turned off, and the drive control signal VCT cannot be transmitted to the node Np. Since no new signal is written at the node Np, the node Np remains the drive control signal VCT written in the previous phase. In this way, the turned on or off of the third drive control submodule 133 can be controlled through the signal of the second initial node N2, thereby implementing the transmission path for transmitting the drive control signal VCT to the first drive control submodule 131.

Correspondingly, a polarity of the signal of the first initial node N1 is opposite to a polarity of the signal of the second initial node N2 in at least part of the time period, that is, when the signal of the second initial node N2 is at the enable level, the signal of the first initial node N1 is at the non-enable level, and when the signal of the second initial node N2 is at the non-enable level, the signal of the first initial node N1 is at the enable level. In this way, if the signal of the second initial node N2 at the enable level controls the third drive control submodule 133 to be turned on, the drive control signal VCT may be provided to the node Np, and in this case, the first initial node N1 is at the non-enable level, so that the signal of the second drive node N3 is also kept at the non-enable level. On the contrary, if the non-enable level signal of the second initial node N2 controls the third drive control submodule 133 to be turned off, the third drive control submodule 133 no longer provides the drive control signal VCT to the first drive control submodule 131, and in this case, the node Np keeps the drive control signal VCT written in the previous phase, the first initial node N1 is at the enable level, and the first drive control submodule 131 controls the signal of the first drive node N3 under the control of the enable level of the first initial node N1 and the drive control signal VCT, so that the signal of the first drive node N3 is kept to be consistent with the drive control signal VCT.

The third drive control submodule 133 is disposed between the signal terminal of the drive control signal and the first drive control submodule 131, so that the drive control signal VCT and the first drive control submodule 131 are isolated from each other. When the drive control signal VCT hops, the signal of the first initial node N1 and the signal of the first drive node N3 that are directly electrically connected to the first drive control submodule 131 are not directly affected, thereby ensuring the accuracy of the initial output signal Vnext output by the initial output module 120 and the accuracy of the gate drive signal Gout output by the drive output module 140, and improving the drive capability of the driver circuit and the display effect of the display panel.

Figure 16:
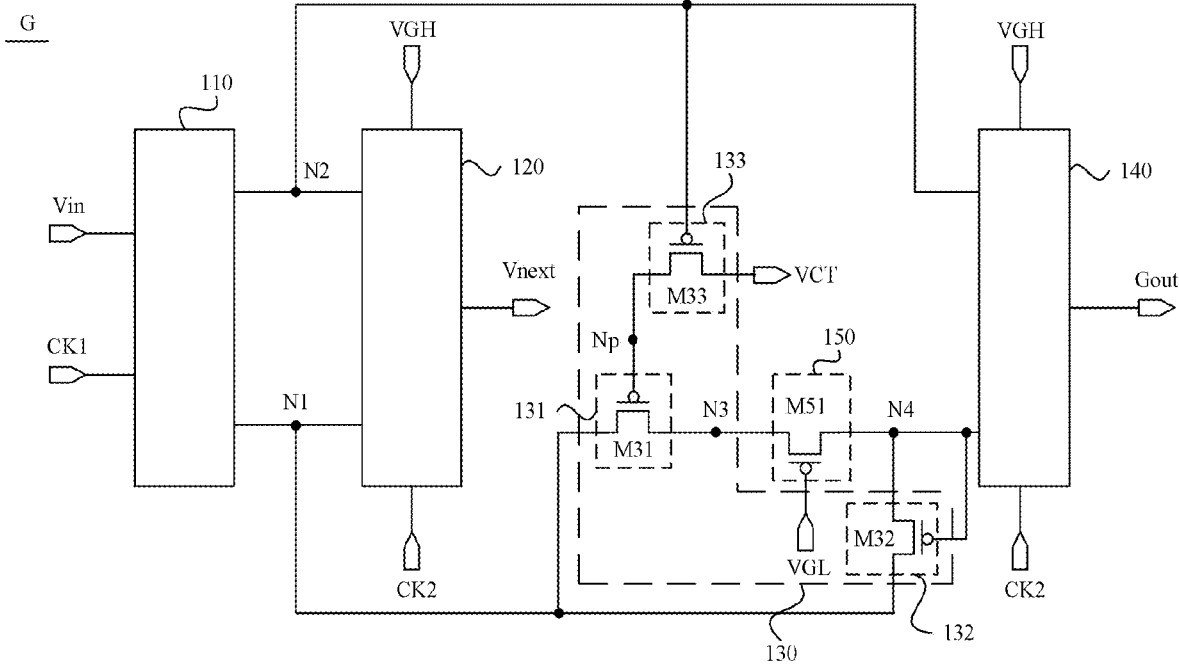
FIG. 16 is another schematic structural diagram of a shift register unit according to an embodiment of the present disclosure.

In one or more embodiment, FIG. 16 is another schematic structural diagram of a shift register unit according to an embodiment of the present disclosure. As shown in FIG. 16, the third drive control submodule 133 includes a third drive control transistor M33. A gate of the third drive control transistor M33 is electrically connected to the second initial node N2, a first electrode of the third drive control transistor M33 is electrically connected to a signal terminal of the drive control signal VCT, and a second electrode of the third drive control transistor M33 is electrically connected to the first drive control submodule 131. In this way, the signal of the second initial node N2 may control the third drive control transistor M33 to be turned on or off, that is, when the signal of the second initial node N2 is at the enable level, the third drive control transistor M33 is turned on, and the signal of the drive control signal VCT may be transmitted to the node Np through the third drive control transistor M33 that is turned on, that is, the signal of the drive control signal VCT may be provided to the first drive control submodule 131. When the signal of the second initial node N2 is at the non-enable level, the third drive control transistor M33 is turned off, and the signal of the drive control signal VCT cannot be transmitted to the node Np, that is, the signal of the drive control signal VCT cannot be provided to the first drive control submodule 131.

Figures 17, 18:
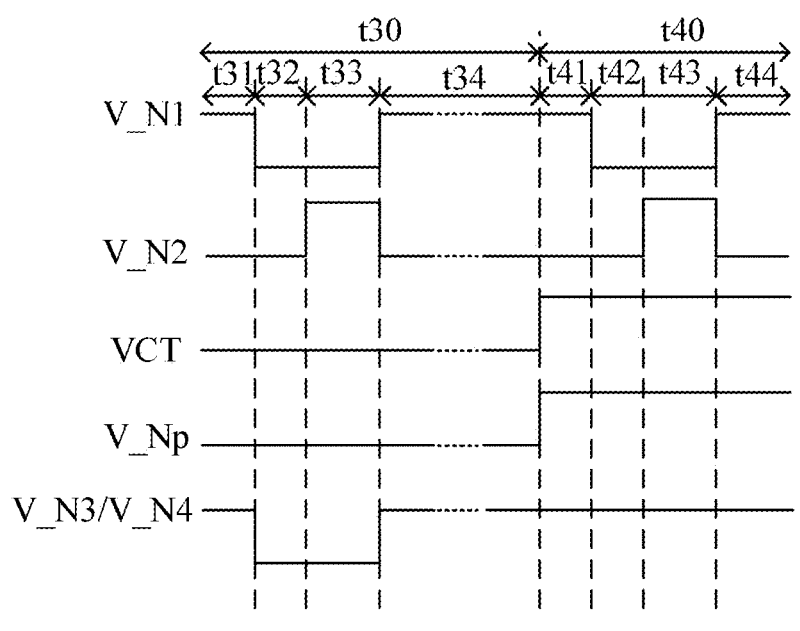
FIG. 17 is another drive timing diagram of a shift register unit according to an embodiment of the present disclosure.
FIG. 18 is another schematic structural diagram of a shift register unit according to an embodiment of the present disclosure.

In one or more embodiments, FIG. 17 is another drive timing diagram of a shift register unit according to an embodiment of the present disclosure. When the gate of the first drive control transistor M31 is electrically connected to the second electrode of the third drive control transistor M33, and each of the first drive control transistor M31, the second drive control transistor M32, and the third drive control transistor M33 is a P-type transistor, with reference to FIG. 16 and FIG. 17, in a t30 stage, the drive control signal VCT is at the low level, in this case, the signal V_N2 at the second initial node N2 is at the low level in a t31 time period, a t32 time period and a t34 time period, the third drive control transistor M33 is controlled to be in the on state, so that the signal of the node Np is kept to be consistent with the drive control signal VCT, that is, is kept at the low level, then the first drive control transistor M31 is in the on state during the t31 time period, the t32 time period and the t34 time period. In this process, in the t31 time period and the t34 time period in which the signal V_N1 of the first initial node N1 is at the high level, a high-level signal of the first initial node V_N1 is transmitted to the first drive node N3 through the first drive control transistor M31, and then to the second drive node N4 through the first voltage regulation transistor M51 which is turned on, so that the signal V_N3 of the first drive node N3 and the signal V_N4 of the second drive node N4 are at the high level. In the t32 time period, a low-level signal of the first initial node V_N1 is transmitted to the first drive node N3, and then to the second drive node N4 through the first voltage regulation transistor M51 that is turned on, so that the signal V_N3 of the first drive node N3 and the signal V_N4 of the second drive node N4 are at the low level, that is, the signal V_N3 of the first drive node N3 and the signal V_N4 of the second drive node N4 are kept to be consistent with the signal of the first initial node V_N1. In the t33 time period, the signal V_N2 of the second initial node N2 is at the high level, the third drive control transistor M33 is controlled to be in the off state, the drive control signal VCT cannot be transmitted to the node Np, no new signal is written at the node Np, so that the node Np is kept at the low level written in the previous phase, then the first drive control transistor M31 is kept to be the on state, so that the signal V_N3 of the first drive node N3 and the signal V_N4 of the second drive node N4 are still kept to be consistent with the signal of the first initial node V_N1, which are low-level signals.

In a t40 time period, the drive control signal VCT is at the high level, and in this case, the signal V_N2 of the second initial node N2 is at the low level in a t41 time period and a t42 time period, and the third drive control transistor M33 is controlled to be in the on state, then the signal V_N4 of the node Np and the drive control signal is kept to be consistent, that is, is kept at the high level. In the t41 time period and the t42 time period, the first drive control transistor M31 is in the off state, in this process, the signal V_N1 of the first initial node N1 is at the high level in the t41 time period, and the second drive control transistor M32 is controlled to be turned on, so that the signal V_N4 of the second drive node N4 is kept to be consistent with the signal V_N1 of the first initial node N1, that is, the signal V_N4 of the second drive node N4 is at the high level. In the t42 time period, the signal V_N1 of the first initial node N1 is at the low level, the second drive transistor M32 is controlled to be turned off, no new signal is written in the second drive node N4, and the second drive node N4 is kept at the high level of the previous phase. In a t43 time period, the signal V_N2 of the second initial node N2 is at the high level, the third drive control transistor M33 is controlled to be in the off state, no new signal is written at the node NP, and the node NP is kept at the high level of the previous phase, the first drive control transistor M31 is in the off state, in this case, the low-level signal of the first initial node N1 controls the second drive control transistor M32 to be turned off, and no new signal is written in the second drive node N4, and the second drive node N4 is still kept at the high level in the previous phase. In a t44 time period, the signal V_N2 of the second initial node N2 is at the low level, the third drive control transistor M33 is controlled to be turned on, the high level of the drive control signal VCT is transmitted to the node NP through the third drive control transistor M33, and the first drive control transistor M31 is controlled to be in the on state, the high-level signal of the first initial node N1 is transmitted to the first drive node N3, and then to the second drive node N4 through the first voltage regulation transistor M51 that is turned on, so that the signal V_N3 of the first drive node N3 and the signal V_N4 of the second drive node N4 are at the high level.

In this case, in a time period in which the drive control signal VCT is at the low level, the signal V_N3 of the first drive node N3 and the signal V_N4 of the second drive node N4 may be kept to be consistent with the signal V_N1 of the first initial node N1, so that the initial output signal Vnext output by the initial output module 120 is able to be kept to be consistent with the gate drive signal Gout output by the drive output module 140. In a time period in which the drive control signal VCT is at the high level, no matter how the signal V_N1 of the first initial node N1 changes, both the signal V_N3 of the first drive node N3 and the signal V_N4 of the second drive node N4 are both kept as the high-level signal, so that the initial output signal Vnext output by the initial output module 120 is able to be different from the gate drive signal Gout output by the drive output module 140.

On the basis of the above-described embodiments, FIG. 18 is another schematic structural diagram of a shift register unit according to an embodiment of the present disclosure. As shown in FIG. 18, the drive control module 130 further includes a fourth drive control submodule 134. The fourth drive control submodule 134 is configured to receive at least the signal of the second initial node N2, the first level signal VGH and the second clock signal CK2 and control a duration for which the signal of the first drive node N3 is kept at the non-enable level.

In an example, the fourth drive control submodule 134 may be electrically connected to the second initial node N2, the first level signal terminal, the second clock signal terminal, and the first drive node N3. In this case, the second initial node N2 and the second clock signal CK2 at the second clock signal terminal may control the fourth drive control submodule 134 to be turned on or off, to control the signal of the first drive node N3 through the first level signal VGH at the first level signal terminal. For example, when both the signal of the second initial node N2 and the second clock signal CK2 are at the enable level, the fourth drive control submodule 134 may be controlled to be turned on, so that the first level signal VGH is able to be transmitted to the first drive node N3, and the signal of the first drive node N3 is the non-enable level that is kept to be consistent with the first level signal VGH. On the contrary, when at least one of the signal of the second initial node N2 or the second clock signal CK2 is at the non-enable level, the first level signal VGH cannot be transmitted to the first drive node N3, so that the signal of the first drive node N3 is able to be controlled by the first drive control submodule 131, the first initial node N1, and the drive control signal VCT.

Figure 19:
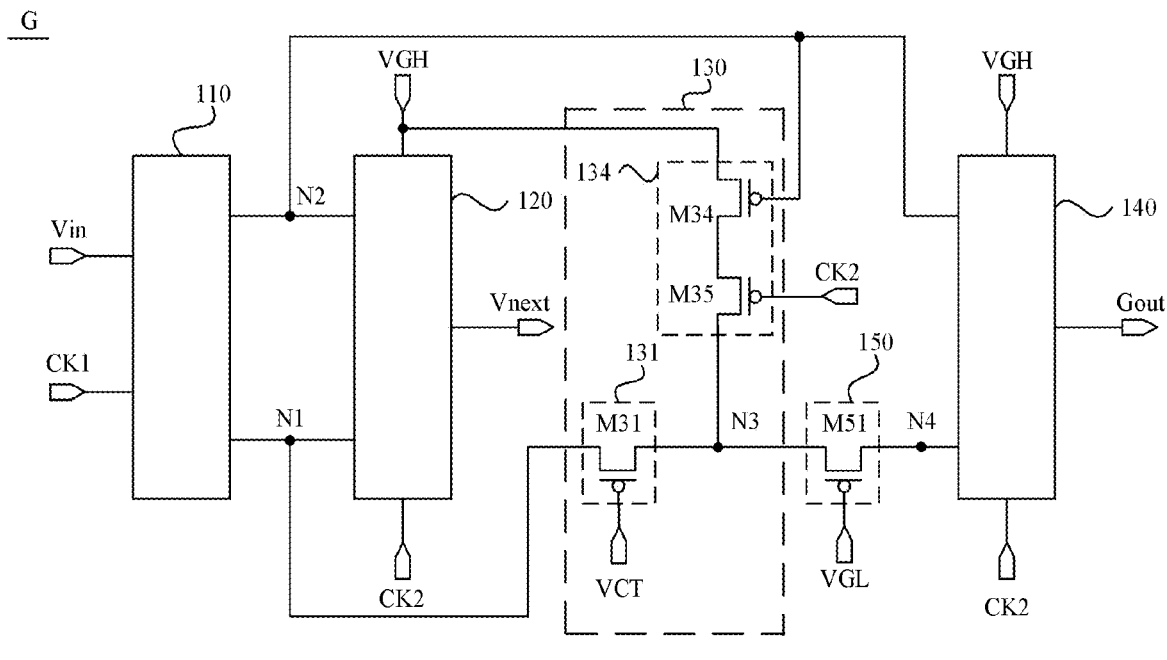
FIG. 19 is another schematic structural diagram of a shift register unit according to an embodiment of the present disclosure.
Figure 20:
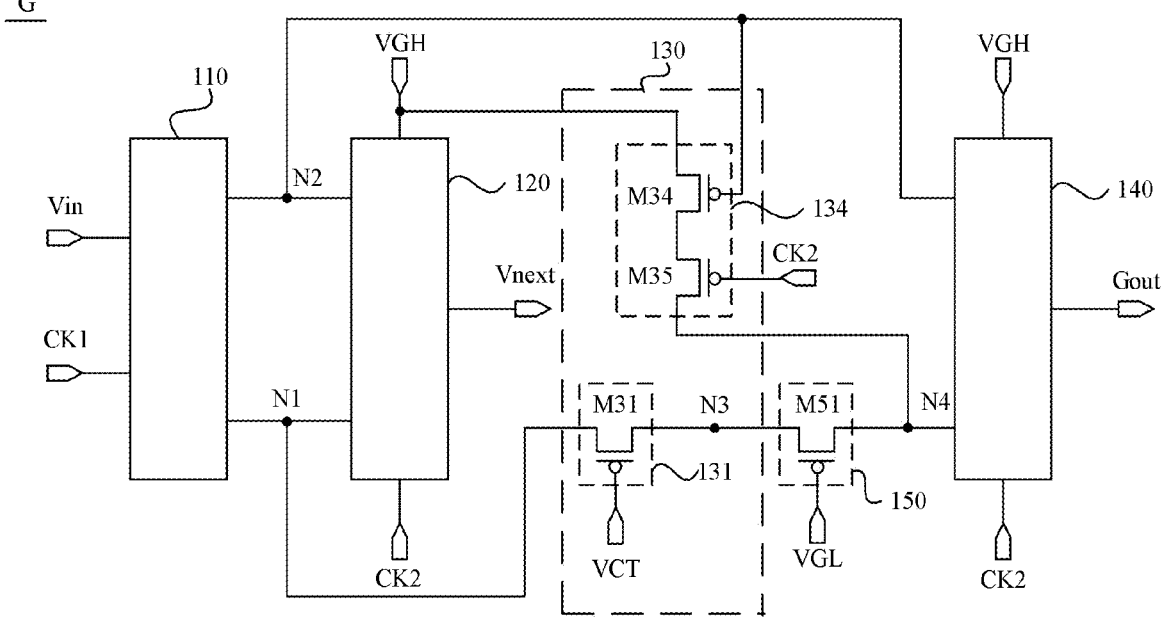
FIG. 20 is another schematic structural diagram of a shift register unit according to an embodiment of the present disclosure.

In one or more embodiment, FIG. 19 is another schematic structural diagram of a shift register unit according to an embodiment of the present disclosure, and FIG. 20 is another schematic structural diagram of a shift register unit according to an embodiment of the present disclosure. As shown in FIG. 19 or FIG. 20, the fourth drive control submodule 134 includes a fourth drive control transistor M34 and a fifth drive control transistor M35. A gate of the fourth drive control transistor M34 is electrically connected to the second initial node N2, a first electrode of the fourth drive control transistor M34 receives the first level signal VGH, and a second electrode of the fourth drive control transistor M34 is electrically connected to a first electrode of the fifth drive control transistor M35. A gate of the fifth drive control transistor M35 receives the second clock signal CK2, and a second electrode of the fifth drive control transistor M35 is electrically connected to the first drive node N3, or a second electrode of the fifth drive control transistor M35 is electrically connected to the second drive node N4, and the second drive node N4 is electrically connected to the first drive node N3 through the first voltage regulation module 150.

Exemplarily, as shown in FIG. 19, the signal of the second initial node N2 may control the fourth drive control transistor M34 to be turned on or off, and the second clock signal CK2 may control the fifth drive control transistor M35 to be turned on or off. In this case, when both the signal of the second initial node N2 and the second clock signal CK2 are at the enable level, both the fourth drive control transistor M34 and the fifth drive control transistor M35 are in the on state. In this case, the first level signal VGH may be sequentially transmitted to the first drive node N3 through the fourth drive control transistor M34 and the fifth drive control transistor M35 that are turned on. When the signal of the second initial node N2 is at the enable level and the second clock signal CK2 is at the non-enable level, the fourth drive control transistor M34 is turned on, and the fifth drive control transistor M35 is turned off, so that the first level signal VGH may only be transmitted to the first electrode of the fifth drive control transistor M35, but cannot be transmitted to the first drive node N3. When the signal of the second initial node N2 is at the non-enable level, and the second clock signal CK2 is also at the non-enable level, both the fourth drive control transistor M34 and the fifth drive control transistor M35 are turned off, and the first level signal VGH cannot be transmitted to the first drive node N3. In this way, the fourth drive control transistor M34 and the fifth drive control transistor M35 are simultaneously controlled to be turned on, thereby implementing the control of the duration for which the signal of the first drive node N3 is kept at the non-enable level.

In one or more embodiments, as shown in FIG. 20, when the second electrode of the fifth drive control transistor M35 is electrically connected to the first drive node N3 through the first voltage regulation module 150, the fourth drive control transistor M34 and the fifth drive control transistor M35 jointly determine the signal of the second drive node N4, and the signal of the second drive node N4 may be kept to be consistent with the first drive node N3 through the first voltage regulation module 150, thereby implementing the control of the duration for which the first drive node N3 is kept at the non-enable level.

Figure 21:
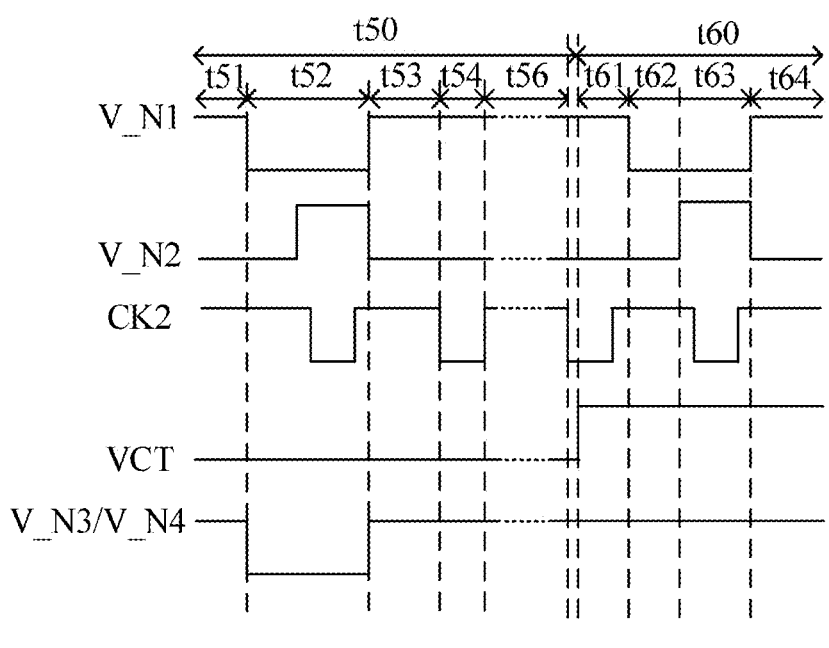
FIG. 21 is another drive timing diagram of a shift register unit according to an embodiment of the present disclosure.

In an exemplary embodiment, an example in which each of the first drive control transistor M31, the fourth drive control transistor M34, and the fifth drive control transistor M35 is a P-type transistor is used for exemplary description. FIG. 21 is another drive timing diagram of a shift register unit according to an embodiment of the present disclosure. With reference to FIG. 19 and FIG. 21, in a t50 time period, the drive control signal VCT is at the low level, and the first drive control transistor M31 is controlled to be in the on state. In this case, in a t51 time period, a t52 time period, a t53 time period and a t56 time period, the signal V_N2 of the second initial node N2 and the second clock signal CK2 are not at the low level at the same time, so that at least one of the fourth drive control transistor M34 or the fifth drive control transistor M35 is in the off state in the above-described time periods, the first level signal VGH cannot be transmitted to the first drive node N3, and the signal V_N3 of the first drive node N3 and the signal V_N4 of the second drive node N4 are kept to be consistent with the signal of the first initial node N1, that is, the signal V_N3 of the first drive node N3 and the signal V_N4 of the second drive node N4 are at the high level in the t51 time period, the t53 time period and the t56 time period and are at the low level in the t52 time period. In the t54 time period, both the signal V_N2 of the second initial node N2 and the second clock signal CK2 are at the low level, and both the fourth drive control transistor M34 and the fifth drive control transistor M35 are in the on state. In this case, the first level signal VGH is sequentially transmitted to the first drive node N3 through the fourth drive control transistor M34 and the fifth drive control transistor M35, and the high-level signal of the first initial node N1 is also transmitted to the first drive node N3 through the first drive control transistor M31 that is turned on, the signal V_N3 of the first drive node N3 is at the high level, the signal V_N3 of the first drive node N3 is transmitted to the second drive node N4 through the first voltage regulation transistor M51 that is turned on, and the signal V_N4 of the second drive node N4 is also at the high level.

In a t60 time period, the drive control signal VCT is at the high level, the first drive control transistor M31 is controlled to be in the off state, and the signal V_N1 of the first initial node N1 cannot be transmitted to the first drive node N3. In this case, in the t61 time period, both the signal V_N2 of the second initial node N2 and the second clock signal CK2 are at the low level, both the fourth drive control transistor M34 and the fifth drive control transistor M35 are in the on state, the first level signal VGH is sequentially transmitted to the first drive node N3 through the fourth drive control transistor M34 and the fifth drive control transistor M35, and the signal V_N3 of the first drive node N3 is at the high level.

In a t62 time period, a t63 time period, and a t64 time period, the signal V_N2 of the second initial node N2 and the second clock signal CK2 are not at the low level at the same time, so that at least one of the fourth drive control transistor M34 or the fifth drive control transistor M35 are in the off state in the above-described time periods, whereby the first drive node N3 cannot be transmitted to the first drive node N3, no new signal is written in the first drive node N3, and the first drive node N3 is kept at the high level in the previous time period.

In this way, in a time period in which the drive control signal VCT is at the low level, the signal V_N3 of the first drive node N3 and the signal V_N4 of the second drive node N4 is able to be kept to be consistent with the signal V_N1 of the first initial node N1, so that the initial output signal Vnext output by the initial output module 120 is able to be kept to be consistent with the gate drive signal Gout output by the drive output module 140. In a time period in which the drive control signal VCT is at the high level, no matter how the signal V_N1 of the first initial node N1 changes, both the signal V_N3 of the first drive node N3 and the signal V_N4 of the second drive node N4 are kept at the high-level signal, so that the initial output signal Vnext output by the initial output module 120 may be different from the gate drive signal Gout output by the drive output module 140.

Figure 22:
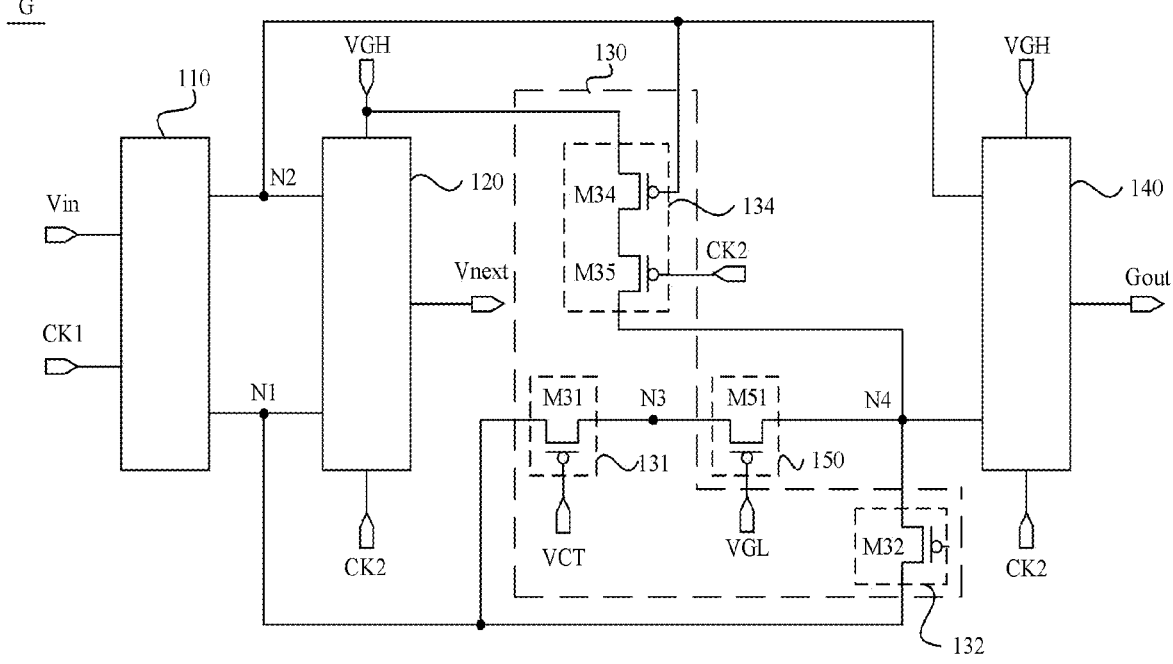
FIG. 22 is another schematic structural diagram of a shift register unit according to an embodiment of the present disclosure.
Figure 23:
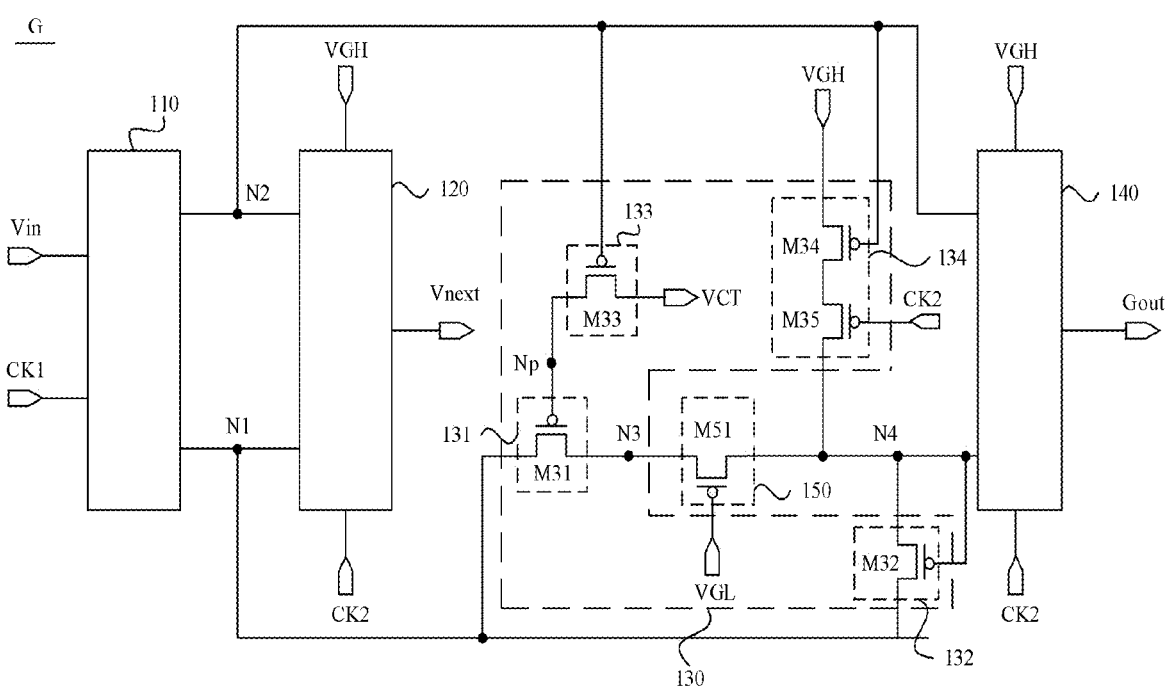
FIG. 23 is another schematic structural diagram of a shift register unit according to an embodiment of the present disclosure.

It should be understood that only a case that the drive control module 130 includes the first drive control submodule 131 and the fourth drive control module 134 is shown by way of example in FIG. 19 and FIG. 20. In the embodiment of the present disclosure, when the drive control module 130 includes the first drive control submodule 131, the drive control module 130 may further include at least two of the second drive control submodule 132, the third drive control submodule 133, and the fourth drive control submodule 134 (as shown in FIG. 22 and FIG. 23). On the premise that the signal of the first drive node N3 may be controlled by the drive control module 130, the specific structure of the drive control module 130 is not limited in the embodiment of the present disclosure. For ease of description, the technical solutions of the embodiment of the present disclosure are exemplarily described by using an example in which the drive control module includes both the first drive control submodule and the second drive control submodule.

Figure 24:
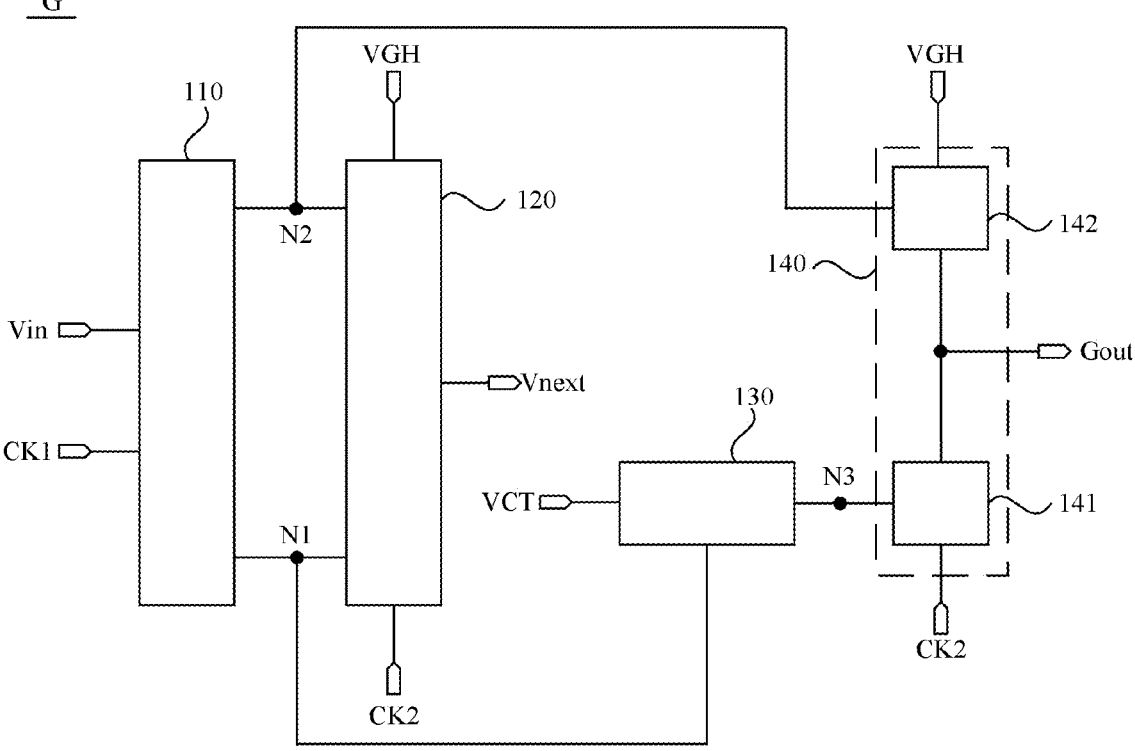
FIG. 24 is another schematic structural diagram of a shift register unit according to an embodiment of the present disclosure.

In one or more embodiment, FIG. 24 is another schematic structural diagram of a shift register unit according to an embodiment of the present disclosure. As shown in FIG. 24, the drive output module 140 includes a first drive output submodule 141 and a second drive output submodule 142. The first drive output submodule 141 is configured to receive the signal of the first drive node N3 and the second clock signal CK2 and control the gate drive signal Gout. The second drive output submodule 142 is configured to receive the signal of the second initial node N2 and the first level signal VGH and control the gate drive signal Gout.

In one or more embodiments, the first drive output submodule 141 may receive the signal of the first drive node N3 and the second clock signal CK2 and output the gate drive signal Gout under the control of the signal of the first drive node N3 and the second clock signal CK2. The second drive output submodule 142 may receive the signal of the second initial node N2 and the first level signal VGH and output the gate drive signal Gout under the control of the signal of the second initial node N2 and the first level signal VGH. In this way, the signal of the first drive node N3, the second clock signal CK2, the signal of the second initial node N2, and the first level signal VGH may determine the polarity and the amplitude of the gate drive signal Gout.

In one or more embodiments, when the signal of the first drive node N3 is at the enable level, the first drive output submodule 141 may control the gate drive signal Gout to be consistent with the second clock signal CK2; and when the signal of the second initial node N2 is at the enable level, the second drive output submodule 142 may control the gate drive signal Gout to be consistent with the first level signal VGH.

Figure 25:
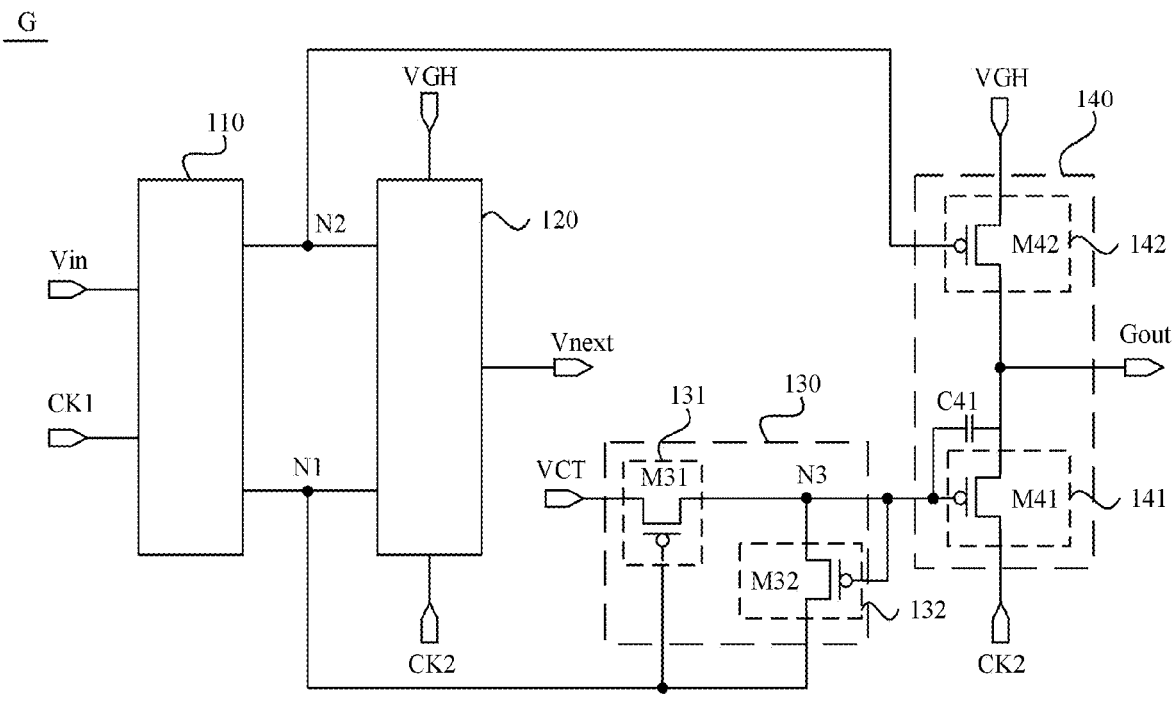
FIG. 25 is another schematic structural diagram of a shift register unit according to an embodiment of the present disclosure.

In one or more embodiments, FIG. 25 is another schematic structural diagram of a shift register unit according to an embodiment of the present disclosure. As shown in FIG. 25, the first drive output submodule 141 includes a first drive output transistor M41. A first electrode of the first drive output transistor M41 receives the second clock signal CK2, a second electrode of the first drive output transistor M41 outputs the gate drive signal Gout, and a gate of the first drive output transistor M41 is electrically connected to the first drive node N3. In this way, the first drive output transistor M41 may be turned on or off under the control of the signal of the first drive node N3, when the signal of the first drive node N3 controls the first drive output transistor M41 to be turned on, the second clock signal CK2 received by the first electrode of the first drive output transistor M41 may be transmitted to the second electrode of the first drive output transistor M41, so that the second clock signal CK2 is used as the gate drive signal Gout output by the second electrode of the first drive output transistor M41.

Figure 26:
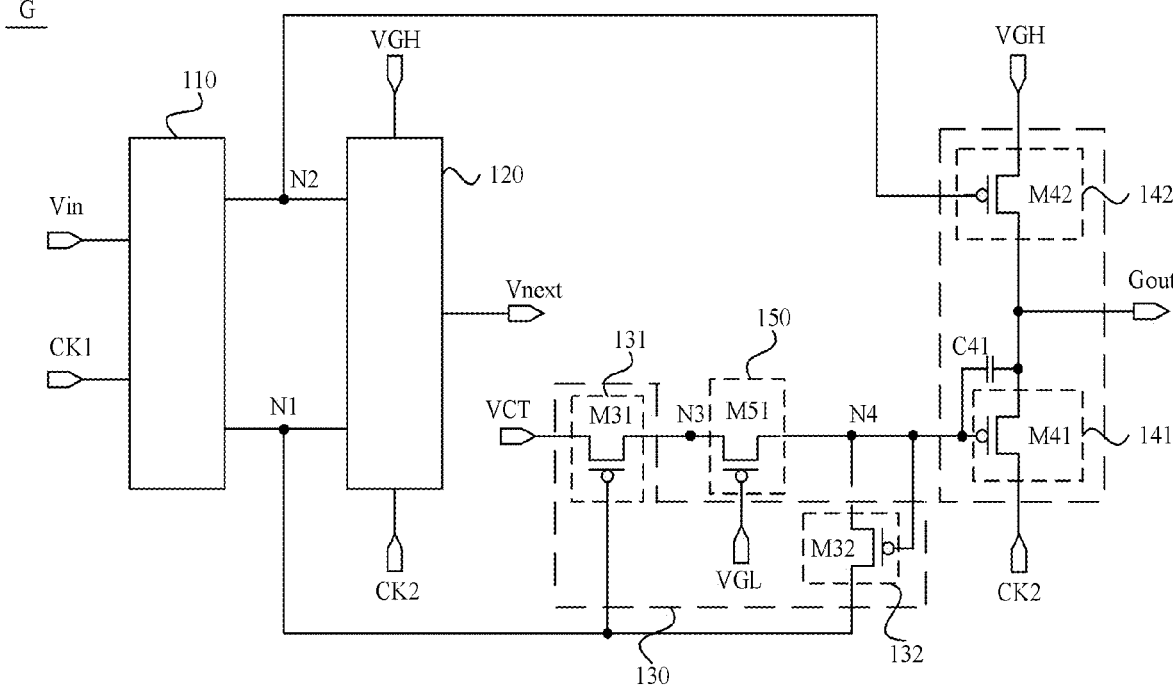
FIG. 26 is another schematic structural diagram of a shift register unit according to an embodiment of the present disclosure.

In one or more embodiments, FIG. 26 is another schematic structural diagram of a shift register unit according to an embodiment of the present disclosure. As shown in FIG. 26, the gate of the first drive output transistor M41 is electrically connected to the second drive node N4, and the second drive node N4 is electrically connected to the first drive node N3 through the first voltage regulation module 150. The second level signal VGL may be a signal that may control the first voltage regulation transistor M51 to be continuously kept in the the on state. Therefore, the signal of the first drive node N3 is substantially kept to be consistent with the signal of the second drive node N4, and the stability of the signal of the second drive node N4 can be improved, thereby improving the accuracy of outputting the gate drive signal by the drive output module 140.

In one or more embodiment, referring to FIG. 25 or FIG. 26, the second drive output submodule 142 includes a second drive output transistor M42. A first electrode of the second drive output transistor M42 receives the first level signal VGH, a second electrode of the second drive output transistor M42 outputs the gate drive signal Gout, and a gate of the second drive output transistor M42 is electrically connected to the second initial node N2. In this way, the second drive output transistor M42 may be turned on or off under the control of the signal of the second initial node N2, when the signal of the second initial node N2 controls the second drive output transistor M42 to be turned on, the first level signal VGH received by the first electrode of the second drive output transistor M42 is able to be transmitted to the second electrode of the second drive output transistor M42, so that the first level signal VGH is used as the gate drive signal Gout output by the second electrode of the second drive output transistor M42.

The second clock signal CK2 may be a pulse signal with a frequency of Fc1, so that the second clock signal CK2 includes a high level and a low level. The first level signal VGH is a fixed signal, for example, the first level signal VGH may be the high-level signal, so that when a gate drive signal Gout at the high level needs to be output, the first drive node N3 may be made to control the first drive output transistor M41 to be turned on when the second clock signal CK2 is at the high level, and/or the second initial node N2 may be made to control the second drive output transistor M42 to be turned on, so that the gate drive signal Gout is able to be kept to be consistent with the high level of the second clock signal CK2 and/or the first level signal VGH. When a gate drive signal Gout at the low level needs to be output, the first drive node N3 may be made to control the first drive output transistor M41 to be turned on when the second clock signal CK2 is at the low level, so that the gate drive signal Gout may be kept to be consistent with the second clock signal CK2 at the low level. In this setting, the gate drive signal Gout can be the pulse signal with the high level and the low level, thereby satisfying the drive requirement of the shift register unit G.

On the basis of the above-described embodiments, referring to FIG. 25 or FIG. 26, the drive output module 140 may further include a first bootstrap capacitor C41. The first bootstrap capacitor C41 may be electrically connected between the second electrode of the first drive output transistor M41 and the gate of the first drive output transistor M41, so that when the gate drive signal Gout of the second electrode of the first drive output transistor M41 hops from the high level to the low level or from the low level to the high level, a signal at the gate of the first drive output transistor M41 is able to be controlled to change accordingly due to the coupling action of the first bootstrap capacitor C41, thereby ensuring that the signal at the gate of the first drive output transistor M41 has a sufficiently high drive capability to drive the first drive output transistor M41 to be turned on or off.

Figure 27:
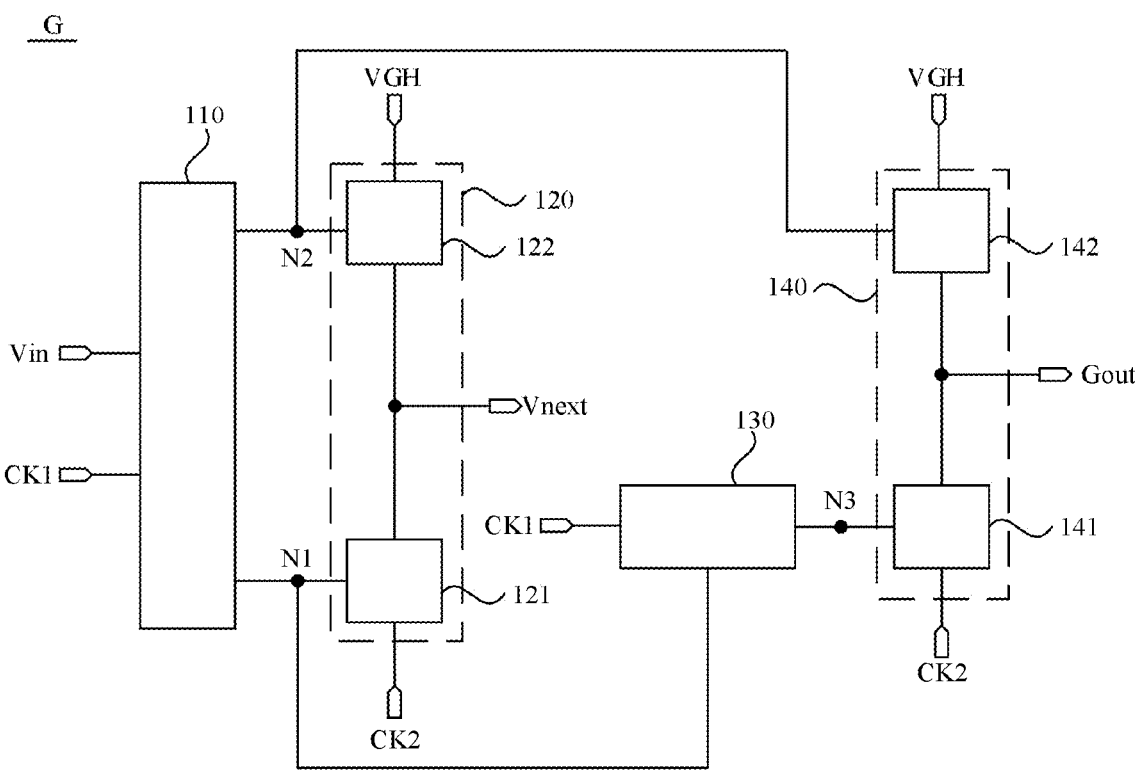
FIG. 27 is another schematic structural diagram of a shift register unit according to an embodiment of the present disclosure.

In one or more embodiment, FIG. 27 is another schematic structural diagram of a shift register unit according to an embodiment of the present disclosure. As shown in FIG. 27, the initial output module 120 includes a first initial output submodule 121 and a second initial output submodule 122. The first initial output submodule 121 is configured to receive the signal of the first initial node N1 and the second clock signal CK2 and control the initial output signal Vnext. The second initial output submodule 122 is configured to receive the signal of the second initial node N2 and the first level signal VGH and control the initial output signal Vnext.

In an example, the first initial output submodule 121 is configured to receive the second clock signal CK2 and the signal of the first initial node N1, so that the first initial output submodule 121 is able to output the initial output signal Vnext under the control of the second clock signal CK2 and the signal of the first initial node N1. The second initial output submodule 122 is configured to receive the first level signal VGH and the signal of the second initial node N2, so that the second initial output submodule 122 is able to output the initial output signal Vnext under the control of the signal of the first level signal VGH and the signal of the second initial node N2. In this case, the polarity and the amplitude of the initial output signal Vnext may be determined by the first initial node N1, the second initial node N2, the first level signal VGH, and the second clock signal CK2.

In one or more embodiments, when the signal of the first initial node N1 is at the enable level, the first initial output submodule 121 may control the initial output signal Vnext to be consistent with the second clock signal CK2. When the signal of the second initial node N2 is the effective level, the second initial output submodule 122 may control the initial output signal Vnext to be consistent with the first level signal VGH.

Figure 28:
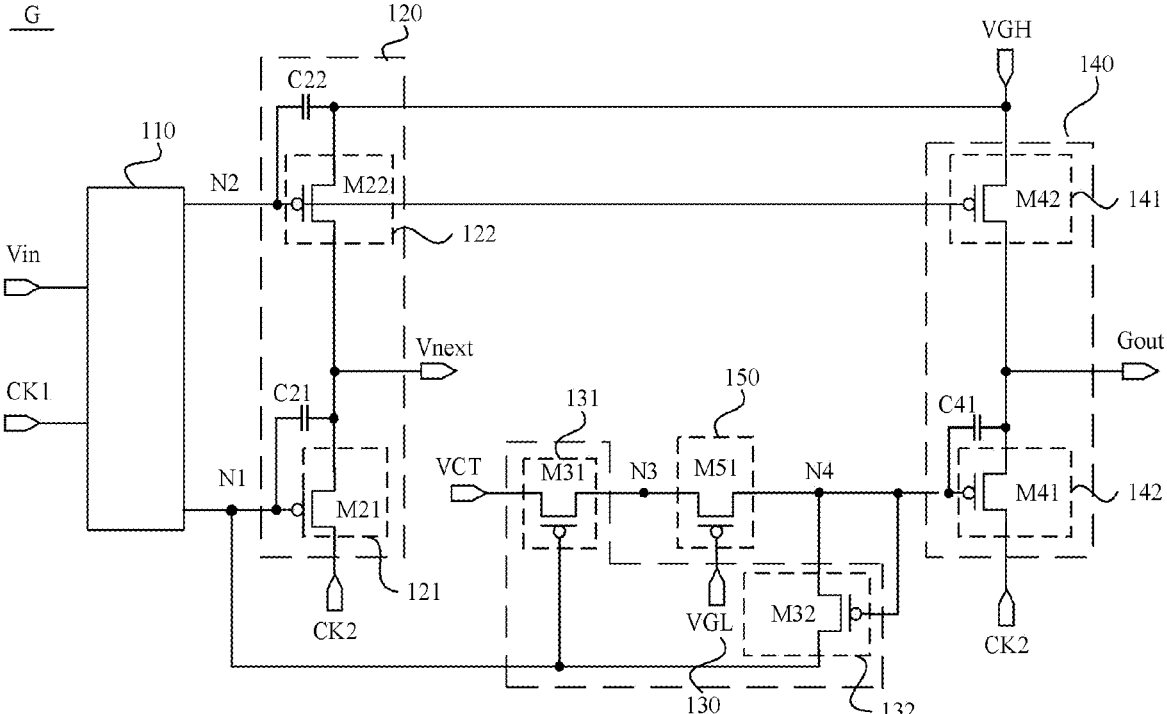
FIG. 28 is another schematic structural diagram of a shift register unit according to an embodiment of the present disclosure.

In one or more embodiments, FIG. 28 is another schematic structural diagram of a shift register unit according to an embodiment of the present disclosure. As shown in FIG. 28, the first initial output submodule 121 includes a first initial output transistor M21. A first electrode of the first initial output transistor M21 receives the second clock signal CK2, a second electrode of the first initial output transistor M21 outputs the initial output signal Vnext, and a gate of the first initial output transistor M21 is connected to the first initial node N1. In this way, the first initial output transistor M21 may be turned on or off under the control of the signal of the first initial node N1, when the signal of the first initial node N1 controls the first initial output transistor M21 to be turned on, the second clock signal CK2 received by the first electrode of the first initial output transistor M21 is able to be transmitted to the second electrode of the first initial output transistor M21, so that the second clock signal CK2 is used as the initial output signal Vnext output by the second electrode of the first initial output transistor M21.

Figure 29:
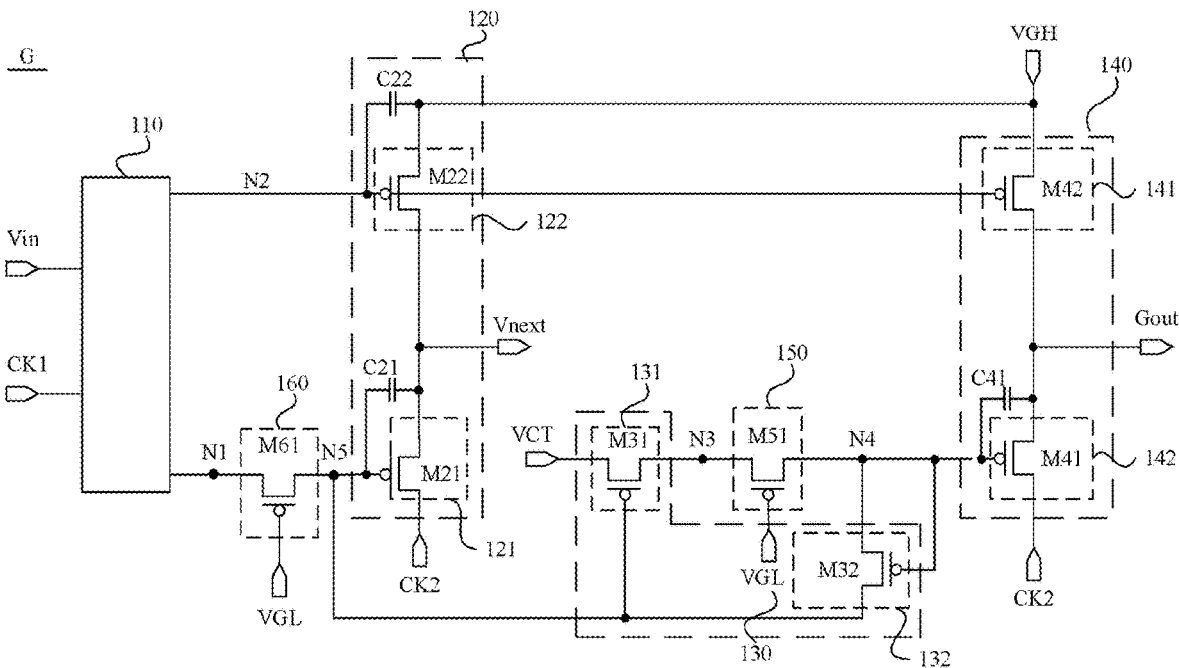
FIG. 29 is another schematic structural diagram of a shift register unit according to an embodiment of the present disclosure.

In one or more embodiments, FIG. 29 is another schematic structural diagram of a shift register unit according to an embodiment of the present disclosure. As shown in FIG. 29, the gate of the first initial output transistor M21 is electrically connected to the third initial node N5, and the third initial node N5 is electrically connected to the first initial node N1 through a second voltage regulation module 160.

In an example, the first initial node N1 is connected to the third initial node N5 through the second voltage regulation module 160, that is, the first initial node N1 and the third initial node N5 are different nodes. The second voltage regulation module 160 may isolate the gate of the first initial output transistor M21 from the first initial node N1, to ensure that the signal of the first initial node N1 and the signal of the third initial node N3 are relatively stable, and prevent the accuracy of the initial output signal Vnext output by the first initial output transistor M21 from being influenced due to the fluctuation of the first initial node N1 and/or the third initial node N3, thereby improving of the operation stability of the shift register unit G, and the display effect of the display panel. Moreover, the third initial node N5 is electrically connected to the first initial node N1 through the second voltage regulation module 160, so that the signal of the first initial node N1 is the same as the signal of the third initial node N5. In this way, the first initial output transistor M21 may be turned on or off under the control of the signal of the first initial node N1, when the signal of the first initial node N1 controls the first initial output transistor M21 to be turned on, the second clock signal CK2 received by the first electrode of the first initial output transistor M21 is able to be transmitted to the second electrode of the first initial output transistor M21, so that the second clock signal CK2 is used as the initial output signal Vnext output by the second electrode of the first initial output transistor M21.

In one or some embodiments, referring to FIG. 29, the second voltage regulation module 160 includes a second voltage regulation transistor M61. A first electrode of the second voltage regulation transistor M61 is electrically connected to the first initial node N1, a second electrode of the second voltage regulation transistor M61 is electrically connected to the gate of the first initial output transistor M21, and a gate of the second voltage regulation transistor M61 receives the second level signal VGL.

The second level signal VGL may control the second voltage regulation transistor M61 to be continuously kept in the on state, so that the signal of the first initial node N1 is substantially consistent with the signal of the third initial node N5. However, since the second voltage regulation transistor M61 that is turned on has a certain resistance, when the signal of the third initial node N5 electrically connected to the first initial output transistor M21 changes, the second voltage regulation transistor M61 may reduce a change amount of the signal of the first initial node N1 that changes with the signal of the third initial node N5. Similarly, when the signal of the first initial node N1 changes, the second voltage regulation transistor M61 may also reduce a change amount of the signal of the first initial node N1 that changes with the signal of the third initial node N5. In this way, the second voltage regulation transistor M61 is disposed between the first initial node N1 and the third initial node N5, so that the stability of the signal of the first initial node N1 and the signal of the third initial node N5 can be ensured, thereby improving the stability of the initial output signal Vnext output by the first output transistor M21.

In one or more embodiments, when the second level signal VGL is the low-level signal, the second level signal VGL at the low level may control the second voltage regulation transistor M61 to be in the on state, so that the signal of the first initial node N1 is substantially consistent with the signal of the third initial node N5.

In one or more embodiment, referring to FIG. 28 or FIG. 29, the second initial output submodule 122 includes a second initial output transistor M22, a first electrode of the second initial output transistor M22 receives the first level signal VGH, a second electrode of the second initial output transistor M22 outputs the initial output signal Vnext, and a gate of the second initial output transistor M22 is electrically connected to the second initial node N2. In this way, the second initial output transistor M22 may be turned on or off under the control of the signal of the second initial node N2, when the signal of the second initial node N2 controls the second initial output transistor M22 to be turned on, the first level signal VGH received by the first electrode of the second initial output transistor M22 is able to be transmitted to the second electrode of the second initial output transistor M22, so that the first level signal VGH is used as the initial output signal Vnext output by the second electrode of the second initial output transistor M22.

The second clock signal CK2 may be a pulse signal with a frequency of Fc0, so that the second clock signal CK2 includes a high level and a low level. However, the first level signal VGH is a fixed signal, for example, the first level signal VGH may be the high-level signal, so that when an initial output signal Vnext at the high level needs to be output, the first initial node N1 may be made to control the first initial output transistor M21 to be turned on when the second clock signal CK2 is at the high level, and/or the second initial node N2 may be made to control the second initial output transistor M22 to be turned on, so that the initial output signal Vnext is able to be kept to be consistent with the high level of the second clock signal CK2 and/or the first level signal VGH. When an initial output signal Vnext at the low level needs to be output, the first initial node N1 may be made to control the first initial output transistor M21 to be turned on when the second clock signal CK2 is at the low level, so that the initial output signal Vnext may be kept to be consistent with the low level of the second clock signal CK2. In this setting, the initial output signal Vnext can be the pulse signal with the high level and the low level, thereby satisfying the drive requirement of the shift register unit G.

On the basis of the above-described embodiments, the initial output module 120 may further include an initial bootstrap capacitor C21. The initial bootstrap capacitor C21 may be electrically connected between the second electrode of the first initial output transistor M21 and the gate of the first initial output transistor M21, so that when the initial output signal Vnext of the second electrode of the first initial output transistor M21 hops from the high level to the low level or from the low level to the high level, a signal at the gate of the first initial output transistor M21 can be controlled to change accordingly due to the coupling level of the initial bootstrap capacitor C21, thereby ensuring that the signal at the gate of the first initial output transistor M21 has a sufficiently high drive capability to drive the first initial output transistor M21 to be turned on or off.

Moreover, the initial output module 120 may further include a hold capacitor C22. A first plate of the hold capacitor C22 receives the first level signal VGH, a second plate of the hold capacitor C22 is electrically connected to the second initial node N2, so that the hold capacitor C22 can store the signal of the second initial node N2, to ensure that the signal of the second initial node N2 can continuously control the second initial output transistor M22 to be turned on or off.

Figure 30:
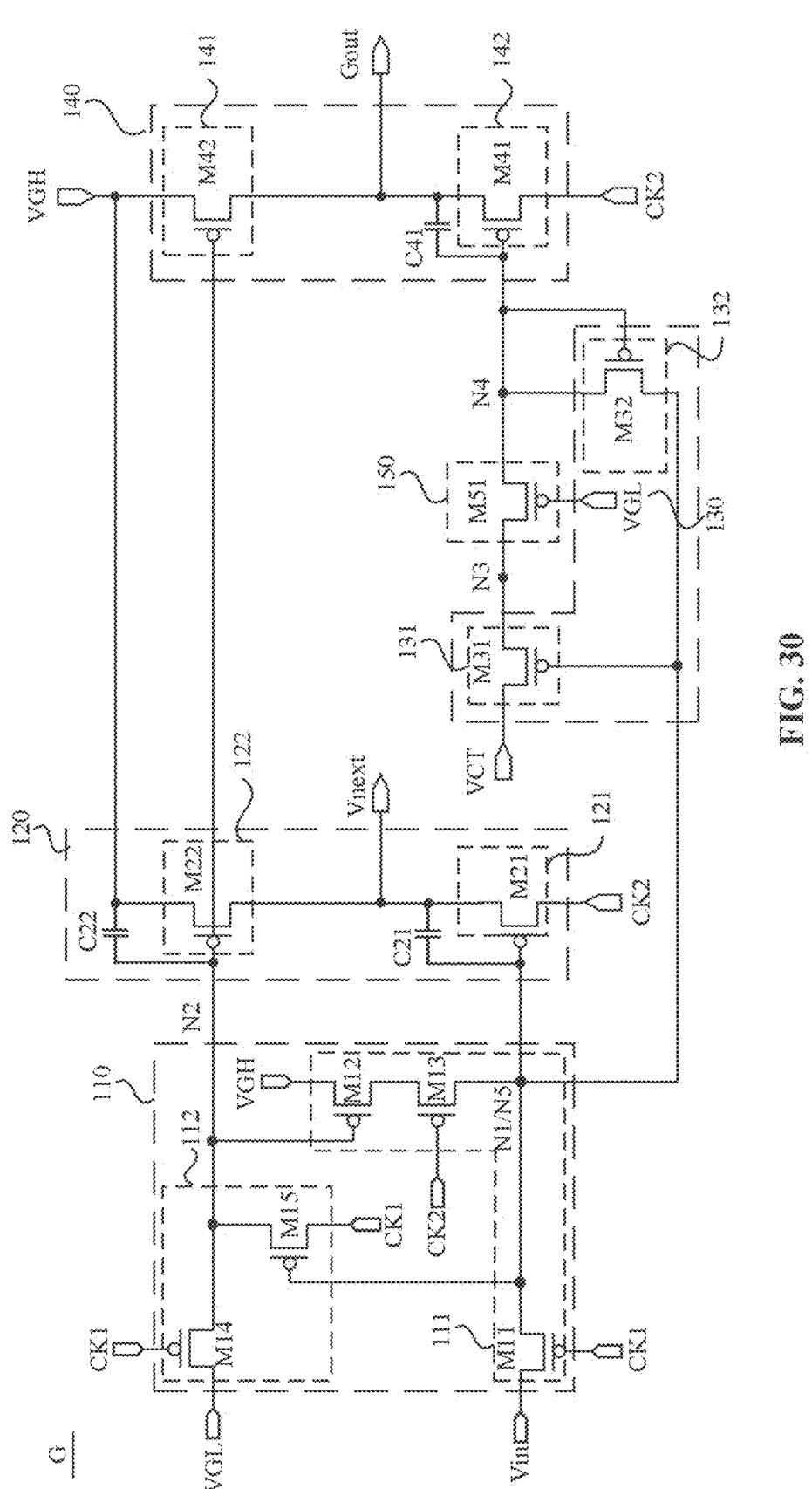
FIG. 30 is another schematic structural diagram of a shift register unit according to an embodiment of the present disclosure.
Figure 31:
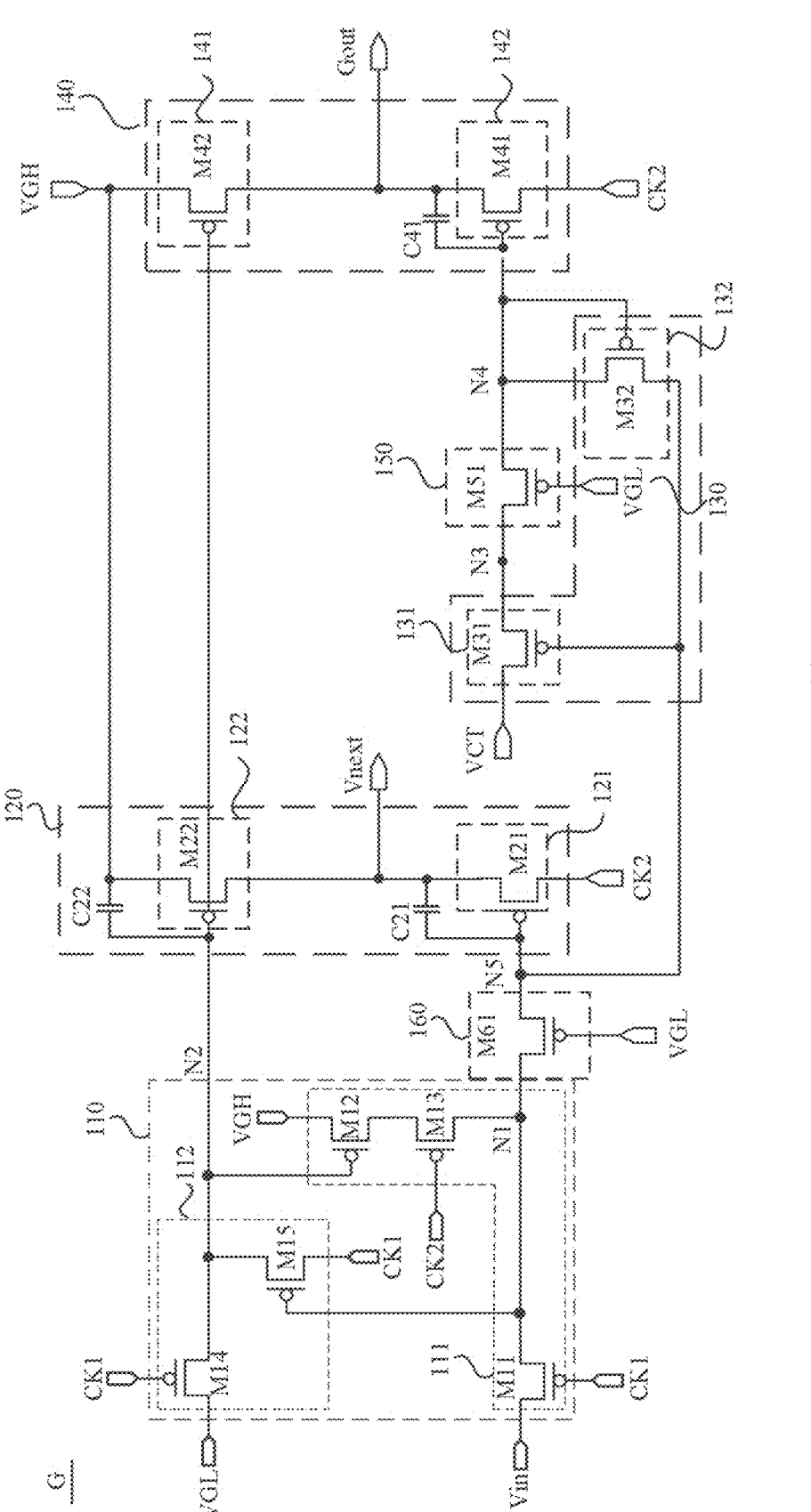
FIG. 31 is another schematic structural diagram of a shift register unit according to an embodiment of the present disclosure.

On the basis of the above-described embodiments, FIG. 30 is another schematic structural diagram of a shift register unit according to an embodiment of the present disclosure, and FIG. 31 is another schematic structural diagram of a shift register unit according to an embodiment of the present disclosure. Referring to FIG. 30 or FIG. 31, the initial control module 110 may include a first initial control module 111 and a second initial control module 112. The first initial control module 111 may receive at least the first level signal VGH, the input signal Vin, the second clock signal CK2 and the first clock signal CK1 and control the signal of the first initial node N1. The second initial control module 112 may receive at least the second level signal VGL and the first clock signal CK1 and control the signal of the second initial node N2.

In an example, the first initial control module 111 may provide a signal to the first initial node N1 under the control of the first level signal VGH, the first clock signal CK1, the second clock signal CK2, and the input signal Vin, so that the first level signal VGH, the first clock signal CK1, the second clock signal CK2 and the input signal Vin is able to control the polarity and the amplitude of the first initial node N1. The second control module 112 may provide a signal to the second initial node N2 under the control of the second level signal VGL and the first clock signal CK1, so that the second level signal VGL and the first clock signal CK1 is able to control the polarity and the amplitude of the second initial node N2.

In one or more embodiments, when the first clock signal CK1 is at an enable level, the first initial control module 111 may transmit the input signal Vin to the first initial node N1, so that the signal of the first initial node N1 is kept to be consistent with the input signal Vin; and the second initial control module 112 may transmit the second level signal VGL to the second initial node N2, so that the signal of the second initial node N2 is kept to be consistent with the second level signal VGL.

In one or more embodiments, the first initial control module 111 may include a first initial control transistor M11, a second initial control transistor M12 and a third initial control transistor M13. A first electrode of the first initial control transistor M11 receives the input signal Vin, a second electrode of the first initial control transistor M11 is electrically connected to the first initial node N1, and a gate of the first initial control transistor M11 receives the first clock signal CK1. A first electrode of the second initial control transistor M12 receives the first level signal VGH, a second electrode of the second initial control transistor M12 is electrically connected to a first electrode of the third initial control transistor M13, a second electrode of the third initial control transistor M13 is electrically connected to the first initial node N1, a gate of the second initial control transistor M12 is electrically connected to the second initial node N2, and the third initial control transistor M13 receives the second clock signal CK2. In this case, the first clock signal CK1 may control the first initial control transistor M11 to be turned on or off, when the first clock signal CK controls the first initial control transistor M11 to be turned on, the first initial control transistor M11 may transmit the input signal Vin to the first initial node N1, so that the signal of the first initial node N1 is kept to be consistent with the input signal Vin. The signal of the second initial node N2 may control the second initial control transistor M12 to be turned on or off, the second clock signal CK2 may control the third initial control transistor M13 to be turned on or off. When the signal of the second output node N2 controls the second control transistor M12 to be turned on and the second clock signal CK2 controls the third initial control transistor M13 to be turned on, the first level signal VGH is transmitted to the first initial node N1, so that the signal of the first initial node N1 is kept to be consistent with the first level signal VGH.

Correspondingly, the second initial control module 112 may include a fourth initial control transistor M14 and a fifth initial control transistor M15. A first electrode of the fourth initial control transistor M14 receives the second level signal VGL, a second electrode of the fourth initial control transistor M14 is electrically connected to the second initial node N2, and a gate of the fourth initial control transistor M14 receives the first clock signal CK1. A first electrode of the fifth initial control transistor M15 receives the first clock signal CK1, a second electrode of the fifth initial control transistor M15 is electrically connected to the second initial node N2, and a gate of the fifth initial control transistor M15 is electrically connected to the first initial node N1. In this case, the first clock signal CK1 may control the fourth initial control transistor M14 to be turned on or off, and the signal of the first initial node N1 controls the fifth initial control transistor M15 to be turned on or off. When the first clock signal CK1 controls the fourth initial control transistor M14 to be turned on, the fourth initial control transistor M14 may transmit the second level signal VGL to the second initial node N2, so that the signal of the second initial node N2 is kept to be consistent with the second level signal VGL. When the signal of the first initial node N1 controls the fifth initial control transistor M15 to be turned on, the signal of the second initial node N2 is kept to be consistent with the first clock signal CK1.

It should be understood that the first clock signal CK1 may be a pulse signal, so that the first clock signal CK1 may include the high level and the low level. The input signal Vin is an initial output signal Vnext of the previous-stage shift register unit G, so that the input signal Vin may also include the high level and the low level. Each of the first level signal VGH and the second level signal VGL is the fixed signal. For example, the first level signal VGH may be the low-level signal, and the second level signal VGL may be the high-level signal. A pulse frequency of the first clock signal CK1 may be the same as a pulse frequency of the second clock signal CK2, that is, both the pulse frequency of the first clock signal CK1 and the pulse frequency of the second clock signal CK2 are Fc0. In this case, a phase of the first clock signal CK1 is different from a phase of the second clock signal CK2, that is, when the first clock signal CK1 is at the enable level, the second clock signal CK2 is an invalid level, in contrast, when the second clock signal CK2 is at the enable level, the first clock signal CK1 is an invalid level.

When the second initial node N2 needs a low-level signal, the first clock signal CK1 may be made to control the fourth initial control transistor M14 to be turned on, and the first level signal VGH at the low level may be transmitted to the second initial node N2 through the fourth initial control transistor M14 that is turned on, and/or when the first clock signal CK1 is at the low level, the signal of the first initial node N1 controls the fifth initial control transistor M15 to be turned on, so that the first clock signal CK1 at the low level is transmitted to the second initial node N2. When the second initial node N2 needs a high-level signal, the fifth initial control transistor M15 may be controlled to be turned on through the signal of the first initial node N1 when the first clock signal CK1 is at the high level, so that the first clock signal CK1 at the high level is transmitted to the second initial node N2, and the signal of the second initial node N2 can be set according to practical requirements.

Similarly, when the first initial node N1 needs the high-level signal, the first clock signal CK1 may control the first initial control transistor M11 to be turned on when the input signal Vin is at the high level. In this case, the signal of the first initial node N1 may be kept to be consistent with the input signal Vin at the high level. Alternatively, the signal of the second initial node N2 controls the second initial control transistor M12 to be turned on, and meanwhile, the second clock signal CK2 controls the third initial control transistor M13 to be turned on, so that the first level signal VGH at the high level is transmitted to the first initial node N1. When the first initial node N1 needs the low-level signal, the first clock signal CK1 may be made to control the first initial control transistor M11 to be turned on when the input signal Vin is at the low level, so that the first initial control transistor M11 is able to transmit the input signal Vin at the low level to the first initial node N1. In this setting, the signal of the first initial node N1 may be controlled according to requirements.

Figure 32:
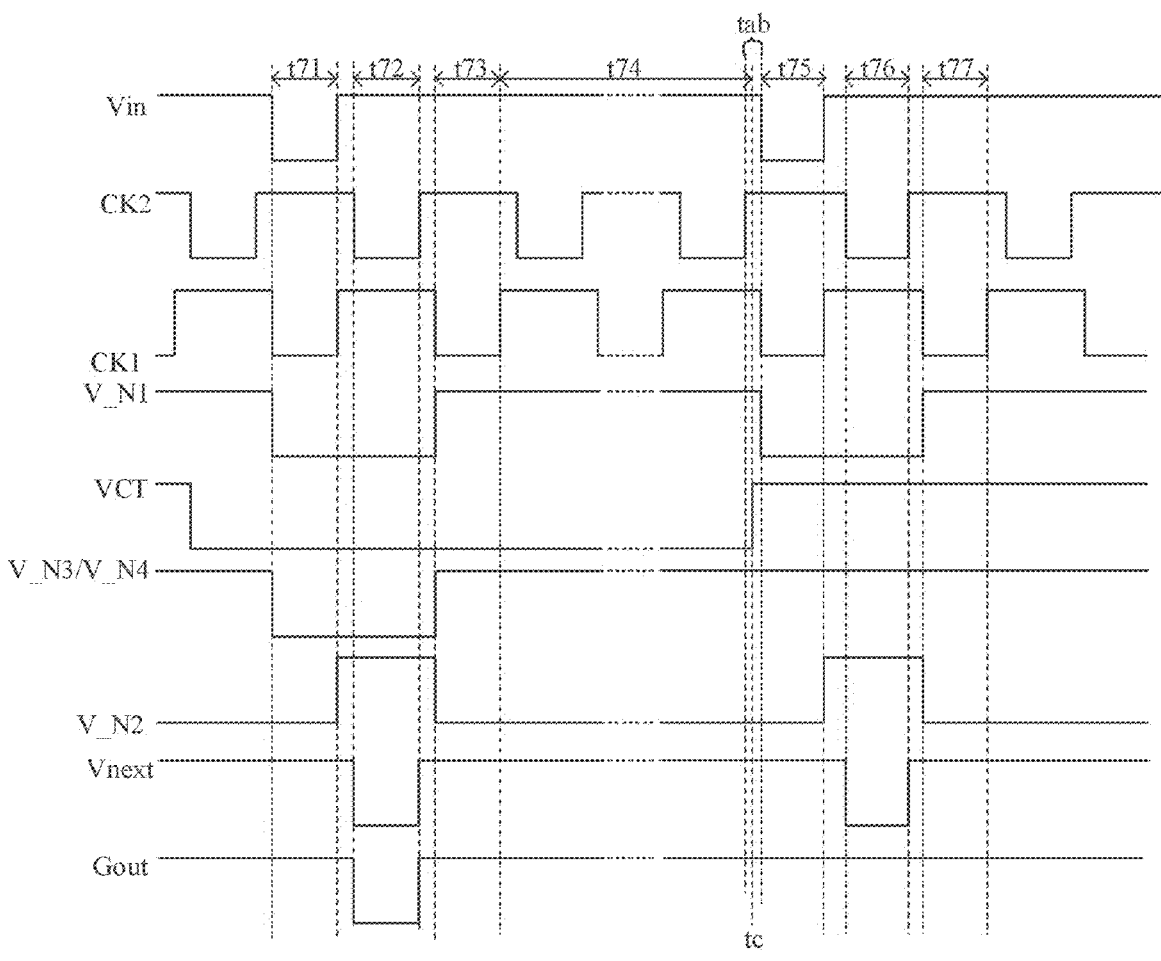
FIG. 32 is another drive timing diagram of a shift register unit according to an embodiment of the present disclosure.

In one or more embodiments, that each transistor in the shift register unit is the P-type transistor is used as an example. FIG. 32 is another drive timing diagram of a shift register unit according to an embodiment of the present disclosure. With reference to FIG. 31 and FIG. 32, before a t71 phase, since the input signal Vin is at the high level, when the first clock signal CK1 controls the first initial control transistor M11 to be turned on, the first initial control transistor M11 transmits the input signal Vin at the high level to the first initial node N1, so that the signal of the first initial node N1 is at the high level; when the signal of the second initial node N2 controls the second initial control transistor M12 to be turned on and the second clock signal CK2 controls the third initial control transistor M13 to be turned on, the first level signal VGH at the high level is transmitted to the first initial node N1, and thus the signal of the first initial node N1 is also made to be at the high level, so that the signal of the first initial node N1 controls the first initial output transistor M21, the first drive control transistor M31 and the second drive control transistor M32 to be in the off state, and the signal V_N3 of the first drive node N3 and the signal V_N4 of the fourth drive node N4 are at the high level. Since the second level signal VGL is at the low level, when the first clock signal CK1 controls the fourth initial control transistor M14 to be turned on, the second level signal VGL at the low level is transmitted to the second initial node N2, and Since the first initial node N1 is at the high level, the fifth initial control transistor M15 is kept in the off state, and a hop of the first clock signal CK1 does not affect the signal of the second initial node N2, so that the second initial node N2 is kept as the low-level signal. The signal of the second initial node N2 may control the second initial output transistor M22 and the second drive transistor M42 to be in the on state, so that both the initial output signal Vnext and the gate drive signal Gout are kept to be consistent with the first level signal VGH, that is, the initial output signal Vnext and the gate drive signal Gout are at the high level.

At the t71 phase, the drive control signal VCT is kept at the low level, the input signal Vin becomes at the low level, at this time, the first clock signal CK1 is at the low level, and the second clock signal CK2 is at the high level. In this case, the first clock signal CK1 controls both the first initial control transistor M11 and the fourth initial control transistor M14 to be turned on, and the input signal Vin at the low level is transmitted to the first initial node N1 through the first initial control transistor M11, so that the signal V_N1 of the first initial node N1 becomes at the low level. The low-level signal may control both the first initial output transistor M21 and the first drive control transistor M31 to be turned on, so that the second clock signal CK2 is transmitted from the first electrode of the first initial output transistor M21 to the second electrode of the first initial output transistor M21, and the low level of the drive control signal VCT is transmitted from the first electrode of the first drive control transistor M31 to the first drive node N3. The second clock signal CK2 at the high level is transmitted to the second electrode of the first drive output transistor M41. Moreover, the second level signal VGL is also transmitted to the second initial node N2 through the fourth initial control transistor M14, so that the signal V_N2 of the second initial node N2 is also at the low level. The low-level signal may simultaneously control the second initial output transistor M22 and the second drive output transistor M42 to be turned on, so that the first level signal VGH at the high level is transmitted to the second electrode of the second initial output transistor M22, and the first level signal VGH is also transmitted to the second electrode of the second drive output transistor M42. In this case, both the signal of the second electrode of the first initial output transistor M21 and the signal of the second electrode of the second initial output transistor M22 are the high-level signals, so that the initial output signal Vnext is kept at the high level; and both the signal of the second electrode of the first drive output transistor M41 and the signal of the second electrode of the second drive output transistor M42 are the high-level signals, so that the gate drive signal Gout is also kept at the high level. In addition, since the signal of the first initial node N1 is at the low level, so that the fifth initial control transistor M15 is in the on state. The first clock signal CK1 at the low level is transmitted to the second initial node N2 through the fifth initial control transistor M15, so that the second initial node N2 is kept at the low level. Moreover, since the signal of the second initial node N2 is at the low level, so that the second initial control transistor M12 is in the on state. However, since the second clock signal CK2 is at the high level, the third initial control transistor M13 is in the off state, the first level signal VGH cannot be transmitted to the first initial node N1, and the signal V_N1 of the first initial node N1 is only kept to be consistent with the input signal Vin.

At a t72 phase, the input signal Vin becomes at the high level, at this time, the first clock signal CK1 is at the high level, the second clock signal CK2 is at the low level, the first clock signal CK1 controls both the first initial control transistor M11 and the second initial control transistor M12 to be turned off, and the first initial node N1 is kept as the signal input at the t71 phase, that is, the signal V_N1 of the first initial node N1 is kept at the low level, so that the fifth initial control transistor M15 is in the on state. The first clock signal CK1 at the high level is transmitted to the second initial node N2 through the fifth initial control transistor M15, so that the signal V_N2 of the second initial node N2 becomes at the high level. The signal V_N2 of the second initial node N2 controls the second initial control transistor M12 to be turned off, and the first level signal VGH cannot be transmitted to the first initial node N1, so that the signal V_N1 of the first initial node N1 is kept at the low level. In this case, the signal V_N1 of the first initial node N1 continues to control both the first initial output transistor M21 and the first drive control transistor M31 to keep in the on state, and the second initial node N2 controls both the second initial output transistor M22 and the second drive output transistor M42 to be in the off state. In this case, the initial output signal Vnext is kept to be consistent with the second clock signal CK2 at the low level, the drive control signal VCT is at the low level, the drive control signal VCT at the low level is transmitted to the first drive node N3 through the first drive control transistor M31, the first drive output transistor M41 is turned on, and the gate drive signal Gout is kept to be consistent with the second clock signal CK2 at the low level.

At a t73 phase, the input signal Vin becomes at the high level, the first clock signal CK1 becomes at the low level, the second clock signal CK2 becomes at the high level, both the first initial control transistor M11 and the fourth initial control transistor M14 are turned on, the signal V_N1 of the first initial node N1 is kept to be consistent with the input signal Vin at the high level, the signal V_N2 of the second initial node N2 is kept to be consistent with the second level signal VGL at the low level, so that the signal V_N1 of the first initial node N1 controls both the first initial output transistor M21 and the first drive control transistor M31 to be turned off. The second drive control transistor M32 is turned on since a gate-source voltage Vds of the second drive control transistor M32 reaches a turn-on threshold of the second drive control transistor M32, and the high level of the first initial node N1 is transmitted to the second drive node N4 through the second drive transistor M32, so that the first drive output transistor M41 is turned off. The signal V_N2 of the second initial node N2 controls both the second initial output transistor M22 and the second drive output transistor M42 to be turned on, in this case, both the initial output signal Vnext and the gate drive signal Gout are kept to be consistent with the first level signal VGH at the high level.

At a t74 phase, the first initial node N1, the second initial node N2, the first drive node N3 and the second drive node N4 are continuously kept as the signals at the t73 phase until the input signal Vin becomes at the low level again. In this way, when an initial output signal Vnext of the x-th-stage shift register unit Gx is used as an input signal Vin of the y-th-stage shift register unit Gy, a low-level signal of the initial output signal Vnext of the x-th-stage shift register unit Gx and a low-level signal of an initial output signal Vnext of the y-th-stage shift register unit Gy is able to be sequentially shifted, and moreover, a low-level signal of a gate drive signal Gout of the x-th-stage shift register unit Gx and a low-level signal of a gate drive signal Gout of the y-th-stage shift register unit Gy are also sequentially shifted, whereby a low-level signal of an initial output signal Vnext output by each stage of shift register unit G of the driver circuit and a low-level signal of a gate drive signal Gout output by each stage of shift register unit G of the driver circuit are able to be sequentially shifted. When the gate drive signal Gout output by each stage of shift register unit G is used to control a signal refresh time of each row of pixel circuits, the progressive scanning of the each row of pixel circuits in the display panel can be achieved.

Before entering a t75 phase, the drive control signal VCT hops from the low level to the high level. At the t75 phase, the input signal Vin becomes at the low level again, at this time, the first clock signal CK1 is at the low level, the second clock signal CK2 is at the high level, and the signal V_N1 of the first initial node N1 and the signal V_N2 of the second initial node N2 are the same as those at the t71 phase, that is, both the signal V_N1 of the first initial node N1 and the signal V_N2 of the second initial node N2 are at the low level. The signal V_N1 of the first initial node N1 controls the first initial output transistor M21 and the first drive control transistor M31 to be turned on, and the first initial output transistor M21 outputs a high level signal of the second clock signal CK2 as the initial output signal Vnext. The first drive output transistor M31 transmits the drive control signal VCT at the high level to the first drive node N3 and the second drive node N4, and the first drive output transistor M41 is turned off. The signal V_N2 of the second initial node N2 controls the second drive output transistor M42 to be turned on, and the second drive output transistor M42 outputs a high level signal of the first level signal VGH, that is, the gate drive signal Gout is at the high level.

At a t76 phase, the input signal Vin becomes at the high level, at this time, the first clock signal CK1 is at the high level, the second clock signal CK2 is at the low level, and the first clock signal CK1 controls both the first initial control transistor M11 and the second initial control transistor M12 to be turned off. The signal V_N1 of the first initial node N1 and the signal V_N2 of the second initial node N2 are the same as those at the t72 phase, that is, the signal of the first initial node N1 is kept as the low-level signal input at the t71 phase, and the signal V_N2 of the second initial node N2 becomes at the high level. The signal V_N1 of the first initial node N1 controls the first initial output transistor M21 and the first drive control transistor M31 to be turned on, and the first initial output transistor M21 outputs a low level signal of the second clock signal CK2, that is, the initial output signal Vnext becomes at the low level. The first drive output transistor M31 transmits a high level signal of the drive control signal VCT to the first drive node N3 and the second drive node N4, and the first drive output transistor M41 is turned off. Moreover, the signal V_N2 of the second initial node N2 controls the second drive output transistor M42 to be turned off, and in this case, the gate drive signal Gout output by the drive output module 140 is kept as a high-level signal of the previous stage.

At a t77 phase, the input signal Vin becomes at the high level, the first clock signal CK1 becomes at the low level, and the second clock signal CK2 becomes at the high level. The signal V_N1 of the first initial node N1 and the signal V_N2 of the second initial node N2 are the same as those at the t73 phase, that is, the signal V_N1 of the first initial node N1 is kept to be consistent with the input signal Vin at the high level, and the signal of the second initial node N2 is kept to be consistent with the second level signal VGL at the low level. The signal V_N1 of the first initial node N1 controls both the first initial output transistor M21 and the first drive control transistor M31 to be turned off, the second drive control transistor M32 is turned on since a gate-source voltage Vds of the second drive control transistor M32 reaches a turn-on threshold of the second drive control transistor M32, and the first initial node N1 at the high level is transmitted to the second drive node N4 through the second drive control transistor M32, so that the first drive output transistor M41 is turned off. The signal of the second initial node N2 controls both the second initial output transistor M22 and the second drive output transistor M42 to be turned on. In this case, both the initial output signal Vnext and the gate drive signal Gout are kept to be consistent with the first level signal VGH at the high level.

After the t77 phase, the first initial node N1 and the second initial node N2 are continuously kept as the signal at the t76 phase until the input signal Vin becomes at the low level again, and the first drive node N3 and the second drive node N4 are continuously kept as the signal at the t76 phase until the drive control signal VCT becomes at the low level.

In this way, when the initial output signal Vnext of the x-th-stage shift register unit Gx is used as the input signal Vin of the y-th-stage shift register unit Gy, at a phase in which the drive control signal VCT is at the low level, the low-level signal of the initial output signal Vnext of the x-th-stage shift register unit Gx and the low-level signal of the initial output signal Vnext of the y-th-stage shift register unit Gy may be enabled to be sequentially shifted, and moreover, the low-level signal of the gate drive signal Gout of the x-th-stage shift register unit Gx and the low-level signal of the gate drive signal Gout of the y-th-stage shift register unit Gy are also sequentially shifted, whereby the low-level signal of the initial output signal Vnext output by each stage of shift register unit G of the driver circuit and the low-level signal of the gate drive signal Gout output by each stage of shift register unit G of the driver circuit are able to be sequentially shifted. In this case, if the gate drive signal Gout output by each stage of shift register unit G is used to control the signal refresh time of each row of pixel circuits, then the progressive scanning of the each row of pixel circuits in the display panel can be achieved. At a stage in which the drive control signal VCT is at the high level, the low-level signal of the initial output signal Vnext of the x-th-stage shift register unit Gx and the low-level signal of the initial output signal Vnext of the y-th-stage shift register unit Gy may be sequentially shifted, so that each stage of shift register unit G is able to operate normally, the gate drive signal of the x-th-stage shift register unit Gx is kept at the high level, at this time, the pixel circuit electrically connected to the x-th-stage shift register unit Gx stops refreshing. Therefore, different display regions may have different refresh frequencies by setting the drive control signals VCT received by the shift register units G corresponding to the different display regions.

Figure 33:
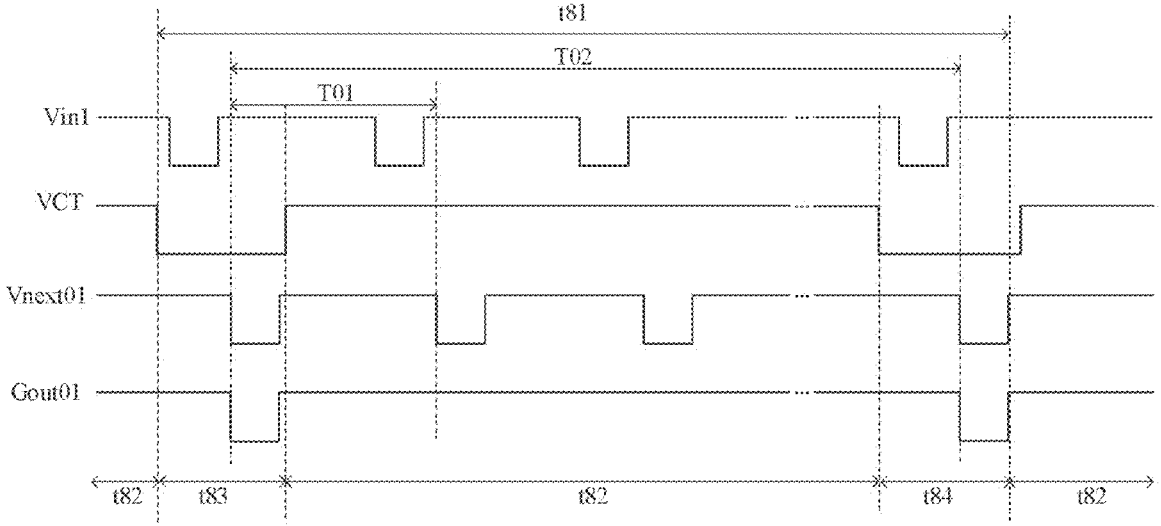
FIG. 33 is another drive timing diagram of a shift register unit according to an embodiment of the present disclosure.

In one or more embodiment, FIG. 33 is another drive timing diagram of a shift register unit according to an embodiment of the present disclosure. With reference to FIG. 2, FIG. 3, and FIG. 33, the display panel 100 includes a first shift register unit G10. In the first shift register unit G10, a frequency of the initial output signal Vnext1 is F11, and a frequency of the gate drive signal Gout is F12. The operation mode of the display panel 100 includes a first mode. In the first mode, F11≠F12.

In an example, in a process in which the display panel 100 operates in the first mode (as shown at a t81 phase in FIG. 33), a pulse change frequency F12 of a gate drive signal Gout01 of the first shift register unit G10 is set to be different from a pulse change frequency F11 of an initial output signal Vnext01 of the first shift register unit G10, that is, a period T02 of the gate drive signal Gout01 is different from a period T01 of the initial output signal Vnext01. In this case, when the display panel 100 operates in the first mode, a time of an enable level of the initial output signal Vnext01 of the first shift register unit G10 overlaps with a time of a non-enable level of the gate drive signal Gout01, and/or a time of an enable level of the gate drive signal Gout01 overlaps with a time of a non-enable level of the initial output signal Vnext01, so that the time of the enable level of the initial output signal Vnext01 provided to the next stage shift register unit G does not overlap with the time of the enable level of the gate drive signal Gout01 provided to the pixel circuit. Therefore, the gate drive signal Gout01 and the initial output signal Vnext01 that are output by the same shift register unit G are independent of each other and do not affect each other, thereby ensuring the normal display of the display panel while satisfying the drive requirements of the driver circuit.

In one or more embodiment, with continuing reference to FIG. 2, FIG. 3 and FIG. 33, in the first mode, F11>F12.

In an example, in a process in which the display panel 100 operates in the first mode, the pulse change frequency F1i of the initial output signal Vnext01 of the first shift register unit G10 is set to be greater than the pulse change frequency F12 of the gate drive signal Gout01 of the first shift register unit G10, that is, the period T02 of the gate drive signal Gout01 is greater than the period T01 of the initial output signal Vnext01, whereby in the process in which the display panel 100 operates in the first mode, at least part of time exists such that the time of the enable level of the initial output signal Vnext01 of the first shift register unit G10 overlaps with the time of the non-enable level of the gate drive signal Gout01, and/or another part of time exists such that the time of the enable level of the gate drive signal Gout01 overlaps with the time of the enable level of the initial output signal Vnext01, to ensure that in part of time period in the first mode, the first shift register unit G10 normally provides the enable level of the initial output signal Vnext01 to the next-stage shift register unit G, and provides the non-enable level of the gate drive signal Gout01 to the pixel circuit, so that the next-stage shift register unit G operates normally, and the correspondingly connected pixel circuit does not perform the signal refreshing. In another part of time period in the first mode, the first shift register unit 101 provides the enable level of the initial output signal Vnext01 to the next-stage shift register unit G of the first shift register unit 101, and also provides the enable level of the gate drive signal Gout01 to the pixel circuit, so that the pixel circuit performs the signal refreshing while the next-stage shift register unit G operates normally. In this way, in the part of time, the power consumption can be reduced due to the signal refreshing in the pixel circuit, thereby facilitating low power consumption of the display panel. In another part of time, signals in the pixel circuit are refreshed, so that the normal display of the display panel can be ensured, and the picture is prevented from flickering. In this case, the first shift register unit G10 may be electrically connected to a pixel circuit with a relatively low refresh frequency in the display panel 100, as shown in the drawings, electrically connected to the pixel circuit 20 in the first display region A21.

In one or more embodiment, with continued reference to FIG. 33, in at least part of time in the first mode, the drive control signal VCT is at the non-enable level.

In an example, the drive control signal VCT is set to be at the non-enable level in at least part of time in the first mode (such as, at a t82 phase in FIG. 33), so that the drive control module 130 may control the signal of the first drive node N3 to be the non-enable level in at least part of time in the first shift register unit G10. Therefore, the gate drive signal Gout01 output by the drive output module 140 of the first shift register unit G10 always keeps at the non-enable level in this part of time, the pixel circuit connected to the first shift register unit G10 is not refreshed in this process, the next-stage shift register unit G operates normally, so that the power consumption is generated due to the signal refreshing in the pixel circuit can be reduced during this process, thereby facilitating the low power consumption of the display panel.

In one or more embodiments, a time at which the drive control signal VCT received by the first shift register unit G10 is at the non-enable level may overlap with at least part of time of the enable level of the initial output signal Vnext01 output by the first shift register unit G10, so that the frequency F11 of the initial output signal Vnext01 output by the first shift register unit G10 is able to be different from the frequency F12 of the gate drive signal Gout01 output by the first shift register unit G10.

In one or more embodiment, with continued reference to FIG. 33, in the part of time in the first mode, the drive control signal VCT is at the enable level.

In an example, in the part of time in the first mode, the drive control signal VCT is at the enable level (such as, at a t83 phase and a t84 phase in FIG. 33), so that in the shift register units G whose enable level time of the initial output signal Vnext overlaps with the enable level time of the drive control signal VCT, the signal of the first drive node N3 is synchronized with the signal of the first initial node N1 in a time period in which the drive control signal VCT is at the enable level, whereby the gate drive signal Gout output by the first drive node N3 is synchronized with the initial output signal Vnext output by the first drive node N3, and thus the shift register unit G can work normally, and meanwhile, the correspondingly connected pixel circuit can also perform the signal refreshing.

In one or more embodiment, referring to FIG. 32, in the part of time in the first mode, the drive control signal VCT is at the enable level. A hop moment between the enable level of the drive control signal VCT and the non-enable level of the drive control signal VCT is a first moment tc. A non-enable level time of the first clock signal CK1 overlaps with a non-enable level time of the second clock signal CK2, and the overlapping time is a first time tab. The first moment tc is within the first time tab.

In an example, with reference to FIG. 30 and FIG. 32, at the t72 phase, the gate drive signal Gout output by the first shift register unit G10 is at the low level, the first clock signal CK1 is at the high level, and the second clock signal CK2 is at the low level. If the drive control signal VCT makes a hop of the enable level and the non-enable level at the t72 phase, then the first drive control transistor M31 transmits a high level signal of the drive control signal VCT to the first drive node N3 and the second drive node N4 under the control of the low-level signal of the first initial node N1, so that the first drive output transistor M41 is turned off, and the low level of the second clock signal CK2 cannot be output through the first drive output transistor M41, and thus, the output gate drive signal Gout is unstable. Similarly, at the t71 phase, the first clock signal CK1 is at the low level, and the second clock signal CK2 is at the high level. If the first moment at which the drive control signal VCT hops from the non-enable level to the enable level is set to be at the t71 phase, then the signal of the first drive node N3 and the signal of the second drive node N4 hop synchronously, so that the signal of the first drive node N3 and the signal of the second drive node N4 are also unstable, thereby affecting the stability of the gate drive signal Gout in this phase. Therefore, the first moment tc1 at which the enable level of the drive control signal VCT and the non-enable level of the drive control signal VCT hop is within the first time tab in which the non-enable level time of the first clock signal CK1 overlaps with the non-enable level time of the second clock signal CK2, thereby preventing the drive control signal VCT from hoping before the output of the gate drive signal Gout is finished and affecting the accuracy of the gate drive signal Gout.

Figure 34:
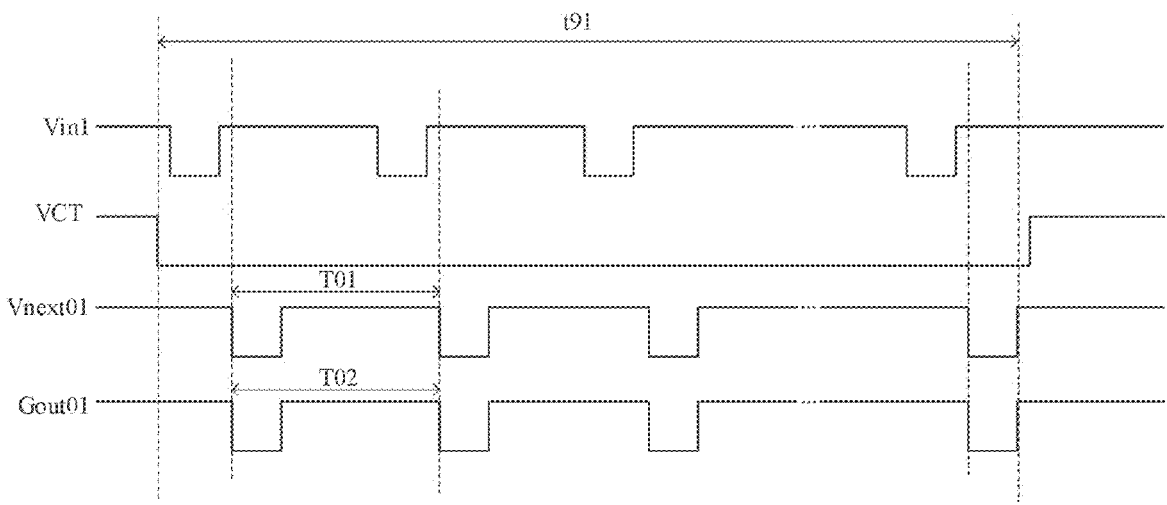
FIG. 34 is another drive timing diagram of a shift register unit according to an embodiment of the present disclosure.

In one or more embodiment, FIG. 34 is another drive timing diagram of a shift register unit according to an embodiment of the present disclosure. As shown in FIG. 34, an operation mode of the display panel further includes a second mode, in the second mode, F11=F12.

In an example, in a process in which the display panel 100 operates in the second mode (as shown at a t91 phase in FIG. 34), a pulse change frequency F11 of the initial output signal Vnext01 of the first shift register unit G10 is set to be equal to a pulse change frequency F12 of the gate drive signal Gout01 of the first shift register unit G10, that is, a period T02 of the gate drive signal Gout01 of the first shift register unit G10 is equal to a period T01 of the initial output signal Vnext01 of the first shift register unit G10. Therefore, in a process in which the display panel 100 operates in the second mode, a time of an invalid pulse of the initial output signal Vnext01 of the first shift register unit G10 overlaps with a time of an invalid level of the gate drive signal Gout01 of the first shift register unit G10, and a time of a valid pulse of the gate drive signal Gout01 overlaps with a time of a valid pulse of the initial output signal Vnext, to ensure that in the second mode, both the initial output signal Vnext01 and the gate drive signal Gout01 provided by the first shift register unit G10 to the next-stage shift register unit G are at the enable level or at the non-enable level, so that the next-stage shift register unit G can operate normally, and meanwhile the correspondingly connected pixel circuit also perform the signal refreshing, whereby the pixel circuits connected to the first shift register unit G10 achieve the normal progressive scanning in the second mode.

In one or more embodiment, referring to FIG. 34, in the second mode, the drive control signal VCT is at the enable level.

In an example, in the second mode, the drive control signal VCT is continuously kept at the enable level, and thus the drive control module 130 of the first shift register unit G10 may be made to control the signal of the first drive node N3 to be synchronized with the signal of the first initial node N1 in the second mode. Therefore, in this process, the gate drive signal Gout1 output by the first shift register unit G10 is synchronized with the initial output signal Vnext1, so that the next-stage shift register unit G can operate normally, and meanwhile, a corresponding connected pixel circuit can perform the signal refreshing.

Figure 35:
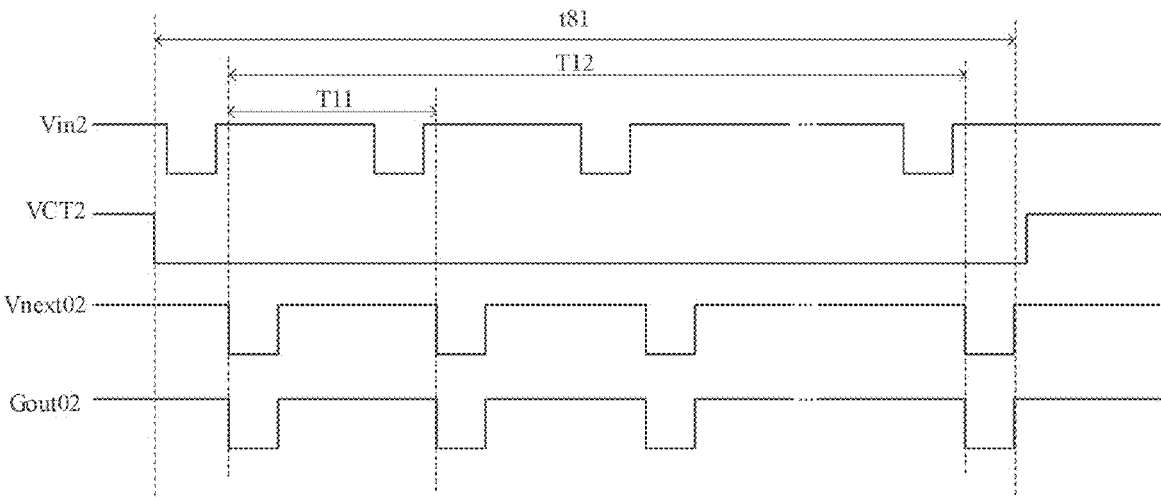
FIG. 35 is another drive timing diagram of a shift register unit according to an embodiment of the present disclosure.

In one or more embodiment, FIG. 35 is another drive timing diagram of a shift register unit according to an embodiment of the present disclosure. With reference to FIG. 2, FIG. 3 and FIG. 35, the display panel 100 further includes a second shift register unit G20. In the second shift register unit G20, a frequency of the initial output signal Vnext02 is F21, and a frequency of the gate drive signal Gout02 is F22. In the first mode, F21=F22.

In an example, in a process in which the display panel 100 operates in the first mode, the pulse change frequency F21 of the initial output signal Vnext02 of the second shift register unit G20 is set to be equal to the pulse change frequency F22 of the gate drive signal Gout02 of the second shift register unit G20, that is, the period T12 of the gate drive signal Gout02 of the second shift register unit G20 is equal to the period T11 of the initial output signal Vnext02 of the second shift register unit G20. Therefore, in a process in which the display panel 100 operates in the first mode, the time of the enable level of the initial output signal Vnext02 of the second shift register unit G20 overlaps with the time of the enable level of the gate drive signal Gout02 of the second shift register unit G20, and the time of the non-enable level of the gate drive signal Gout02 overlaps with the time of the non-enable level of the initial output signal Vnext02, to ensure that, in the first mode, both the initial output signal Vnext02 and the gate drive signal Gout02 provided by the second shift register unit G20 to the next-stage shift register unit G are at the enable level or at the non-enable level, so that the next-stage shift register unit G can operate normally, and meanwhile the correspondingly connected pixel circuit also perform the signal refreshing, whereby the pixel circuit connected to the second shift register unit G20 achieve the normal progressive scanning in the first mode. At this time, the second shift register unit G20 may be electrically connected to a pixel circuit with a higher refresh frequency in the display panel 100, for example, the second shift register unit G20 may be electrically connected to the pixel circuit 20 in the second display sub-region A22 in the drawings.

Figure 36:
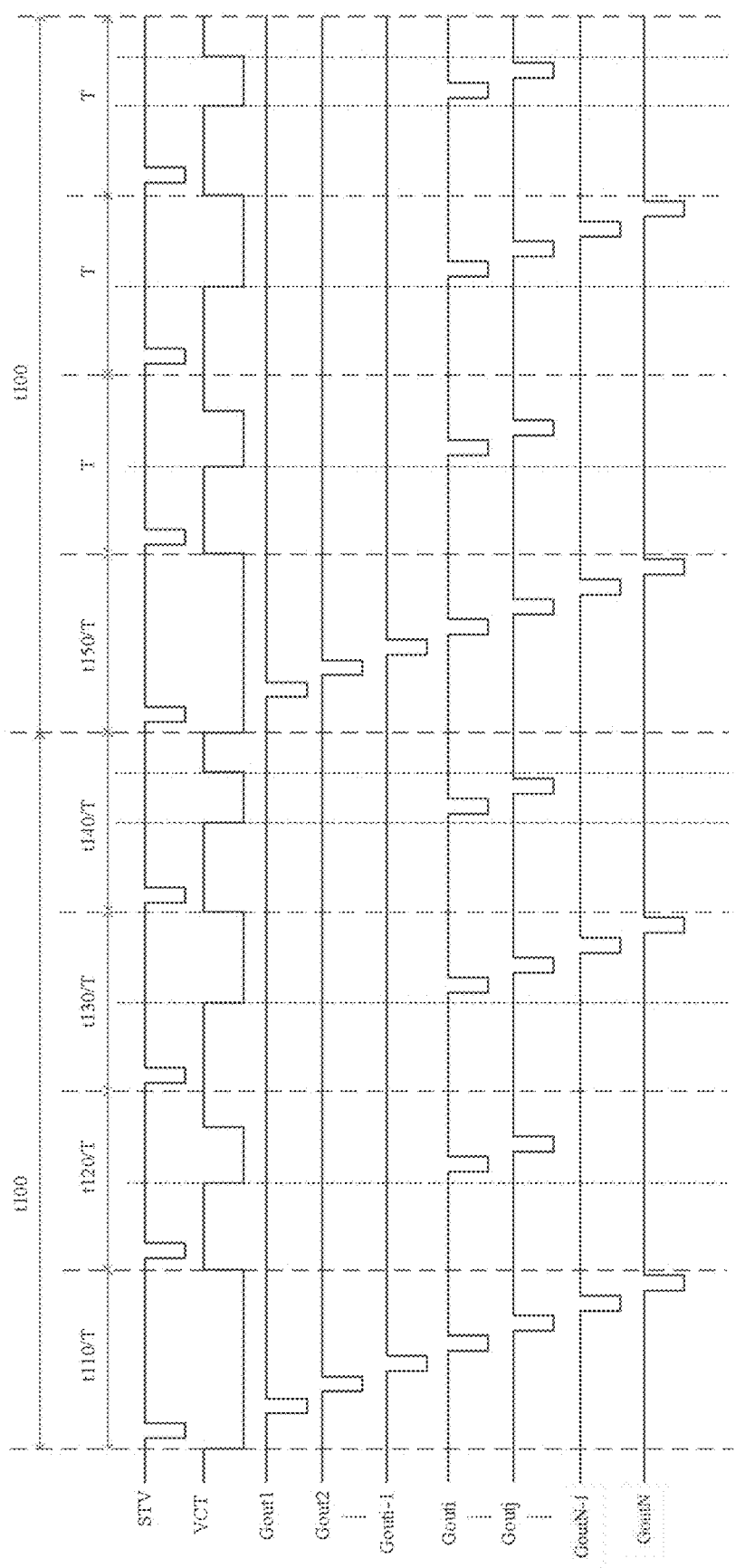
FIG. 36 is another drive timing diagram of a shift register unit according to an embodiment of the present disclosure.

In one or more embodiment, FIG. 36 is another drive timing diagram of a shift register unit according to an embodiment of the present disclosure. With reference to FIG. 2, FIG. 3 and FIG. 36, in the first mode, the display panel 100 includes n display regions arranged in sequence, and at least part of the n display regions have different refresh frequencies. An i-th display region has a refresh frequency of fi, and Ai=fH/fi, where fH is the maximum refresh frequency of the display panel 100; i≤n, n≥2, and both i and n are positive integers. In the first mode, a frequency of the drive control signal VCT is FC=1/(B*T), where B is minimum common multiple of A1, . . . , Ai, . . . , An, and T is a picture refresh cycle when a refresh frequency of the display panel 100 is fH.

In the embodiment of the present disclosure, an example in which the display panel 100 includes 3 display regions (a first display region A21, a second display region A22, and a third display region A23) arranged in sequence is used for exemplary description. Assuming that a refresh frequency of the first display region A21 is f1=30 Hz, a refresh frequency of the second display region A22 is f2=120 Hz, and a refresh frequency of the third display region A23 is f3=60 Hz, then a corresponding picture refresh cycle of the first display region A21 is TA=1/f1=1/30s, a corresponding picture refresh cycle of the second display region A22 is TB=1/f2=1/120s, and a corresponding picture refresh cycle of the third display region A23 is TC=1/f3=1/60s. When the maximum refresh frequency of the display panel 100 is fH=120 Hz and T=TB=1/f2=1/120s, the picture refresh cycle of the first display region A21 is TA=4*T, and the picture refresh cycle of the third display region A23 is TC=2*T, so that A1=fH/f1=120 Hz/30 Hz=4, A2=fH/f2=120 Hz/120 Hz=1, and A3=fH/f3=120 Hz/60 Hz=2. In this way, the minimum common multiple of A1, A2, and A3 is B=4, that is, the frequency of the drive control signal VCT is FC=1/(B*T) =30 Hz. Therefore, the pictures are refreshed in the display regions according to respective refresh frequencies of the display regions, and the diversified display requirements of the display panel can be satisfied.

With reference to FIG. 2, FIG. 3 and FIG. 36, the first shift register unit G10 is disposed to include a first-type shift register unit G110 and a second-type shift register unit G120. The first-type shift register unit G110 (including G1, G2, . . . , Gi−1) provides agate drive signal Gout to each pixel circuit 20 in the first display region A21, the second shift register unit G20 (including Gi, . . . , Gj) provides a gate drive signal Gout to each pixel circuit 20 in the second display region A22, and the second-type shift register unit G120 (including Gj−1, . . . , GN−1, GN) provides a gate drive signal Gout to each pixel circuit 20 in the third display region A23.

In a t110 time period, the drive control signal VCT is set at the low level. After the first-stage shift register unit G1 in the display panel 100 receives the start signal STV, the initial output module 120 outputs the enable level of the initial output signal Vnext1, and the drive output module 140 outputs the gate drive signal Gout1. The second-stage shift register units G2 to the N-stage shift register unit GN sequentially output enable levels of gate drive signals (that is, Gout2, . . . , Gouti−1, Goutl, . . . , Goutj, . . . , GoutN−1, GoutN), to scan each row of pixel circuits in the display panel, so that the data is able to be refreshed in each row of pixel circuits, that is, in the t110 time period, the pictures are refreshed in the first display region A21, the second display region A22 and the third display region A23.

In a t120 time period, after the first-stage shift register unit G1 in the display panel 100 receives the start signal STV, in a phase in which each stage of shift register unit G1 that is electrically connected to the pixel circuits in the first display region A21 sequentially outputs the enable level of the initial output signal Vnext, the drive control signal VCT is set at the high level, so that the gate drive signal Gout output by the drive output module 140 in the each stage of shift register unit (G1~Gi−1) is kept at the non-enable level. In a time period that the initial output modules 120 in each stage of shift register units (Gi~Gj) that are electrically connected to the pixel circuits in the second display region A22 sequentially output the enable levels of the initial output signals Vnext, the drive control signal VCT is set at the low level, so that the enable levels of the gate drive signals (Gouti~Goutj) output by the drive output module 140 in each stage of shift register units (Gi~Gj) that are electrically connected to the pixel circuits in the second display region A22 are shifted in sequence. After each stage of shift register unit (Gi~Gj) outputs the enable level of the gate drive signal Gout, the drive control signal VCT is set at the high level again, so that in a process in which the initial output modules 120 of each stage of shift register unit (Gj+1~GN) that are electrically connected to the pixel circuits in the third display region A23 sequentially output the enable level of the initial output signal Vnext, the gate drive signal Gout output by the drive output module 140 is kept at the non-enable level. In this way, in the t120 time period, the pictures are refreshed in the second display region A22, and the pictures are not refreshed in the first display region A21 and the third display region A23.

In a t130 time period, after the first-stage shift register unit G1 in the display panel 100 receives the start signal STV, in a phase that each stage of shift register unit G1 that is electrically connected to the pixel circuits in the first display region A21 outputs the initial output signal Vnext, the drive control signal VCT is set at the high level, so that in a process in which the initial output module 120 in each stage of shift register unit (G1~Gi−1) in the first display region A21 sequentially outputs the enable level of the initial output signal Vnext, the gate drive signal Gout output by each stage of shift register unit (G1~Gi−1) is kept at the non-enable level. In a phase that the initial output modules 120 in each stage of shift register unit (Gi~Gj) that is electrically connected to the pixel circuits in the second display region A22 sequentially outputs the enable level of the initial output signal Vnext, the drive control signal VCT is set at the low level, so that the drive output module 140 in the each stage of shift register unit (Gi~Gj) is able to sequentially output the enable level of the gate drive signal (Gouti~Goutj). After each stage of shift register unit (Gi~Gj) that is electrically connected to the pixel circuits in the second display region A22 outputs the enable level of the gate drive signal Gout, the drive control signal VCT may continue to be kept at the low level, so that in a process in which the initial output modules 120 of each stage of shift register unit (Gj+1~GN) that is electrically connected to the pixel circuits in the third display region A23 sequentially outputs the enable level of the initial output signal Vnext, the enable level of the gate drive signal (Gj+1, . . . , Gn−1, GN) is also able to be sequentially output. In this way, in the t130 time period, the pictures are refreshed in the second display region A22 and the third display region A23, and the pictures are not refreshed in the first display region A21.

In a t140 time period, an operation process of the drive control signal VCT and each stage of shift register unit is the same as the process in the t120 time period, that is, the pictures are refreshed in the second display region A22, the pictures are not refreshed in the first display region A21 and the third display region A23, and until the t150 time period, the pictures are refreshed again in the first display region A21, the second display region A22, and the third display region A23.

It may be learned from the foregoing description that the time period t110, the time period t120, the time period t130 and the time period t140 constitute one minimum cycle of the drive control signal VCT, that is, the time taken for refreshing the pictures in the second display region A22 four times is the minimum period of the drive control signal VCT. Therefore, a period of the drive control signal VCT may be set to be t100=4*T, that is, a frequency of the drive control signal VCT may be set to be FC=1/(4*T). In this way, it can be ensured that the pictures are refreshed in the display regions according to respective refresh frequencies of the display regions, and the diversified display requirements of the display panel can be satisfied.

Based on the same invention concept, an embodiment of the present disclosure further provides a display device, and the display device includes the display panel provided in the embodiment of the present disclosure. Therefore, the display device has technical features of the display panel and the driving method of the display panel provided in the embodiments of the present disclosure, and can achieve the beneficial effects of the display panel provided in the embodiments of the present disclosure. For the same points, reference may be made to the description of the display panel provided in the embodiment of the present disclosure, and details are not repeated herein.

Figure 37:
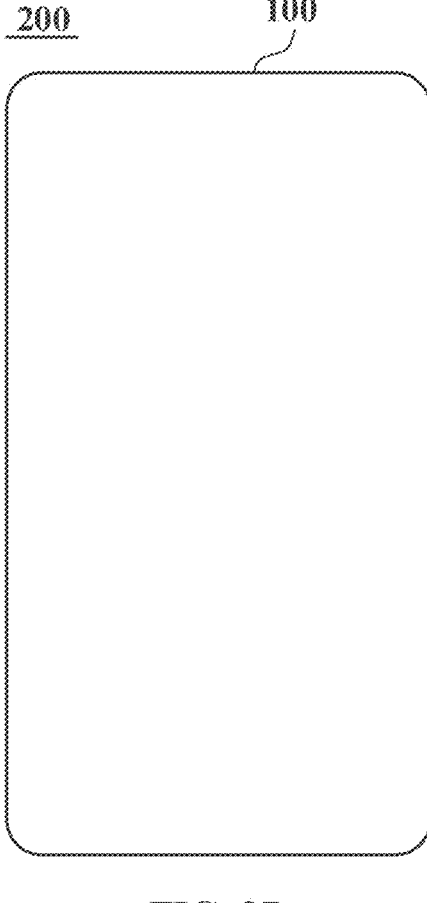
FIG. 37 is a schematic structural diagram of a display device according to an embodiment of the present disclosure.

In some embodiments, FIG. 37 is a schematic structural diagram of a display device according to an embodiment of the present disclosure. As shown in FIG. 37, the display device 200 includes the display panel 100 provided in the embodiment of the present disclosure. The display device 200 provided in the embodiment of the present disclosure may be any electronic product that has the display function, and includes, but is not limited to, the following categories: a mobile phone, a television set, a notebook computer, a desktop display, a tablet computer, a digital camera, a smart band, smart glasses, an in-vehicle display, a medical apparatus, an industrial control apparatus, and a touch interaction terminal, which are not specifically limited in the embodiments of the present disclosure.

The above implementations should not be construed as limiting the scope of protection of the present disclosure. It should be understood by those skilled in the art that various modifications, combinations, sub-combinations and substitutions may be made according to the design requirements and other factors. Any modification, equivalent replacement, and improvement made within the spirit and principle of the present disclosure should be included within the scope of protection of the present disclosure.

What is claimed is:

1. A display panel, comprising a driver circuit, wherein,
   the driver circuit comprises N stages of shift register units being cascaded with each other, and a shift register unit of the N stages of shift register units comprises an initial control module, an initial output module, a drive control module, and a drive output module;
   in a same shift register unit of the N stages of shift register units, the initial control module is configured to receive at least an input signal and a first clock signal and control a signal of a first initial node and a signal of a second initial node; the initial output module is configured to receive at least the signal of the first initial node, the signal of the second initial node, a first level signal and a second clock signal and control an initial output signal; the drive control module is configured to receive at least the signal of the first initial node and a drive control signal and control a signal of a first drive node; and the drive output module is configured to receive at least the first level signal, the second clock signal, the signal of the first drive node and the signal of the second initial node and control a gate drive signal;
   an initial output signal of an i-th-stage shift register unit of the N stages of shift register units is an input signal of a j-th-stage shift register unit of the N stages of shift register units, wherein i, j, and N are all positive integers, i≠j, and i and j are both less than or equal to N;
   wherein the drive control module comprises a first drive control submodule, the first drive control submodule is configured to receive at least the drive control signal and the signal of the first initial node and control a duration for which the signal of the first drive node is kept at an enable level;
   wherein the drive control module further comprises a second drive control submodule, the second drive control submodule is configured to receive at least the signal of the first initial node and control a duration for which the signal of the first drive node is kept at a non-enable level;
   wherein the second drive control submodule comprises a second drive control transistor;
   both a gate of the second drive control transistor and a first electrode of the second drive control transistor are electrically connected to the first drive node, or both a gate of the second drive control transistor and a second electrode of the second drive control transistor are electrically connected to a second drive node, the second drive node is electrically connected to the first drive node through a first voltage regulation module;
   the second electrode of the second drive control transistor is electrically connected to the first initial node; and
   wherein the first voltage regulation module comprises a first voltage regulation transistor, a gate of the first voltage regulation transistor receives a second level signal, a first electrode of the first voltage regulation transistor is electrically connected to the first drive node, and a second electrode of the first voltage regulation transistor is electrically connected to the second drive node.

2. The display panel of claim 1, wherein the display panel comprises a first shift register unit;

in the first shift register unit, a frequency of an initial output signal is F11, and a frequency of a gate drive signal is F12; and an operation mode of the display panel comprises a first mode, and in the first mode, F11+F12.

3. The display panel of claim 2, wherein the operation mode of the display panel further comprises a second mode; and in the second mode, F11=F12, and the drive control signal is at an enable level.

4. The display panel of claim 2, wherein in at least part of time in the first mode, the drive control signal is at a non-enable level.

5. The display panel of claim 4, wherein in part of time in the first mode, the drive control signal is at an enable level, and a hop moment between the enable level of the drive control signal and the non-enable level of the drive control signal is a first moment;

a non-enable level time of the first clock signal overlaps a non-enable level time of the second clock signal, and an overlapping time is a first time; and the first moment is within the first time.

6. The display panel of claim 1, wherein the drive output module comprises a first drive output submodule and a second drive output submodule;

the first drive output submodule is configured to receive the signal of the first drive node and the second clock signal and control the gate drive signal; and the second drive output submodule is configured to receive the signal of the second initial node and the first level signal and control the gate drive signal.

7. The display panel of claim 6, wherein the first drive output submodule comprises a first drive output transistor;

a first electrode of the first drive output transistor receives the second clock signal, a second electrode of the first drive output transistor outputs the gate drive signal; and a gate of the first drive output transistor is electrically connected to the first drive node, or a gate of the first drive output transistor is electrically connected to a second drive node, and the second drive node is electrically connected to the first drive node through a first voltage regulation module;

wherein the first voltage regulation module comprises a first voltage regulation transistor, a gate of the first voltage regulation transistor receives a second level signal, a first electrode of the first voltage regulation transistor is electrically connected to the first drive node, and a second electrode of the first voltage regulation transistor is electrically connected to the second drive node.

8. The display panel of claim 6, wherein the second drive output submodule comprises a second drive output transistor, a first electrode of the second drive output transistor receives the first level signal, a second electrode of the second drive output transistor outputs the gate drive signal, and a gate of the second drive output transistor is electrically connected to the second initial node.

9. The display panel of claim 1, wherein the initial output module comprises a first initial output submodule and a second initial output submodule;

the first initial output submodule is configured to receive the signal of the first initial node and the second clock signal and control the initial output signal; and the second initial output submodule is configured to receive the signal of the second initial node and the first level signal and control the initial output signal.

10. The display panel of claim 9, wherein the first initial output submodule comprises a first initial output transistor;

a first electrode of the first initial output transistor receives the second clock signal, a second electrode of the first initial output transistor outputs the initial output signal; and a gate of the first initial output transistor is connected to the first initial node, or a gate of the first initial output transistor is electrically connected to a third initial node, and the third initial node is electrically connected to the first initial node through a second voltage regulation module;

wherein the second voltage regulation module comprises a second voltage regulation transistor, a first electrode of the second voltage regulation transistor is electrically connected to the first initial node, a second electrode of the second voltage regulation transistor is electrically connected to the gate of the first initial output transistor, and a gate of the second voltage regulation transistor receives a second level signal.

11. The display panel of claim 9, wherein the second initial output submodule comprises a second initial output transistor, a first electrode of the second initial output transistor receives the first level signal, a second electrode of the second initial output transistor outputs the initial output signal, and a gate of the second initial output transistor is electrically connected to the second initial node.

12. The display panel of claim 1, wherein the first drive control submodule comprises a first drive control transistor, one of a gate of the first drive control transistor and a first electrode of the first drive control transistor is electrically connected to the first initial node, the other of the gate of the first drive control transistor and the first electrode of the first drive control transistor receives the drive control signal, and a second electrode of the first drive control transistor is electrically connected to the first drive node.

13. A display device, comprising a display panel, wherein the display panel comprises a driver circuit, wherein, the driver circuit comprises N stages of shift register units being cascaded with each other, and a shift register unit of the N stages of shift register units comprises an initial control module, an initial output module, a drive control module, and a drive output module;

in a same shift register unit of the N stages of shift register units, the initial control module is configured to receive at least an input signal and a first clock signal and control a signal of a first initial node and a signal of a second initial node; the initial output module is configured to receive at least the signal of the first initial node, the signal of the second initial node, a first level signal and a second clock signal and control an initial output signal; the drive control module is configured to receive at least the signal of the first initial node and a drive control signal and control a signal of a first drive node; and the drive output module is configured to receive at least the first level signal, the second clock signal, the signal of the first drive node and the signal of the second initial node and control a gate drive signal; and an initial output signal of an i-th-stage shift register unit of the N stages of shift register units is an input signal of a j-th-stage shift register unit of the N stages of shift register units, wherein i, j, and N are all positive integers, i≠j, and i and j are both less than or equal to N;

wherein the drive control module comprises a first drive control submodule, the first drive control submodule is configured to receive at least the drive control signal and the signal of the first initial node and control a duration for which the signal of the first drive node is kept at an enable level;

wherein the drive control module further comprises a second drive control submodule, the second drive control submodule is configured to receive at least the signal of the first initial node and control a duration for which the signal of the first drive node is kept at a non-enable level;

wherein the second drive control submodule comprises a second drive control transistor;

both a gate of the second drive control transistor and a first electrode of the second drive control transistor are electrically connected to the first drive node, or both a gate of the second drive control transistor and a second electrode of the second drive control transistor are electrically connected to a second drive node, the second drive node is electrically connected to the first drive node through a first voltage regulation module;

the second electrode of the second drive control transistor is electrically connected to the first initial node; and wherein the first voltage regulation module comprises a first voltage regulation transistor, a gate of the first voltage regulation transistor receives a second level signal, a first electrode of the first voltage regulation transistor is electrically connected to the first drive node, and a second electrode of the first voltage regulation transistor is electrically connected to the second drive node.

14. A display panel, comprising a driver circuit, wherein, the driver circuit comprises N stages of shift register units being cascaded with each other, and a shift register unit of the N stages of shift register units comprises an initial control module, an initial output module, a drive control module, and a drive output module;

in a same shift register unit of the N stages of shift register units, the initial control module is configured to receive at least an input signal and a first clock signal and control a signal of a first initial node and a signal of a second initial node; the initial output module is configured to receive at least the signal of the first initial node, the signal of the second initial node, a first level signal and a second clock signal and control an initial output signal; the drive control module is configured to receive at least the signal of the first initial node and a drive control signal and control a signal of a first drive node; and the drive output module is configured to receive at least the first level signal, the second clock signal, the signal of the first drive node and the signal of the second initial node and control a gate drive signal;

an initial output signal of an i-th-stage shift register unit of the N stages of shift register units is an input signal of a j-th-stage shift register unit of the N stages of shift register units, wherein i, j, and N are all positive integers, i≠j, and i and j are both less than or equal to N;

wherein the drive control module comprises a first drive control submodule, the first drive control submodule is configured to receive at least the drive control signal and the signal of the first initial node and control a duration for which the signal of the first drive node is kept at an enable level;

wherein the drive control module further comprises a third drive control submodule, and the third drive control submodule is electrically connected between the first drive control submodule and a signal terminal of the drive control signal; and the third drive control submodule is configured to receive at least the drive control signal and the signal of the second initial node and control, according to the signal of the second initial node, a transmission path for transmitting the drive control signal to the first drive control submodule.

15. The display panel of claim 14, wherein the third drive control submodule comprises a third drive control transistor, a gate of the third drive control transistor is electrically connected to the second initial node, a first electrode of the third drive control transistor is electrically connected to the signal terminal of the drive control signal, and a second electrode of the third drive control transistor is electrically connected to the first drive control submodule.

16. The display panel of claim 15, wherein the drive control module further comprises a fourth drive control submodule; and the fourth drive control submodule is configured to receive at least the signal of the second initial node, the first level signal and the second clock signal and control a duration for which the signal of the first drive node is kept at a non-enable level.

17. The display panel of claim 16, wherein the fourth drive control submodule comprises a fourth drive control transistor and a fifth drive control transistor;

a gate of the fourth drive control transistor is electrically connected to the second initial node, a first electrode of the fourth drive control transistor receives the first level signal, and a second electrode of the fourth drive control transistor is electrically connected to a first electrode of the fifth drive control transistor; and a gate of the fifth drive control transistor receives the second clock signal, and a second electrode of the fifth drive control transistor is electrically connected to the first drive node, or a second electrode of the fifth drive control transistor is electrically connected to a second drive node, and the second drive node is electrically connected to the first drive node through a first voltage regulation module;

wherein the first voltage regulation module comprises a first voltage regulation transistor, a gate of the first voltage regulation transistor receives a second level signal, a first electrode of the first voltage regulation transistor is electrically connected to the first drive node, and a second electrode of the first voltage regulation transistor is electrically connected to the second drive node.

18. The display panel of claim 14, wherein the display panel comprises a first shift register unit;

in the first shift register unit, a frequency of an initial output signal is F11, and a frequency of a gate drive signal is F12; and an operation mode of the display panel comprises a first mode, and in the first mode, F11≠F12.

19. The display panel of claim 18, wherein the operation mode of the display panel further comprises a second mode; and in the second mode, F11=F12, and the drive control signal is at an enable level.

20. The display panel of claim 18, wherein in at least part of time in the first mode, the drive control signal is at a non-enable level.

\* \* \* \* \*